(12) United States Patent
Ishii et al.

(10) Patent No.: US 7,276,563 B2
(45) Date of Patent: Oct. 2, 2007

(54) POLYPHENYLENE ETHER OLIGOMER COMPOUND, DERIVATIVES THEREOF AND USE THEREOF

(75) Inventors: Kenji Ishii, Tokyo (JP); Yasumasa Norisue, Tokyo (JP); Kiyonari Hiramatsu, Tokyo (JP); Makoto Miyamoto, Tokyo (JP); Makoto Yamazaki, Tokyo (JP); Daisuke Ohno, Tokyo (JP)

(73) Assignee: Mitsubishi Gas Chemical Company, Inc., Tokyo (JP)

( * ) Notice: Subject to any disclaimer, the term of this patent is extended or adjusted under 35 U.S.C. 154(b) by 471 days.

(21) Appl. No.: 10/980,246

(22) Filed: Nov. 4, 2004

(65) Prior Publication Data

US 2005/0065241 A1    Mar. 24, 2005

Related U.S. Application Data

(62) Division of application No. 10/352,232, filed on Jan. 28, 2003, now Pat. No. 6,835,785.

(30) Foreign Application Priority Data

| Jan. 28, 2002 | (JP) | ............................... 2002-18508 |
| Feb. 15, 2002 | (JP) | ............................... 2002-38156 |
| Feb. 18, 2002 | (JP) | ............................... 2002-40063 |
| Feb. 18, 2002 | (JP) | ............................... 2002-40064 |
| Feb. 19, 2002 | (JP) | ............................... 2002-41321 |
| Mar. 1, 2002 | (JP) | ............................... 2002-55765 |
| Mar. 20, 2002 | (JP) | ............................... 2002-78077 |
| Mar. 29, 2002 | (JP) | ............................... 2002-95752 |

(51) Int. Cl.
| *B32B 27/04* | (2006.01) |
| *B32B 27/38* | (2006.01) |
| *C08K 3/36* | (2006.01) |
| *C08L 63/00* | (2006.01) |
| *C08L 71/12* | (2006.01) |

(52) U.S. Cl. .................. 525/524; 174/256; 428/297.4; 428/413; 428/418; 523/466; 525/482; 525/484; 525/526

(58) Field of Classification Search .................... None
See application file for complete search history.

(56) References Cited

U.S. PATENT DOCUMENTS 7,022,776 B2 *   4/2006   Bastiaens et al. ........... 525/391

FOREIGN PATENT DOCUMENTS

| JP | 60-229923 A | * | 11/1985 |
| JP | 62-41223 A | * | 2/1987 |
| JP | 62041223 | | 2/1987 |
| JP | 11-029621 | | 2/1999 |
| JP | 11-29621 A | * | 2/1999 |

OTHER PUBLICATIONS

Abstract, JP 62041223, Saito, Feb. 23, 1987.
Abstract, Machine Translation, JP 10120611, Katagiri et al., May 12, 1998.
Abstract, JP 11029621, Katagiri et al., Feb. 2, 1999.

* cited by examiner

*Primary Examiner*—Robert Sellers
(74) *Attorney, Agent, or Firm*—Wenderoth, Lind & Ponack, L.L.P.

(57) ABSTRACT

The present invention provides a bifunctional phenylene ether oligomer compound having a thermosetting functional group at each terminal, an epoxy resin containing the above oligomer compound and a use thereof. That is, it provides a sealing epoxy resin composition for sealing an electric part, an epoxy resin composition for laminates, a laminate, a printed wiring board, a curable resin composition and a photosensitive resin composition. The resins and resin compositions of the present invention are used in electronics fields in which a low dielectric constant, a low dielectric loss tangent and high toughness are required and also used for various uses such as coating, bonding and molding.

10 Claims, No Drawings

POLYPHENYLENE ETHER OLIGOMER COMPOUND, DERIVATIVES THEREOF AND USE THEREOF

This is a divisional application of Ser. No. 10/352,232 filed Jan. 28, 2003 now U.S. Pat. No. 6,835,785.

FIELD OF THE INVENTION

The present invention relates to a bifunctional phenylene ether oligomer compound having a thermosetting functional group at each terminal, an epoxy resin containing the above oligomer compound and a use thereof. More specifically, it relates to a sealing epoxy resin composition for sealing an electric part, an epoxy resin composition for laminates, a laminate, a printed wiring board, a curable resin composition and a photosensitive resin composition. The resins and resin compositions of the present invention are used in electronics fields in which a low dielectric constant, a low dielectric loss tangent and high toughness are required and also used for various uses such as coating, bonding and molding.

BACKGROUND OF THE INVENTION

As for materials for use in an electric or electronic field, as the speed of transmission signal increases, a low dielectric constant which decreases a time delay and a low dielectric loss tangent which decreases a loss are desired for utilizing a high-frequency wave (gigahertz band). Further, higher toughness is also desired in order to inhibit the occurrence of microcracks which are thought to be generated by thermal shock and secure high reliability. For the above demands, there are carried out attempts of incorporation of engineering plastic, such as polyphenylene ether (PPE), as a modified polymer having several properties. However, since a thermoplastic resin is directly incorporated into a thermosetting resin, problems remain with regard to the compatibility between the resins and molding processability.

For improving the compatibility, a method of improving compatibility by blending PPE with a different resin as a compatibilizing agent is discussed and the pseudo IPN structuralization of PPE and a cyanate resin is also discussed (JP-A-11-21452, etc.). However, the problems of molding processability and heat resistance have not been solved yet. Further, a method of converting a high molecular PPE into a low molecular compound is discussed for improving moldability. For example, there is known a method in which a high molecular PPE and polyphenols are redistributed in the presence of a radical catalyst (JP-A-9-291148, etc.). Further, for obtaining toughness, there is known a method in which a bivalent phenol and a monovalent phenol are subjected to oxidation polymerization to obtain a thermosetting resin having a cyanate ester group (JP-B-8-011747).

Concerning a semiconductor device, an epoxy resin composition is generally used for sealing electronic parts such as a semiconductor. The above-mentioned epoxy resin composition is composed of various epoxy resins such as a cresol novolak type epoxy resin, a bisphenol A type epoxy resin and a biphenyl type epoxy resin, a curing agent therefor, an inorganic filler, a curing accelerator as required, a coupling agent, a releasing agent, a coloring agent and the like.

In compliance with recent requirements for a decrease in size or a decrease in thickness, the formation technique of the above electronic parts is being changed from a conventional through hole mounting method (DIP: dual inline package, etc.) to a surface mounting method (SOP: small outline package, QFP: quad flat package, etc.). In the surface mounting method, since a semiconductor device is treated at a high temperature (for example 210° C.~260° C.) at a solder reflow or the like at a mounting time, a high temperature heat is applied to the entire semiconductor device. In this case, problems such as the occurrence of cracks in a sealing layer formed of the above epoxy resin composition and a large decrease in humidity resistance are apt to occur.

Countermeasures against the above are proposed. One countermeasure with respect to handling is that a semiconductor device before mounting is packaged in a moisture-proof case. As an improvement in a sealing epoxy resin composition, for example, JP-A-1-108256 discloses a sealing material containing a biphenyl type epoxy resin and JP-A-64-24825 discloses a sealing material containing an epoxy resin and a polyphenylene ether type resin in combination.

However, these sealing materials have problems. For example, when a thin sealing layer having a thickness of 2.0 mm or less is used, cracks are apt to occur at the time of a solder reflow. In view of a further improvement in physical properties and an increase in a signal transmission speed in a chip circuit, it is demanded to carry out a sealing with a sealing layer having a lower dielectric constant.

With the advance of communication or computers, recently, higher frequency waves come to be used. Printed wiring boards are required to have low dielectric characteristics for the purpose of increasing a signal transmittal speed. For responding to the above demands, there are used thermoplastic resins such as a fluororesin excellent in dielectric characteristics or a general polyphenylene ether. However, these thermoplastic resins have problems about workability, moldability, heat resistance and the like. For example, the problems are that a solvent used for preparing a varnish is limited, and that due to a high melt viscosity, a high multilayer formation can not be carried out and a high temperature and a high pressure are required at a molding time.

On the other hand, as a thermosetting resin, there are known a polyphenylene ether modified epoxy resin, a thermosetting type polyphenylene ether and the like. However, conventional thermosetting resins have the same problems as the above problems of the thermoplastic resins. Further, a cyanate ester resin is known as a thermosetting resin having excellent dielectric characteristic and excellent moldability. However, when a cyanate ester resin alone is used, a cured product is too hard and is fragile so that it has a problem about adhesive property and solder resistance. When a cyanate ester resin is used in combination with an epoxy resin, the above defects can be covered. However, it is difficult to cope with requirements of lower dielectric characteristics of laminates, which requirements are becoming severer, by using a conventional cyanate ester resin in combination with a conventional epoxy resin.

Epoxy(meth)acrylate compounds have been widely used as raw materials for various functional high molecular materials such as a photosensitive material, an optical material, a dental material, an electronic material and crosslinking agents for various polymers. However, since higher performances are required in these application fields in recent years, physical properties required as a functional high molecular material become severer increasingly. As such physical properties, for example, heat resistance, weather resistance, low moisture absorptivity, high refractive index, high fracture toughness, low dielectric constant and low dielectric loss tangent are required. Until now, these required physical properties have not been necessarily satisfied.

For example, concerning the production of a printed wiring board, it is known that epoxy(meth)acrylate compounds are used for a photo solder resist used as a permanent mask. As a resist material like above, there are known a novolak type epoxy acrylate compound disclosed in JP-A-61-243869, a bisphenol fluorene type epoxy acrylate compound disclosed in JP-A-3-205417 and acid-modified products of these epoxy acrylate compounds. In a use for a printed wiring board, heat resistance in an immersion into a solder bath is demanded. When the heat resistance is insufficient, swelling or peeling off of a resist film occurs, which causes defectives.

In addition to the above-mentioned heat resistance, recently, as the speed of transmission signal becomes high, a lower dielectric constant which decreases a time delay and a lower dielectric loss tangent which decreases a loss are desired for utilizing a high-frequency wave (gigahertz band) However, a conventional epoxy(meth)acrylate compound is insufficient in dielectric characteristics for coping with a high-frequency wave. For this reason, a novel epoxy (meth) acrylate compound which satisfies the above requirements is demanded.

SUMMARY OF THE INVENTION

It is an object of the present invention to provide a thermosetting resin having the excellent electric characteristics and toughness of polyphenylene ether (to be referred to as "PPE" hereinafter) and improved in compatibility with a different resin and molding processability.

It is another object of the present invention to provide molded articles which can be widely used in various uses including a use in an electronics field.

It is further another object of the present invention to provide a sealing epoxy resin composition capable of giving a sealing layer which is free from the occurrence of cracks when it is exposed to a high temperature, such as a temperature in a solder reflow, and has a low dielectric constant.

It is further another object of the present invention to provide a thermosetting resin composition excellent in dielectric characteristics and also excellent in moldability, heat resistance and the like, a laminate using the thermosetting resin composition and a printed wiring board.

It is further another object of the present invention to provide a novel (meth)acrylate compound and a curable resin composition which have excellent heat resistance and have a low dielectric constant and a low dielectric loss tangent.

According to the present invention 1, there is provided a thermosetting resin represented by the formula (1),

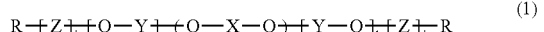

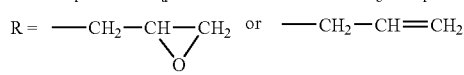

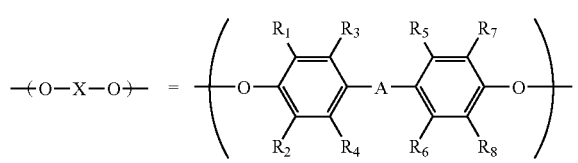

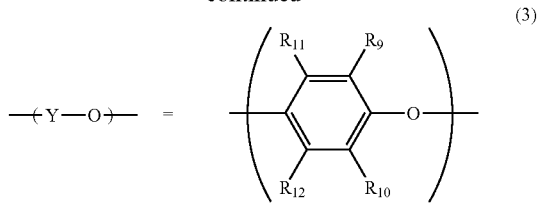

wherein —(O—X—O)— is represented by the formula (2) in which $R_1$, $R_2$, $R_7$ and $R_8$ may be the same or different and are a halogen atom, an alkyl group having 6 or less carbon atoms or a phenyl group, $R_3$, $R_4$, $R_5$ and $R_6$ may be the same or different and are a hydrogen atom, a halogen atom, an alkyl group having 6 or less carbon atoms or a phenyl group and A is a linear, branched or cyclic hydrocarbon having 20 or less carbon atoms or an aromatic group, —(Y—O)— is represented by the formula (3) in which $R_9$ and $R_{10}$ may be the same or different and are a halogen atom, an alkyl group having 6 or less carbon atoms or a phenyl group and $R_{11}$ and $R_{12}$ may be the same or different and are a hydrogen atom, a halogen atom, an alkyl group having 6 or less carbon atoms or a phenyl group, —(Y—O)— is an arrangement of one kind of structure defined by the formula (3) or a random arrangement of two or more kinds of structures defined by the formula (3), Z is an organic group which has one or more carbon atoms and may contain an oxygen atom, each of a and b is 0 or an integer of 1 to 300, provided that at least either a or b is not 0, and each of i is independently 0 or an integer of 1.

According to the present invention 2, there is provided a sealing epoxy resin composition containing as ingredients an epoxy resin, a curing agent, an inorganic filler and a polyphenylene ether oligomer compound having a number average molecular weight of 700 to 3,000 and having an epoxy group at each terminal, represented by the formula (9),

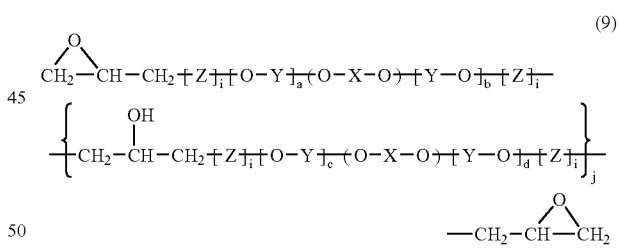

wherein —(O—X—O)—, —(Y—O)—, Z, A and i are as defined in the formula (1), each of a and b is 0 or an integer of 1 to 20, provided that at least either a or b is not 0, each of c and d is 0 or an integer of 1 to 20, provided that at least either c or d is not 0, and j is 0 or an integer of 1 to 5.

According to the present invention 3, there are provided an epoxy resin composition for laminates, containing a polyphenylene ether oligomer epoxy compound having a number average molecular weight of 700 to 3,000 and having an epoxy group at each terminal, represented by the above formula (9), and a curing agent as ingredients, prepreg and a printed wiring board.

According to the present invention 4, there are provided a (meth)acrylate compound represented by the following formula (10), a curable resin composition containing the (meth)acrylate compound and a cured product obtained by curing the curable resin composition,

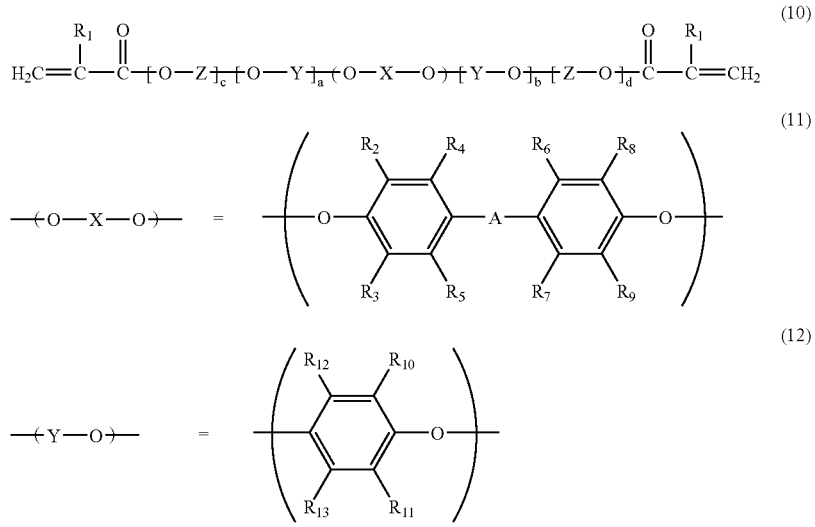

wherein $R_1$ is a hydrogen atom or a methyl group, —(O—X—O)— is represented by the formula (11) in which $R_2$, $R_3$, $R_8$ and $R_9$ may be the same or different and are a halogen atom, an alkyl group having 6 or less carbon atoms or a phenyl group, $R_4$, $R_5$, $R_6$ and $R_7$ may be the same or different and are a hydrogen atom, a halogen atom, an alkyl group having 6 or less carbon atoms or a phenyl group and A is a linear, branched or cyclic hydrocarbon having 20 or less carbon atoms, —(Y—O)— is an arrangement of one kind of structure defined by the formula (12) or a random arrangement of two or more kinds of structures defined by the formula (12) in which $R_{10}$ and $R_{11}$ may be the same or different and are a halogen atom, an alkyl group having 6 or less carbon atoms or a phenyl group and $R_{12}$ and $R_{13}$ may be the same or different and are a hydrogen atom, a halogen atom, an alkyl group having 6 or less carbon atoms or a phenyl group, Z is an organic group which has no OH group in a side chain and has one or more carbon atoms and which may contain an oxygen atom, each of a and b is 0 or an integer of 1 to 300, provided that at least either a or b is not 0, and each of c and d is 0 or an integer of 1.

According to the present invention 5, there are provided an epoxy(meth)acrylate compound represented by the formula (16), a curable resin composition containing the above compound and a cured product of the above resin composition, wherein $R_1$, —(O—X—O)—, A, —(Y—O)—, a, b, c and d are as defined in the formula (10), Z is an organic group which has one or more carbon atoms and may contain an oxygen atom, and n is 0 or an integer of 1 to 10.

According to the present invention 5, further, there is provided an epoxy(meth)acrylate compound according to the above, wherein $R_2$, $R_3$, $R_8$ and $R_9$ in —(O—X—O)— are a methyl group, and —(Y—O)— has an arrangement structure of the formula (4) or the formula (5) or a random arrangement structure of the formula (4) and the formula (5).

According to the present invention 6, there is provided a thermosetting resin represented by the formula (17), a resin composition for laminates containing the above thermosetting resin, prepreg obtained by using the resin composition and a printed wiring board,

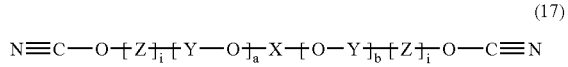

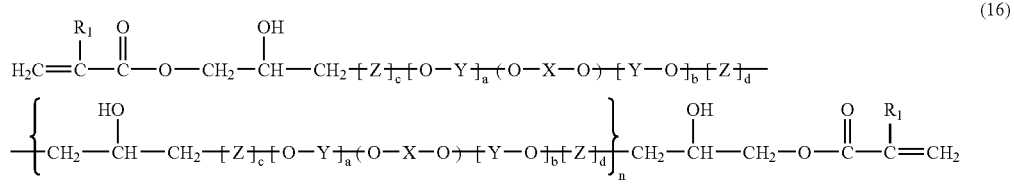

-continued

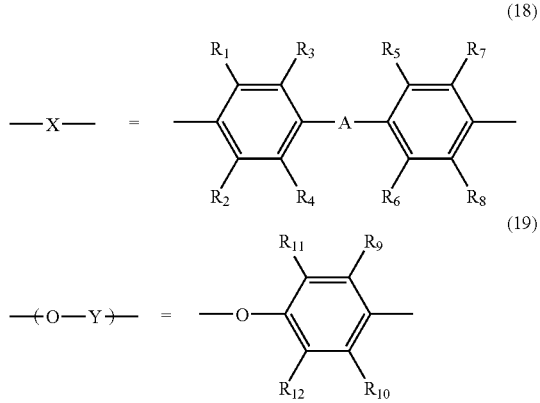

wherein —X— is represented by the formula (18) in which $R_1$, $R_2$, $R_7$ and $R_8$ may be the same or different and are a halogen atom, an alkyl group having 6 or less carbon atoms or a phenyl group, $R_3$, $R_4$, $R_5$ and $R_6$ may be the same or different and are a hydrogen atom, a halogen atom, an alkyl group having 6 or less carbon atoms or a phenyl group and A is a cyclic hydrocarbon or an organic group having an aromatic group, —(O—Y)— is represented by the formula (19) in which $R_9$ and $R_{10}$ may be the same or different and are a halogen atom, an alkyl group having 6 or less carbon atoms or a phenyl group and $R_{11}$ and $R_{12}$ may be the same or different and are a hydrogen atom, a halogen atom, an alkyl group having 6 or less carbon atoms or a phenyl group, —(O—Y)— is an arrangement of one kind of structure defined by the formula (19) or a random arrangement of two or more kinds of structures defined by the formula (19), Z is an organic group which has one or more carbon atoms and may contain an oxygen atom, each of a and b is an integer of 0 to 300, provided that at least either a or b is not 0, and each of i is independently an integer of 0 or 1).

DETAILED DESCRIPTION OF THE INVENTION

The present inventors have made diligent studies concerning a thermosetting resin having the excellent toughness of PPE and further having low dielectric characteristics and, as a result, found that the above purposes are satisfied by an epoxy resin which is obtained by dehydrohalogenation of a bifunctional PPE of the formula (6), obtained by oxidation copolymerization between a bivalent phenol and a monovelent phenol, and a halogenated glycidyl such as epichlorohydrin in the presence of a base, and an allyl resin which is obtained by dehydrohalogenation of a bifunctional PPE of the formula (6) and an allyl halide such as allyl bromide in the presence of a phase transfer catalyst under a base condition. On the basis of the above finding, the present inventors have completed the present invention 1. The present invention 1 will be explained in detail hereinafter.

The present invention 1 is characterized in that, concerning oxidation polymerization of phenols, a bivalent phenol and a monovelent phenol are copolymerized to efficiently synthesize a bifunctional PPE and then the synthesized PPE is converted into a thermosetting resin (epoxy compound, allyl compound) having a higher activity which is to be incorporated into a network in a resin constitution. Here, as the bivalent phenol to be used as raw materials, there are used bisphenols in which at least 2- and 6-positions are substituted. Further, as the monovalent phenol used as raw materials, there are used monovalent phenols having substituents at 2- and 6-positions which are required for the oxidation polymerization and compounds in which a substituent is further introduced at 3-position. Thus, the present invention is completed. A resin having the excellent electric characteristics of PPE has been developed by an influence of a phenylene ether structure and an influence of an increase in the number of methyl groups due to the copolymerization of these. That is, the present inventors have found that a bifunctional type PPE is very important to the present invention 1.

The bifunctional PPE oligomer compound, which is an intermediate product of the present invention 1, has a structure represented by the following formula (6) in which —(O—X—O)— is represented by the formula (2) and —(Y—O)— is an arrangement of one kind of structure defined by the formula (3) or a random arrangement of two or more structures defined by the formula (3). In the formulae, $R_1$, $R_2$, $R_7$, $R_8$, $R_9$ and $R_{10}$ may be the same or different and are a halogen atom, an alkyl group having 6 or less carbon atoms or a phenyl group, $R_3$, $R_4$, $R_5$, $R_6$, $R_{11}$ and $R_{12}$ maybe the same or different and are a hydrogen atom, a halogen atom, an alkyl group having 6 or less carbon atoms or a phenyl group, A is a linear, branched or cyclic hydrocarbon having 20 or less carbon atoms, each of a and b is 0 or an integer of 1 to 300, provided that at least either a or b is not 0. The bifunctional PPE oligomer compound is a PPE oligomer compound in which it is essential that $R_1$, $R_2$, $R_7$, $R_8$, $R_9$ and $R_{10}$ are not a hydrogen atom.

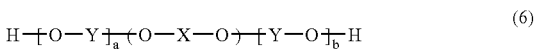

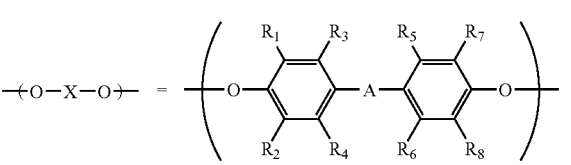

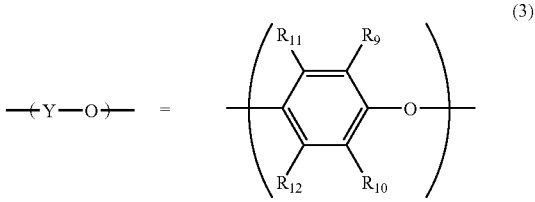

The bifunctional PPE oligomer compound which is an intermediate product of the present invention 1 will be explained. The PPE oligomer compound represented by the formula (6) is effectively produced by oxidatively polymerizing a bivalent phenol represented by the formula (7) with a monovalent phenol defined by the formula (8) or a mixture of monovalent phenols defined by the formula (8) in a toluene-alcohol solvent, a toluene-ketone solvent or a ketone solvent.

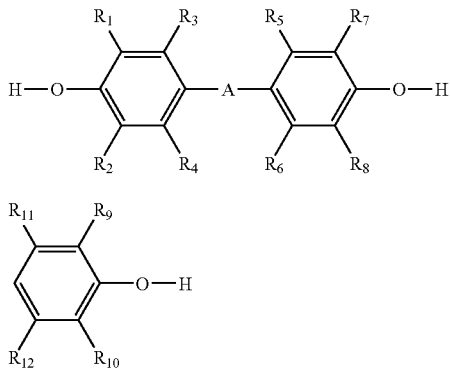 (7)

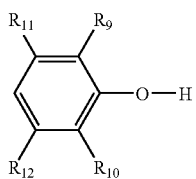 (8)

Here, the bivalent phenol of the formula (7) is a bivalent phenol in which $R_1$, $R_2$, $R_7$ and $R_8$ may be the same or different and are a halogen atom, an alkyl group having 6 or less carbon atoms or a phenyl group, $R_3$, $R_4$, $R_5$ and $R_6$ may be the same or different and are a hydrogen atom, a halogen atom, an alkyl group having 6 or less carbon atoms or a phenyl group and A is a linear, branched or cyclic hydrocarbon having 20 or less carbon atoms or an aromatic group, provided that it is essential that $R_1$, $R_2$, $R_7$ and $R_8$ are not a hydrogen atom. Examples of the bivalent phenol will be shown hereinafter.

4,4'-methylenebis(2,6-dimethylphenol), 4,4'-(1-methylethylidene)bis[2,6-dimethylphenol], 4,4'-methylenebis(2,3,6-trimethylphenol), 4,4'-cyclohexylidenebis[2,6-dimethylphenol], 4,4'-(phenylmethylene)bis-2,3,6-trimethylphenol, 4,4'-[1,4-phenylenebis(1-methylethylidene)bis[2,6-dimethylphenol], 4,4'-methylenebis[2,6-bis(1,1-dimethylethyl)phenol], 4,4'-cyclopentylidenebis[2,6-dimethylphenol], 4,4'-[2-furylmethylene]bis(2,6-dimethylphenol), 4,4'-[1,4-phenylenebismethylene]bis[2,6-dimethylphenol], 4,4'-(3,3,5-trimethylcyclohexylidene)bis[2,6-dimethylphenol], 4,4'-[4-(1-methylethyl)cyclohexylidene]bis[2,6-dimethylphenol], 4,4'-(4-methylphenylethylene)bis[2,3,6-trimethylphenol], 4,4'-[1,4-phenylenebismethylene]bis[2,3,6-trimethylphenol], 4-[1-[4-(4-hydroxy-3,5-dimethylphenyl)-4-methylcyclohexyl]-1-methylethyl]-2,6-dimethylphenol, 4,4'-(4-methoxyphenylmethylene)bis[2,3,6-trimethylphenol], 4,4,-[4-(1-methylethyl)phenylmethylene]bis[2,3,6-trimethylphenol], 4,4'-(9H-fluorene-9-ylidene)bis[2,6-dimethylphenol], 4,4'-[1,3-phenylelebis(1-methylethylidene)]bis[2,3,6-trimethylphenol], 4,4'-(1-2-ethanediyl)bis[2,6-di-(1,1-dimethylethyl)phenol]and 5,5'-(1-methylethylidene)bis[3-(1,1-dimethylethyl)-1,1-biphenyl-2-ol].

In the monovalent phenol of the formula (8), $R_9$ and $R_{10}$ may be the same or different and are a halogen atom, an alkyl group having 6 or less carbon atoms or a phenyl group and $R_{11}$ and $R_{12}$ may be the same or different and are a hydrogen atom, a halogen atom, an alkyl group having 6 or less carbon atoms or a phenyl group. In particular, it is preferred that a monovalent phenol having substituents at the 2- and 6-positions is used alone or used in combination with a monovalent phenol having substituent(s) at the 3-position or at the 3- and 5-positions in addition to the 2- and 6-positions. More preferably, when used alone, 2,6-dimethylphenol or 2,3,6-trimethylphenol is preferred, and when used in combination, 2,6,-dimethylphenol and 2,3,6-trimethylphenol are preferred.

The oxidation method includes a method in which an oxygen gas or air is directly used. Further, an electrode-oxidation method may be used. Any methods may be used, and the oxidation method is not specially limited. In view of safety and low-cost investment in plant and equipment, air oxidation is preferred. A catalyst used when the oxidation polymerization is carried out by the use of an oxygen gas or air, includes copper salts such as CuCl, CuBr, $CU_2SO_4$, $CUCl_2$, $CuBr_2$, $CuSO_4$ and CuI. These catalysts may be used alone or in combination. These catalysts may be used in combination with one amine or two or more amines. The amine includes mono- and dimethylamines, mono- and diethylamines, mono- and dipropyl amines, mono- and di-n-butylamines, mono- and di-sec-dipropylamines, mono- and dibenzylamines, mono- and dicyclohexylamines, mono- and diethanolamines, ethylmethylamine, methylpropylamine, butyldimethylamine, allylethylamine, methylcyclohexylamine, morpholine, methyl-n-butylamine, ethylisopropylamine, benzyl methyl amine, octylbenzylamine, octylchlorobenzylamine, methyl(phenylethyl)amine, benzylethylamine, N-n-butyldimethylamine, N,N'-di-tert-butylethylenediamine, di(chlorophenylethyl)amine, 1-methylamino-4-pentene, pyridine, methylpyridine, 4-dimethylaminopyridine and piperidine. The catalysts shall not be limited thereto and any other copper salts and amines may be used.

Examples of a solvent for the reaction includes an aromatic hydrocarbon solvent such as toluene, benzene or xylene or a halogenated hydrocarbon solvent such as methylene chloride, chloroform or carbon tetrachloride. An alcohol solvent or a ketone solvent may be used in combination with these solvents. The alcohol solvent includes methanol, ethanol, butanol, propanol, methyl propylene diglycol, diethylene glycol ethyl ether, butyl propylene glycol and propyl propylene glycol. The ketone solvent includes acetone, methyl ethyl ketone, diethyl ketone, methyl butyl ketone and methyl isobutyl ketone. Further, tetrahydrofurane and dioxane may be used. The solvents shall not be limited to these.

Although the reaction temperature is not specially limited, it is preferably 25 to 50° C. Since oxidation polymerization is an exothermic reaction, the control of a temperature is difficult and it is hard to control a molecular weight when the reaction temperature is more than 50° C. When the reaction temperature is lower than 25° C., the reaction rate becomes extremely slow, so that efficient production becomes impossible.

At the Z sites of the formula (1) in the present invention 1, an organic group which has one or more carbon atoms and may contain an oxygen atom can be located. Examples thereof include —(—$CH_2$—)—, —($CH_2$—$CH_2$—)—, and —(—$CH_2$—Ar—O—)—, while the above organic group shall not be limited thereto. The method for addition includes a method in which the organic groups are directly added to the bifunctional PPE being an intermediate product represented by the formula (6) and a method using a halide having a long carbon chain at the time of synthesizing a derivative. The method shall not be limited to these methods.

For convenience' sake, the following explanations will be done on the basis of a derivative from intermediate product represented by the formula (6) which is the simplest structure. The bifunctional PPE oligomer of the formula (6) is used as an intermediate product for producing the thermosetting PPE oligomer compound. The bifunctional PPE oligomer can be used in the form of a powder separated from a reaction solution or in the form of a solution thereof in a reaction solution.

An example of the process for producing the epoxy compound of the present invention 1 will be explained. The epoxy compound can be synthesized by dehydrohalogenation of the above bifunctional compound having phenolic hydroxyl groups at terminals represented by the formula (6), as an intermediate product, and a halogenated glycidyl such as epichlorohydrin in the presence of a base.

Typical examples of the base include sodium hydroxide, potassium hydroxide, sodium methoxide, sodium ethoxide, calcium hydroxide, sodium carbonate, potassium carbonate and sodium bicarbonate. The base shall not be limited thereto.

The reaction temperature is preferably between −10° C. and 110° C.

An example of the production process for the allyl compound of the present invention 1 will be explained. The allyl compound can be synthesized by dehydrohalogenation of the above bifunctional compound having phenolic hydroxyl groups at terminals represented by the formula (6), as an intermediate product, and an allyl halide such as allyl bromide or allyl chloride in the presence of a phase transfer catalyst under a base condition.

Examples of the phase transfer catalyst include tertiary amines such as trimethylamine and tetramethylethylenediamine, quaternary ammonium salts such as tetrabutylammonium chloride, tetrabutylammonium bromide, tetrabutylammonium iodide, benzyltri-n-butylammonium chloride, benzyltri-n-butylammonium bromide and benzyl-n-butylammonium iodide and quaternary phosphonium salts. However, the phase transfer catalyst shall not be limited thereto.

Examples of the base include sodium hydroxide, potassium hydroxide, sodium methoxide, sodium ethoxide, calcium hydroxide, sodium carbonate, potassium carbonate and sodium bicarbonate, while the base shall not be limited to these.

The reaction temperature is preferably between −10° C. and 60° C.

The thermosetting PPE oligomer compound of the present invention can be cured alone or it can be cured as a resin composition further containing other cyanate compounds, an epoxy compound, other polymerizable compounds or a catalyst.

Any known curing methods can be employed as a curing method. Examples of the above other cyanate compounds include m- or p-phenylenebiscyanate, 1,3,5-tricyanatebenzene, 4,4'-dicyanatobiphenyl, 3,3'5,5'-tetramethyl-4,4'-dicyanatebiphenyl, 2,3,3',5,5'-pentamethyl-4,4,-dicyanatebiphenyl, 2,2'3,3',5,5'-hexamethyl-4,4'-dicyanatebiphenyl, bis(4-cyanatephenyl)methane, 1-(2,3,5-trimethyl-4-cyanatephenyl)-1-(3,5-dimethyl-4-cyanatephenyl)methane, bis(2,3,5-trimethyl-4-dicyanatephenyl)methane, 1,1-bis(4-cyanatephenyl)ethane, 1-(2,3,5-trimethyl-4-cyanatephenyl)-1-(3,5-dimethyl-4-cyanatephenyl)ethane, 1,1-bis(2,3,5-trimethyl-4-dicyanatephenyl)ethane, 2,2-bis(4-cyanatephenyl)propane, 2-(2,3,5-trimethyl-4-cyanatephenyl)-2-(3,5-dimethyl-4-cyanatephenyl)propane, 2,2-bis(2,3,5-trimethyl-4-dicyanatephenyl)propane, bis(4-cycanatephenyl)ether, bis(4-cyanatephenyl)sulfone, bis(4-cyanatephenyl)sulfide, 4,4'-dicyanatebenzophenone and tris(4-cyanatephenyl)methane. That is, the cyanate compounds are biphenols to which an aromatic ring having a cyanate group directly bonds, bis or polycyanate compounds to which an aromatic ring having a cyanate group bonds at a crosslinking portion, prepolymers of these cyanate compounds, prepolymers of these cyanate compounds with diamines, and a cyanate-group-containing novolak type phenolic resin derived from a novolak resin which is a reaction product between phenols such as phenol and o-cresol and formaldehyde. These cyanate compounds may be used alone or in combination.

The above other polymerizable compounds include bismaleimide, an epoxy resin and the like. These may be used as a mixture thereof. Examples of the bismaleimide includes N,N'-diphenylmethanebismaleimide, N,N'-phenylenebismaleimide, N,N'-diphenyletherbismaleimide, N,N'-dicyclohexylmethanebismaleimide, N,N'-xylenebismaleimide, N,N'-diphenylsulfonebismaleimide, N,N'-tolylenebismaleimide, N,N'-xylylene bismaleimide, N,N'-diphenylcyclohexane bismaleimide, N,N'-dichloro-diphenylmethane bismaleimide, N,N'-diphenylcyclohexane bismaleimide, N,N'-diphenylmethane bismethylmaleimide, N,N'-diphenyletherbismethylmaleimide, N,N'-diphenylsulfonebismethylmaleimide, N,N'-ethylenebismaleimide, N,N'-hexamethylenebismethylmaleimide, prepolymers of these N,N'-bismaleimide compounds, prepolymers of these bismaleimide compounds with diamines, and maleimide-modified compounds or methylmaleimide-modified compounds of aniline-formalin polycondensates.

Examples of the above epoxy resin include biphenol and a resin obtained by substituting at least one position of the 2-, 2'-, 3-, 3'-, 5- and 5'-positions of biphenol with a halogen atom, an alkyl group having 6 or less carbon atoms or a phenyl group; bisphenol A and a resin obtained by substituting at least one position of the 2-position, the 3-position and the 5-position of bisphenol A with a halogen atom, an alkyl group having 6 or less carbon atoms or a phenyl group; bisphenol F and a resin obtained by substituting at least one position of the 2-position, the 3-position and the 5-position of bisphenol F with a halogen atom, an alkyl group having 6 or less carbon atoms or a phenyl group; glycidyl ether compounds derived from bivalent or tri- or more-valent phenols such as hydroquinon, resorcin, tris-4-(hydroxyphenyl)methane and 1,1,2,2-tetrakis(4-hydroxyphenyl)ethane; a novolak type epoxy resin derived from a novolak resin which is a reaction product between phenols such as phenol and o-cresol and formaldehyde; amine type epoxy resins derived from aniline, p-aminophenol, m-aminophenol, 4-amino-m-cresol, 6-amino-m-cresol, 4,4'-diaminodiphenylmethane, 3,3'-diaminodiphenylmethane, 4,4'-diaminodiphenylether, 3,4'-diaminodiphenylether, 1,4-bis(4-aminophenoxy)benzene, 1,4-bis(3-aminophenoxy)benzene, 1,3-bis(4-aminophenoxy)benzene, 1,3-bis(3-aminophenoxy)benzene, 2,2-bis(4-aminophenoxyphenyl)propane, p-phenylenediamine, m-phenylenediamine, 2,4-toluenediamine, 2,6-toluenediamine, p-xylylenediamine, m-xylylenediamine, 1,4-cyclohexane-bis(methylamine), 5-amino-1-(4'-aminophenyl)-1,3,3-trimethylindane, 6-amino-1-(4'-aminophenyl)-1,3,3-trimethylindane and the like; glycidyl ester compounds derived from aromatic carboxylic acids such as p-oxybenzoic acid, m-oxybenzoic acid, terephthalic acid and isophthalic acid; hydantoin type epoxy resins derived from 5,5-dimethylhydantoin and the like; alicyclic epoxy resins such as 2,2-bis(3,4-epoxycyclohexyl)propane, 2,2-bis[4-(2,3-epoxypropyl)cyclohexyl]propane, vinylcyclohexenedioxide and 3,4 -epoxycyclohexylmethyl-3,4 -epoxycyclohexane carboxylate; triglycidyl isocyanurate, and 2,4,6-triglycidoxy-S-triazine. These epoxy resins may be used alone or in combination.

The above resin composition may contain a curing agent for each of the ingredients. When the epoxy compound of the present invention is used or the resin composition contains an epoxy resin in a constitution, there may be used, as a curing agent, dicyandiamide, tetramethylguanidine, an aromatic amine, a phenol novolak resin, a cresol novolak resin, acid anhydride, and various aliphatic and alicyclic amines. In this case, the curing agents maybe used alone or in combination. As an aromatic amine, the above aromatic diamines are typical. As a curing agent used when the resin composition contains a cyanate compound or bismaleimide, the above aromatic diamines and alicyclic diamines are typical. Each of the curing agents may be incorporated in the resin composition in the form of the curing agent alone or may be incorporated in the resin composition in the form of a prepolymer of an ingredient to which each curing agent corresponds.

The above resin composition can be thermally cured in a comparatively short time without containing a catalyst. However, the use of a catalyst can decrease a molding temperature and shorten the curing time. Such a catalyst includes amines such as N,N-dimethylaniline, triethylenediamine and tri-n-butylamine, imidazoles such as 2-methylimidazole and 2-ethyl-4-methylimidazole, phenols such as phenol and resorcin, organometallic salts such as cobalt naphthenate, lead stearate, tin oleate, tin octylate, zinc octylate and titanium butyrate, chlorides such as aluminum chloride, tin chloride and zinc chloride, and chelate metals. These catalysts may be used alone or in combination.

The above resin composition may contain an extending agent, a filler (including organic and inorganic fillers), a reinforcing agent or a pigment as required. Examples of these include silica, calcium carbonate, antimony trioxide, kaoline, titanium dioxide, zinc oxide, mica, barite, carbon black, polyethylene powder, polypropylene powder, glass powder, aluminium powder, iron powder, copper powder, glass fiber, carbon fiber, alumina fiber, asbestos fiber, aramid fiber, glass woven fabric, glass unwoven fabric, aramid unwoven fabric and liquid crystal polyester unwoven fabric. These may be used alone or in combination.

Further, the resin composition containing these is used for molding, lamination, an adhesive or a composite material such as a copper-clad laminate. Particularly, when the cyanate compound alone, the epoxy compound alone or a combination of the cyanate compound and the epoxy compound is used, typical examples of uses are prepreg obtained by semi-curing the resin and a laminate obtained by curing the above prepreg. Further, when the epoxy compound is used, a typical example is a use for a semiconductor sealing material.

The sealing epoxy resin composition of the present invention 2 will be explained hereinafter.

According to the present invention 2, there is provided a sealing epoxy resin composition capable of giving a sealing layer which is free from the occurrence of cracks, when exposed to a high temperature such as a solder reflow, and has a low dielectric constant.

That is, the sealing epoxy resin composition of the present invention 2 is a resin composition containing as ingredients an epoxy resin, a curing agent, an inorganic filler and a polyphenylene ether oligomer compound having a number average molecular weight of 700 to 3,000 and having an epoxy group at each terminal, represented by the formula (9),

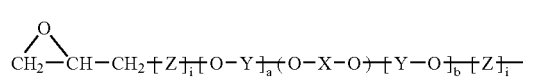
(9)

-continued

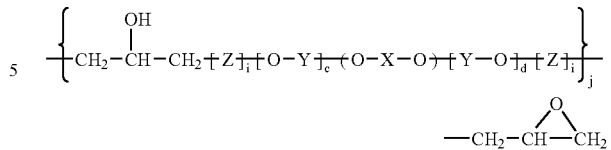

wherein —(O—X—O)—, —(Y—O)—, Z, A and i are as defined in the formula (1), each of a and b is 0 or an integer of 1 to 20, provided that at least either a or b is not 0, each of c and d is 0 or an integer of 1 to 20, provided that at least either c or d is not 0, and j is 0 or an integer of 1 to 5.

According to the present invention 2, further, there is provided a sealing epoxy resin composition according to the above, wherein, in the polyphenylene ether oligomer compound having an epoxy group at each terminal represented by the formula (9), at least $R_1$, $R_2$, $R_7$ and $R_8$ in the formula (2) representing —(O—X—O)— are a methyl group and —(Y—O)— is an arrangement of the formula (4) or the formula (5) or a random arrangement of the formula (4) and the formula (5).

According to the present invention 2, there is provided a sealing epoxy resin composition according to the above, wherein the content of the polyphenylene ether oligomer compound having an epoxy group at each terminal, represented by the formula (9), in the sealing epoxy resin composition is in the range of from 1 to 60% by weight based on the total amount of the epoxy resin, the curing agent and the polyphenylene ether oligomer compound having an epoxy group at each terminal.

According to the present invention 2, there is provided a sealing epoxy resin composition according the above, wherein the content of the inorganic filler in the sealing epoxy resin composition is in the range of from 15 to 95% by weight based on the total amount of the epoxy resin, the curing agent, the inorganic filler and the polyphenylene ether oligomer compound having an epoxy group at each terminal.

Since the epoxy resin composition of the present invention 2 contains the polyphenylene ether oligomer compound having an epoxy group at each terminal, it has a low dielectric constant and excellent mechanical strength and the melt viscosity of the resin composition can be decreased. When the melt viscosity of the above resin composition is low, resin flowability is good at a sealing-molding time and no voids occur, so that moldability is excellent.

The epoxy resin may be a biphenyl type epoxy resin alone and may be a mixture of the biphenyl type epoxy resin with a cresol novolak type epoxy resin, a naphthalene skeleton type epoxy resin, a bisphenol A type epoxy resin, a bisphenol F type epoxy resin or a flame-retardant epoxy resin obtained by brominating any one of these epoxy resins.

Then, the polyphenylene ether oligomer compound having an epoxy group at each terminal (to be referred to as "bifunctional OPE-2Ep" hereinafter) used in the present invention 2 will be explained.

The above bifunctional OPE-2Ep is obtained by dehydrohalogenation of a polyphenylene ether oligomer (to be referred to as "bifunctional OPE" hereinafter) of the formula. (6) shown in the present invention 1, which is obtained by oxidative copolymerization of a bivalent phenol and a monovalent phenol, and a halogenated glycidyl such as epiohlorohydrin in the presence of a base. The oxidation method, the reaction solvent and the reaction temperature, etc., are the same as those described in the present invention 1.

At the Z positions of the formula (9) in the present invention 2, an organic group which has one or more carbon atoms and may contain an oxygen atom can be located. Examples thereof include —(—CH$_2$—)—, —(CH$_2$—CH$_2$—)—, and —(—CH$_2$—Ar—O—)—, while the above organic group shall not be limited thereto. The method for addition includes a method in which the organic groups are directly added to the bifunctional OPE represented by the formula (6) and a method using a halide having a long carbon chain at the time of synthesizing a derivative, while the method shall not be limited to these methods.

For convenience' sake, the following explanations will be done on the basis of a derivative from the bifunctional OPE represented by the formula (6) which is the simplest structure. The bifunctional OPE of the formula (6) is used for producing the bifunctional OPE-2Ep. The bifunctional OPE may be used in the form of a powder separated from a reaction solution or in the form of a solution thereof in a reaction solution.

An example of the process for producing the bifunctional OPE-2Ep of the present invention will be shown. The bifunctional OPE-2Ep can be synthesized by dehydrohalogenation of the above compound having phenolic hydroxyl groups at both terminals, represented by the formula (6), and a halogenated glycidyl such as epichlorohydrin in the presence of a base. As the base, the same bases as those described in the present invention 1 are used. The reaction is preferably carried out at a reaction temperature between −10° C. and 110° C.

The number average molecular weight of the bifunctional OPE-2Ep is limited in the range of from 700 to 3,000. When the above number average molecular weight exceeds 3,000, the melt viscosity of the resin composition increases. When it is smaller than 700, mechanical strength or heat resistance is decreased. The bifunctional OPE-2Ep has a low melt viscosity so that its flowability is high. It is excellent in compatibility with an epoxy resin. Further, since it has epoxy groups at both terminals, the resin composition has good adhesive properties and its sealing layer is further excellent in strength under heat. As a result thereof, when the sealing layer is exposed to a high temperature at soldering or the like, the occurrence of cracks can be prevented. Further, since a polyphenylene ether resin is a material having low dielectric characteristics, a sealing layer having a low dielectric constant can be formed.

In the sealing epoxy resin composition of the present invention 2, the content of the bifunctional OPE-2Ep is preferably in the range of from to 60% by weight, more preferably 5 to 50% by weight, based on the total amount of the epoxy resin, the bifunctional OPE-2Ep and the curing agent. When the above content is lower than 1% by weight, cracks are apt to occur in the sealing layer. When the above content is higher than 60% by weight, the melt viscosity increases at a sealing-molding so that voids occur and moldability is decreased.

Examples of the inorganic filler which is an ingredient of the sealing epoxy resin composition of the present invention 2 include inorganic powders such as silica and alumina. The preferable content of the inorganic filler varies depending upon a use. For example, concerning a use as a sealing material for a potting molding, the content of the inorganic filler is preferably in the range of from 15 to 60% by weight, more preferably from 20 to 50% by weight, based on the total amount of the epoxy resin, the bifunctional OPE-2Ep, the curing agent and the inorganic filler. In this case of the use as a sealing material for a potting molding, when the content of the above inorganic filler is less than 15% by weight, the strength of a sealing layer is low. When the above content is more than 60% by weight, moldability decreases at a sealing-molding.

Further, concerning a use as a sealing material for a injection-molding, the content of the inorganic filler is preferably in the range of from 60 to 95% by weight, more preferably from 70 to 90% by weight, based on the total amount of the epoxy resin, the bifunctional OPE-2Ep, the curing agent and the inorganic filler. In this case of the use as a sealing material for a injection-molding, when the content of the above inorganic filler is less than 70% by weight, the moisture absorption coefficient of a sealing layer increases so that cracks are apt to occur. When the above content is more than 95% by weight, the melt viscosity increases at a sealing-molding so that voids occur and moldability decreases.

The above inorganic filler is preferably surface-treated with a coupling agent for improving the conformability with the epoxy resin. Examples of the coupling agent include silane coupling agents such as γ-glycidoxypropyltrimethoxysilane, γ-aminopropyltriethoxysilane and N-phenyl-γ-aminopropyltrimethoxysilane.

The sealing epoxy resin composition may contain a curing accelerator, a releasing agent, a coloring agent, a flame retardant and a stress reducing agent, as required, in addition to the epoxy resin, the bifunctional OPE-2Ep, the curing agent and the inorganic filler.

Examples of the curing accelerator include tertiary amines such as 1,8-diazabicyclo(5,4,0)undecene-7, triethylenediamine and benzyldimethylamine, imidazoles such as 2-methylimidazole, 2-ethyl-4-methylimidazole, 2-phenylimidazole and 2-phenyl-4-methylimidazole, and organic phosphines such as tributylphosphine and triphenylphosphine. Of these, triphenylphosphine improves the electric characteristics of a sealing layer and therefore triphenylphosphine is preferred.

Examples of the releasing agent include carnauba wax, stearic acid, montanoic acid and a carboxyl group-containing polyolefine. Examples of the coloring agent include carbon black. Examples of the above flame retardant include antimony trioxide. Examples of the stress reducing agent include silicone gel, silicone rubber and silicone oil.

The epoxy resin composition for laminates, provided by the present invention 3, will be explained hereinafter.

According to the present invention 3, there are provided an epoxy resin composition for laminates which is excellent in dielectric characteristics, moldability and heat resistance, prepreg and a printed wiring board.

According to the present invention 3, there is provided an epoxy resin composition for laminates which contains as ingredients a polyphenylene ether oligomer epoxy compound having a number average molecular weight of 700 to 3,000 and having an epoxy group at each terminal, represented by the formula (9) shown in the present invention 2, and a curing agent.

According to the present invention 3, further, there is provided an epoxy resin composition for laminates, which composition contains a polyphenylene ether oligomer epoxy compound having a number average molecular weight of 700 to 3,000 and having an epoxy group at each terminal, represented by the formula (9) shown in the present invention 2, and a cyanate ester resin.

According to the present invention 3, there is provided an epoxy resin composition for laminates according to the above, wherein in the polyphenylene ether oligomer epoxy compound having an epoxy group at each terminal represented by the formula (9), at least $R_1$, $R_2$, $R_7$ and $R_8$ in the formula (2) representing —(O—X—O)—, shown in the present invention 1, are a methyl group and —(Y—O)— is an arrangement of the formula (4) shown in the present invention 1 or the formula (5) shown in the present invention 1 or a random arrangement of the formula (4) and the formula (5).

According to the present invention 3, since the above epoxy resin composition contains the polyphenylene ether oligomer epoxy compound having an epoxy group at each terminal represented by the formula (9), it has a low dielectric constant and excellent flexibility and the melt viscosity of the resin composition can be decreased. When the melt viscosity of the resin composition is low, the embeddability of the resin is good at a laminate-molding time and no voids occur so that moldability is excellent.

The number average molecular weight of the obtained bifunctional OPE-2Ep used in the present invention 3 is limited in the range of from 700 to 3,000. When the above number average molecular weight exceeds 3,000, the melt viscosity of the resin composition increases. When it is smaller than 700, mechanical strength or heat resistance is decreased. The above bifunctional OPE-2Ep has a low melt viscosity so that its flowability is high. It is excellent in compatibility with a different resin. Further, since it has epoxy groups at both terminals, the resin composition has good adhesive properties. As a result thereof, when the resin composition is exposed to a high temperature at soldering or the like after moisture absorption, the occurrence of swelling is prevented. Further, since a polyphenylene ether resin is a material having low dielectric characteristics, there can be provided a laminate having low dielectric characteristics.

The curing agent, which is an ingredient of the epoxy resin composition for laminates provided by the present invention 3, includes generally used curing agents such as amine type curing agents typified by primary amine and secondary amine, phenol type curing agents typified by bisphenol A and phenol novolak, acid anhydride type curing agents, and cyanate-ester type curing agents. These curing agents may be used alone or in combination.

The bifunctional OPE-2Ep composition of the present invention 3 can be used in combination with various resins according to a purpose or use. Specific examples of the resins include various epoxy resins; modified epoxy resins, oxetane resins, (meth)acrylic acid esters; polyallyl compounds such as diallyl benzene and diallyl terephthalate; vinyl compounds such as N-vinyl-2-pyrolidone and divinyl benzene; polymerizable double-bond-containing monomers such as unsaturated polyester; polyfunctional maleimides; polyimides; rubbers such as polybutadiene, thermoplastic resins such as polyethylene and polystyrene; engineering plastics such as a ABS resin and polycarbonate; and a cyanate ester resin. The above resins shall not be limited to these resins.

Further, the resin composition may contain various additives such as a known inorganic or organic filler, a dye, a pigment, a thickener, a lubricant, an antifoamer, a coupling agent, a photosensitizer, an ultraviolet absorber and a flame retardant, as required.

Examples of the epoxy resin used in the present invention 3 include bisphenol A type epoxy, bisphenol F type epoxy, bisphenol Z type epoxy, biphenol.epoxy, tetramethylbiphenol.epoxy, hexamethylbiphenol.epoxy, xylene novolak.epoxy, biphenyl novolak.epoxy, dicyclopentadiene novolak.epoxy, phenol novolak.epoxy, cresol novolak.epoxy, and flame-retardant epoxy resins obtained by brominating these epoxy resins. There may be used a composition containing one epoxy resin or two or more epoxy resins selected from these epoxy resins as required and a reaction product of these epoxy resins.

Examples of the cyanate ester compound used in the present invention 3 include 1,3- or 1,4-dicyanatobenzene, 1,3,5-tricyanatobenzene, 1,3-, 1,4-, 1,6-, 1,8-, 2,6- or 2,7-dicyanatonaphthalene, 1,3,6-tricyanatonaphthalene, 4,4'-dicyanatobiphenyl, bis(4-cyanatophenyl)methane, 2,2-bis(4-cyanatophenyl)propane, 2,2-bis(3,5-dibromo-4-cyanatophenyl)propane, bis(4-cyanatophenyl)ether, bis(4-cyanatophenyl)thioether, bis(4-cyanatophenyl)sulfone, tris(4-cyanatophenyl)phosphite, tris(4-cyanatophenyl)phosphate, 4,4'-dicyanato-3,3',5,5'-tetramethylbiphenyl, 4,4'-dicyanato-2,2',3,3',5,5'-hexamethylbiphenyl, and cyanates obtained by a reaction of novolak with cyanogen halide.

Although the composition of the present invention 3 undergoes curing itself by heating, a heat-curing catalyst can be incorporated in the composition for increasing the curing rate and improving workability and economic efficiency. There may be used a heat-curing catalyst generally known as a heat-curing catalyst for a resin to be used in combination.

A copper-clad laminate using the bifunctional OPE-2Ep composition of the present invention 3 is particularly suitably used for a printed wiring board which is required to have low dielectric characteristics. The copper-clad laminate of the present invention can be produced by a general method. That is, it is a method in which a base material is impregnated with a resin varnish which is a solution of a thermosetting resin composition in an organic solvent, the base material is heat-treated to obtain prepreg, and then the prepreg and a copper foil are laminated and molded under heat to obtain a copper-clad laminate. However, the production method of the copper-clad laminate of the present invention shall not be limited to this method.

The organic solvent to be used includes acetone, methyl ethyl ketone, ethylene glycol monomethyl ether acetate, propylene glycol dimethyl ether, toluene, xylene, tetrahydrofuran and N,N-dimethylformamide. The solvent is not specially limited and various organic solvents may be used. These solvents may be used alone or in combination. The base material to be impregnated with the resin varnish includes all base materials used for a thermosetting resin laminate. Example thereof includes inorganic base materials such as a glass cloth and a glass unwoven fabric; and organic base materials such as a polyamide unwoven fabric and a liquid crystalline polyester unwoven fabric. For utilizing the low dielectric characteristics of the present invention, it is more effective to use a base material having excellent dielectric characteristics such as D glass cloth or NE glass cloth.

The heat-treatment of the prepreg is properly selected depending upon the kinds and the amounts of a solvent used, a resin constitution, a catalyst added and other additives, while it is generally carried out at a temperature of 100 to 250° C. for 3 to 30 minutes. The method of laminating and heating the prepreg and the copper foil varies depending upon the kind of the prepreg and the form of the copper foil. Generally, these materials are preferably thermally press-molded in vacuum at a temperature of 170 to 230° C. under a pressure of 10 to 30 kg/cm$^2$ for 40 to 120 minutes.

The present invention 4 will be explained here in after.

According to the present invention 4, there are provided a novel (meth)acrylate compound having excellent heat resistance, a low dielectric constant and a low dielectric loss tangent and a curable resin composition.

The (meth)acrylate compound of the present invention 4 is represented by the formula (10),

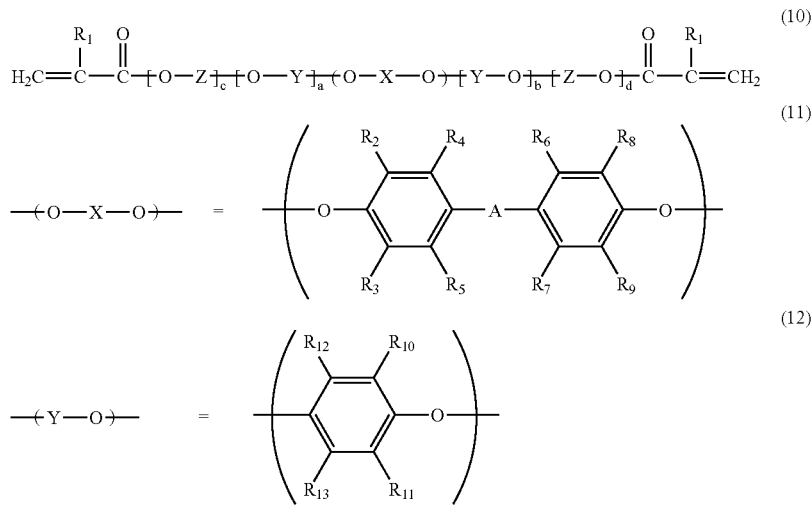

wherein $R_1$ is a hydrogen atom or a methyl group, —(O—X—O)— is represented by the formula (11) in which $R_2$, $R_3$, $R_8$ and $R_9$ may be the same or different and are a halogen atom, an alkyl group having 6 or less carbon atoms or a phenyl group, $R_4$, $R_5$, $R_6$ and $R_7$ may be the same or different and are a hydrogen atom, a halogen atom, an alkyl group having 6 or less carbon atoms or a phenyl group and A is a linear, branched or cyclic hydrocarbon having 20 or less carbon atoms, —(Y—O)— is an arrangement of one kind of structure defined by the formula (12) or a random arrangement of two or more kinds of structures defined by the formula (12) in which $R_{10}$ and $R_{11}$ may be the same or different and are a halogen atom, an alkyl group having 6 or less carbon atoms or a phenyl group and $R_{12}$ and $R_{13}$ may be the same or different and are a hydrogen atom, a halogen atom, an alkyl group having 6 or less carbon atoms or a phenyl group, Z is an organic group which has no OH group in a side chain and has one or more carbon atoms and which may contain an oxygen atom, each of a and b is 0 or an integer of 1 to 300, provided that at least either a or b is not 0, and each of c and d is 0 or an integer of 1.

Further, the present invention 4 provides a curable resin composition containing the above (meth)acrylate compound and a cured product of the above resin composition.

In the formula (10), examples of -(Z-O—)— include —((CH$_2$)$_m$—O—)—, —(CH$_2$CHRO)$_n$— and —(CH$_2$—Ar—O)—, while it shall not be limited to these. The method of addition includes a method in which -(Z-O—)— is directly added to an intermediate represented by the formula (6) and a method using a halide, while it shall not limited to these methods.

The method of producing the (meth)acrylate compound of the formula (10), provided by the present invention, is not specially limited. The (meth)acrylate compound of the formula (10) may be produced by any methods. For example, the (meth)acrylate compound of the formula (10) is obtained by reacting a compound of the formula (13) with a (meth)acrylic acid or a (meth)acrylic acid derivative. Concretely, the (meth)acrylate compound of the formula (10) is obtained by reacting a compound of the formula (13) with (meth)acrylic acid in the presence of an esterification catalyst such as p-toluenesulfonic acid, trifluoromethane sulfonic acid or sulfuric acid or its acid halide in the presence of, for example, an organic amine, sodium hydroxide or sodium carbonate, in the presence of a solvent such as, preferably, toluene, xylene, cyclohexane, n-hexane, n-heptane or a mixture of these at a temperature of preferably from 70° C. to 150° C.

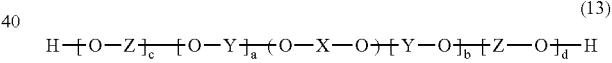

wherein —(O—X—O)—, A, —(Y—O)—, Z, a, b, c and d are as defined in the formula (10).

The compound of the formula (13) is obtained by producing the compound of the formula (6) according to, for example, the method disclosed in Japanese Patent Application No. 2002-018508 and then introducing -(Z-O)— into it as required.

Cases in which, for example, —(CH$_2$)$_m$O— or —(CH$_2$CHR$_{14}$O)$_n$— is introduced as -(Z-O)—, will be explained. —(CH$_2$)$_m$O— is introduced by reacting a compound of the formula (13) with a halogenated alcohol represented by the formula (14) in a proper solvent such as an alcohol, ether or a ketone in the presence of an alkaline catalyst such as KOH, K$_2$CO$_3$ or NaOEt, and —(CH$_2$CHR$_{14}$O)$_n$— is introduced by reacting a compound of the formula (13) with alkylene oxide represented by the formula (15) in a benzene type solvent such as benzene, toluene or xylene in the presence of an alkaline catalyst such as KOH, NaOEt or triethylamine according to, for example, the method disclosed in JP-B-52-4547.

$$X—(CH_2)_m—OH \qquad (14)$$

wherein X is Cl or Br and m is an integer of 2 or more.

(15)

wherein $R_{14}$ is a hydrogen atom, a methyl group or an ethyl group.

Next, the curable resin composition of the present invention 4 will be explained. The curable resin composition is characterized in that it contains the above (meth)acrylate compound of the present invention 4. The curable resin composition of the present invention may contain a known epoxy resin, an oxetane resin, a compound having an ethylenic unsaturated group, a photpolymerization initiator and/or a thermal polymerization initiator, and a photosensitizer.

The epoxy resin can be selected from generally known epoxy resins. Examples of the epoxy resin include a bisphenol A type epoxy resin, a bisphenol F type epoxy resin, a biphenyl type epoxy resin, a phenol novolak type epoxy resin, a cresol novolak type epoxy resin, a xylene novolak type epoxy resin, triglycidyl isocyanurate, an alicyclic epoxy resin, a dicyclopentadiene novolak type epoxy resin, a biphenyl novolak type epoxy resin and epoxy resins having a PPE structure disclosed in Japanese patent application Nos. 2001-353194 and 2002-018508. These epoxy resins may be used alone or in combination.

The oxetane resin can be selected from generally known oxetane resins. Examples of the oxetane resin include alkyl oxetanes such as oxetane, 2-methyloxetane, 2,2-dimethyloxetane, 3-methyloxetane and 3,3-dimethyloxetane, 3-methyl-3-methoxymethyloxetane, 3,3'-di(trifluoromethyl)perfluorooxetane, 2-chloromethyloxetane, 3,3-bis(chrolomethyl)oxetane, OXT-101 (trade name, supplied by TOAGOSEI Co., Ltd.) and OXT-121 (trade name, supplied by TOAGOSEI Co., Ltd.). These oxetane resins may be used alone or in combination.

When the epoxy resin and/or the oxetane resin are used in the curable resin composition of the present invention 4, an epoxy resin curing agent and/or an oxetane resin curing agent may be used. The epoxy resin curing agent is selected from generally known curing agents. Examples of the epoxy resin curing agent include imidazole derivatives such as 2-methylimidazole, 2-ethyl-4-methylimidazole, 2-phenylimidazole, 1-cyanoethyl-2-phenylimidazole, 1-cyanoethyl-2-ethyl-4-methylimidazole, 2-phenyl-4,5-dihydroxymethylimidazole and 2-phenyl-4-methyl-5-hydroxymethylimidazole; amine compounds such as dicyandiamide, benzyldimethylamine, 4-methyl-N,N-dimethylbenzylamine, diaminodiphenyl methane and diaminodiphenyl sulfone; and phosphine compounds such as phosphonium compounds. The oxetane resin curing agent can be selected from known cationic polymerization initiators. Commercially available examples include SAN-AID SI-60L, SAN-AID SI-80L, SAN-AID SI-100L (supplied by Sanshin Chemical IndustryCo., Ltd.), CI-2064 (supplied by Nippon Soda Co., Ltd.), IRGACURE261 (supplied by Ciba Specialty Chemicals), ADEKAOPTMER SP-170, ADEKAOPTMER SP-150, (supplied by Asahi Denka Kogyo K.K.), and CYRACURE UVI-6990 (supplied by Union Carbide Corporation). The cationic polymerization initiators may be used as an epoxy resin curing agent. These curing agents may be used alone or in combination.

The compound having an ethylenic unsaturated group can be selected from generally known compounds having an ethylenic unsaturated group. Examples thereof include (meth)acrylates of monohydric and polyhydric alcohols such as 2-hydroxyethyl(meth)acrylate, 2-hydroxypropyl (meth)acrylate, polypropylene glycol di(meth)acrylate, trimethylol propane di(meth)acrylate, trimethylol propane tri (meth)acrylate, pentaerythritol tetra(meth)acrylate and dipentaerythritol hexa(meth)acrylate, and epoxy(meth)acrylates such as a bisphenol A type epoxy(meth)acrylate, a bisphenol F type epoxy(meth)acrylate and epoxy(meth) acrylates having a PPE structure disclosed in Japanese patent application Nos. 2001-387968 and 2002-038156. These compounds having an ethylenic unsaturated group may be used alone or in combination.

The photopolymerization initiator can be selected from generally known photopolymerization initiators. Examples of the photopolymerization initiator include α-diketones such as benzyl and diacetyl, acyloin ethers such as benzoyl ethyl ether and benzoin isopropyl ether, thioxanthones such as thioxanthone, 2,4-diethylthioxanthone and 2-isopropylthioxanthone, benzophenones such as benzophenone and 4,4'-bis(dimethylamino)benzophenone, acetophenones such as acetophenone, 2,2'-dimethoxy-2-phenylacetophenone and β-methoxy acetophenone, and aminoacetophenones such as 2-methyl-1-[4-(methylthio)phenyl]-2-morpholinopropane-1-one and 2-benzyl-2-dimethylamino-1-(-4-morpholinophenyl)-butanone-1. These photopolymerization initiators are used alone or in combination.

Further, the photopolymerization initiator may be used in combination with one kind of or two or more kinds of known photosensitizer(s). Examples of the photopolymerization initiator include N,N-dimethylaminoethylbenzoate, N,N-dimethylaminoisoamylbenzoate, triethanolamine and triethylamine.

The thermal polymerization initiator may be selected from generally known thermal polymerization initiators. Examples thereof include peroxides such as benzoyl peroxide, p-chlorobenzoyl peroxide, di-t-butylperoxide, diisopropyl peroxy carbonate and di-2-ethylhexylperoxycarbonate, and azo compounds such as azobisisobutylonitrile.

Further, when the curable resin composition of the present invention is produced, there may be added a known additive such as an inorganic filler, a color pigment, an antifoamer, a surface conditioner, a flame retardant, an ultraviolet absorber, an antioxidant, a polymerization inhibitor or a flow regulator, as required. Examples of the inorganic filler include silicas such as natural silica, fused silica and amorphous silica, white carbon, titanium white, aerosil, alumina, talc, natural mica, synthetic mica, kaolin, clay, aluminum hydroxide, barium sulfate, E-glass, A-glass, C-glass, L-glass, D-glass, S-glass, T-glass, NE-glass and M-glass G20. The thus-obtained curable resin composition is suitable for various uses such as a solder resist composition, buildup wiring board materials, insulating coatings, adhesives, printing inks and coating materials.

The cured product of the present invention can be obtained by curing the curable resin composition of the present invention, obtained by the above method, according to a known curing method such as a method using an electron beam, ultraviolet light or heat. When ultraviolet light is used for the curing, there may be used a low-pressure mercury lamp, an intermediate-pressure mercury lamp, a high-pressure mercury lamp, an ultrahigh-pressure mercury lamp, a xenon lamp and a metal halide lamp as a light source for ultraviolet light.

The present invention 5 will be explained hereinafter.

According to the present invention 5, there are provided a novel epoxy(meth)acrylate compound having excellent heat resistance, a low dielectric constant and a low dielectric loss tangent and a curable resin composition.

According to the present invention 5, there is provided a (meth)acrylate compound represented by the formula (16), which has one or more carbon atoms and which may contain an oxygen atom, and n is 0 or an integer of 1 to 10.

When the epoxy(meth)acrylate compound of the formula (16) in the present invention is produced, the amount of the acrylic acid, the methacrylic acid or a mixture of these based on the epoxy resin of the formula (9') is not specially limited. Preferably, the amount of the acrylic acid, the methacrylic acid or the mixture of these per 1 chemical equivalent of an

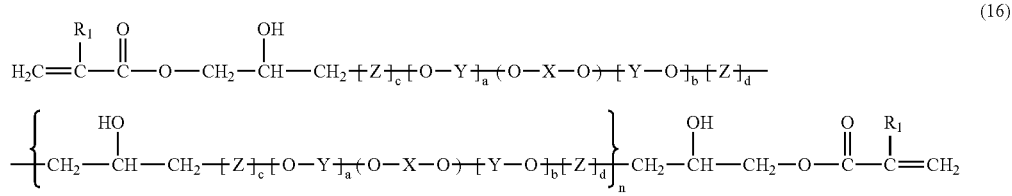

(16)

wherein $R_1$, —(O—X—O)—, A, —(Y—O)—, a, b, c and d are as defined in the formula (10), Z is an organic group having one or more carbon atoms and may contain an oxygen atom, and n is 0 or an integer of 1 to 10.

According to the present invention 5, there is provided an epoxy(meth)acrylate compound according to the above, wherein, in the formula (16), $R_2$, $R_3$, $R_8$ and $R_9$ in —(O—X—O)— are a methyl group, and —(Y—O)— has an arrangement structure of the formula (4) recited in the present invention 1 or the formula (5) recited in the present invention 1 or a random arrangement structure of the formula (4) and the formula (5).

According to the present invention 5, further, there is provided an acid-modified epoxy(meth)acrylate compound obtained by reacting an epoxy(meth)acrylate compound represented by the formula (16) with a carboxylic acid or its anhydride. Further, there are provided a curable resin composition containing the above epoxy(meth)acrylate compound and/or the acid-modified epoxy(meth)acrylate compound and a cured product thereof.

The epoxy(meth)acrylate compound of the formula (16) is preferably produced according to a known method, for example a method disclosed in JP-B-44-31472 or JP-B-45-1465. That is, typically, for example, the epoxy,(meth) acrylate compound of the formula (16) can be obtained by reacting an epoxy compound represented by the formula (9') with an acrylic acid, a methacrylic acid or a mixture of an acrylic acid and a methacrylic acid. The epoxy compound of the formula (9') is produced by, for example, the method disclosed in Japanese Patent Application No. 2002-018508.

epoxy group of the epoxy compound composition is 0.1 to 5 chemical equivalents, more preferably 0.3 to 3 chemical equivalents.

In the reaction, it is preferable to add a diluent. Examples of the diluent include alcohols such as methanol, ethanol, propanol, butanol, ethylene glycol, methyl cellosolve, ethylcellosolve, dipropylene glycol monomethyl ether and diethylene glycol monomethyl ether, esters such as methyl cellosolve acetate, ethylcellosolve acetate, dipropylene glycol monomethyl ether acetate, diethylene glycol monomethyl ether acetate and diethylene glycol monoethyl ether acetate, ketone solvents such as methyl ethyl ketone and methyl isobutyl ketone, and aromatic compounds such as benzene, toluene, xylene, chlorobenzene, dichlorobenzene and solvent naphtha.

Further, it is preferable to use a catalyst for promoting the reaction. Preferable concrete examples of the catalyst include amines such as triethylamine, dimethylbutyl amine and tri-n-butyl amine, quaternary ammonium salts such as tetramethylammonium salt, tetraethylammonium salt, tetrabutylammonium salt and benzyltriethylammonium salt, quaternary phosphonium salts, phosphines such as triphenylphosphine, and imidazoles such as 2-methylimidazole and 2-ethyl-4-methylimidazole. The amount of the catalyst based on a mixture of reaction raw materials is preferably 0.1 to 10% by weight, more preferably 0.2 to 3% by weight. Further, it is preferred touseapolymerization inhibitor for preventing a polymerization during the reaction. Examples of the polymerization inhibitor include hydroquinone, methyl hydroquinone, hydroquinone monomethyl ether,

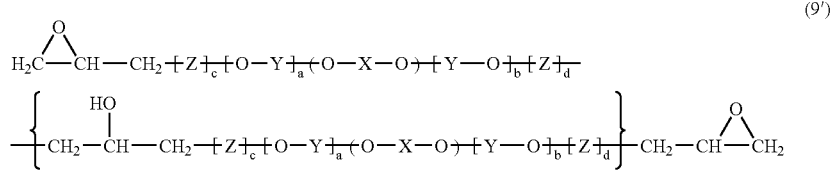

(9')

wherein —(O—X—O)—, A, —(Y—O)—, a, b, c and d are as defined in the formula (10), Z is an organic group 4-methylquinoline and phenothiazine. Further, for inhibiting a polymerization reaction due to unsaturated bonds, the reaction can be carried out under a flow of air or the like according to circumstances. In this case, an antioxidant such as 2,6-di-t-butyl-4-methylphenol may be used for preventing an oxidation reaction due to the air.

Although the reaction temperature varies depending upon the catalyst, preferred is a temperature at which the reaction of the epoxy compound of the formula (9') with the acrylic acid or the methacrylic acid advances and no thermal polymerizations of raw materials, an intermediate product and a generation product occur. More preferably, the reaction temperature is 60° C. to 150° C., particularly preferably 70° C. to 130° C. Although the reaction time depends on the reaction temperature, it is preferably 1 to 15 hours. After the completion of the reaction, an excess (meth)acrylic acid and an excess diluent may be removed by distillation or other methods, or these materials can be used without removing.

Next, the acid-modified epoxy(meth)acrylate compound of the present invention 5 will be explained. The acid-modified epoxy acrylate compound of the present invention is produced by reacting the above epoxy acrylate compound obtained from the epoxy compound of the formula (9') and acrylic acid, methacrylic acid or a mixture of these, with a carboxylic acid or its anhydride. The carboxylic acid is a monovalent or polyvalent carboxylic acid and it is preferably a monovalent or polyvalent aliphatic carboxylic acid or a monovalent or polyvalent aromatic carboxylic acid.

Examples of the carboxylic acid or its anhydride include maleic acid, succinic acid, itaconic acid, phthalic acid, tetrahydrophthalic acid, hexahydrophthalic acid, methyltetrahydrophthalic acid, methylhexahydrophthalic acid, chlorendic acid, methyl nadic acid, trimellitic acid, pyromellitic acid, benzophenone tetracarboxylic acid, 3,3'4,4'-biphenyl tetracarboxylic acid, cyclohexane tetracarboxylic acid, butane tetracarboxylic acid, naphthalene-1,4,5,8-tetracarboxylic acid, 3,3'4,4'-diphenyl sulfone tetracarboxylic acid, 4,4'-oxydiphthalic acid, cyclopentane tetracarboxylic acid, and anhydrides of these. The carboxylic acid or its anhydride shall not be limited to these examples. The amount of the carboxylic acid or its anhydride per 1 chemical equivalent of a hydroxyl group in the above epoxyacrylate compound is 0.01 to 1.2 chemical equivalents, preferably 0.05 to 1 chemical equivalent.

At the time of the reaction, various known esterification catalysts, a diluent mentioned above, and the like may be further added as required. Although the reaction temperature is not specially limited, preferred is a temperature at which no thermal polymerization of the epoxy acrylate compound, etc., as a raw material, occurs. It is preferably 60° C. to 130° C. Although the reaction time depends on the reaction temperature, it is preferably 1 to 80 hours.

After the reaction, the acid-modified epoxy (meth)acrylate compound of the present invention can be separated by a known method such as distillation. Further, the acid-modified epoxy acrylate compound of the present invention may contain an epoxy group in a molecule. That is, as described before, when the amount of the acrylic acid, the methacrylic acid or the mixture of these based on the epoxy compound is adjusted to a desired amount within the above range, an unreacted epoxy group is left in the obtained epoxy acrylate compound. The thus-obtained epoxy acrylate compound is further acid-modified, whereby an acid-modified epoxy acrylate compound having an epoxy group is obtained. The acid value of the acid-modified epoxy acrylate compound can be properly adjusted as required. It is preferably 20 to 200 mgKOH/g, more preferably 30 to 150 mgKOH/g.

Then, the curable resin composition of the present invention 5 will be explained. The curable resin composition is characterized in that it contains the above epoxy(meth)acrylate compound and/or the acid-modified epoxy(meth)acrylate compound of the present invention 5. The curable resin composition of the present invention 5 may contain a known epoxy resin, an oxetane resin, a compound having an ethylenic unsaturated compound, a photopolymerization initiator and/or a thermal polymerization initiator, a photosensitizer and the like. As the epoxy(meth)acrylate compound and the acid-modified epoxy(meth)acrylate compound of the present invention 5, the above reaction products may be used as they are.

The epoxy resin, the oxetane resin, an epoxy resin curing agent, an oxetane resin curing agent, the compound having an ethylenic unsaturated compound, the photopolymerization initiator, the thermal polymerization initiator, additives to be added to the resin composition, the curing method, etc., can be selected or carried out similarly to the descriptions in the present invention 4.

The present invention 6 will be explained hereinafter.

According to the present invention 6, there is provided a thermosetting resin which has the excellent electric characteristics and toughness of PPE and is improved in compatibility with a different resin and in molding processability. Further, according to the present invention 6, there is provided a thermosetting resin which can be widely utilized for various uses including a use in an electronics field.

The present inventors have made diligent studies concerning a thermosetting resin succeeding the excellent toughness of PPE and having low dielectric characteristics and as a result found the following. A cyanate resin obtained by dehydrohalogenation of a bifunctional PPE of the formula (6'), which is obtained by oxidative copolymerization of a bivalent phenol and a monovalent phenol, and cyanogen halide such as cyanogen chloride in the presence of a base, has the above functions and effects. On the basis of the above finding, the present inventors have completed the present invention 6.

According to the present invention 6, there are provided a thermosetting resin represented by the following formula (17), a resin composition for laminates containing the above thermosetting resin, prepreg obtained by using the above resin composition and a printed wiring board obtained by using the above resin composition,

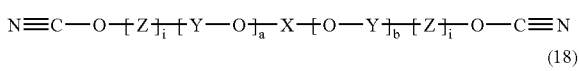

(17)

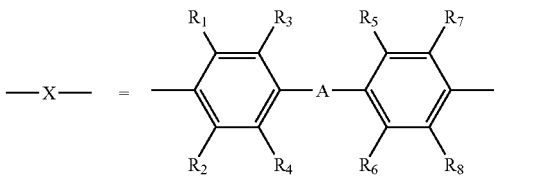

(18)

(19)

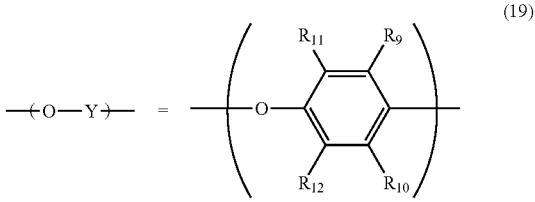

wherein —X— is represented by the formula (18) in which $R_1$, $R_2$, $R_7$ and $R_8$ may be the same or different and are a halogen atom, an alkyl group having 6 or less carbon atoms or a phenyl group, $R_3$, $R_4$, $R_5$ and $R_6$ may be the same or different and are a hydrogen atom, a halogen atom, an alkyl group having 6 or less carbon atoms or a phenyl group and A is a cyclic hydrocarbon or an organic group having an aromatic group, —(O—Y)— is represented by the formula (19) in which $R_9$ and $R_{10}$ may be the same or different and are a halogen atom, an alkyl group having 6 or less carbon atoms or a phenyl group and $R_{11}$ and $R_{12}$ may be the same or different and are a hydrogen atom, a halogen atom, an alkyl group having 6 or less carbon atoms or a phenyl group, —(O—Y)— is an arrangement of one kind of structure defined by the formula (19) or a random arrangement of two or more kinds of structures defined by the formula (19), Z is an organic group which has one or more carbon atoms and may contain an oxygen atom, each of a and b is 0 or an integer of 1 to 300, provided that at least either a or b is not 0, and each of i is independently 0 or an integer of 1).

The present invention 6 will be explained in detail hereinafter.

The present invention 6 synthesizes a bifunctional PPE efficiently and provides a thermosetting resin (cyanate compound) which has a higher activity and which is to be incorporated into a network in a resin constitution. Here, as raw materials, the same bivalent phenol and monovalent phenol as those used in the present invention 1 are used.

The bifunctional PPE oligomer compound which is an intermediate product of the present invention 6 has a structure represented by the formula (6') in which —X— is represented by the formula (18) and —(O—Y)— is an arrangement of one kind of structure defined by the formula (19) or a random arrangement of two or more structures defined by the formula (19).

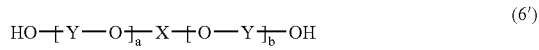

(6')

The PPE oligomer compound of the formula (6') which is an intermediate product of the present invention 6 can be efficiently produced by oxidation polymerization of a bivalent phenol represented by the formula (7) shown in the present invention 1 and a monovalent phenol represented by the formula (8) shown in the present invention 1 or a mixture of monovalent phenols represented by the formula (8) similarly to the present invention 1.

An example of the process for producing the cyanate compound of the present invention 6 will be explained. The cyanate compound is synthesized by dehydrohalogenation of the above bifunctional compound having phenolic hydroxyl groups at both terminals, represented by the formula (6'), as an intermediate product, and cyanogen halide such as cyanogen chloride or cyanogen bromide in the presence of a base.

Typical examples of the base include tertiary amines such as trimethylamine, triethylamine, tripropylamine, dimethylaniline and pyridine, sodium hydroxide, potassium hydroxide, sodium methoxide, sodium ethoxide, calcium hydroxide, sodium carbonate, potassium carbonate and sodium bicarbonate. The base shall not be limited thereto.

Typical examples of a solvent for the reaction includes toluene, xylene, chloroform, methylene chloride, carbon tetrachloride, chlorobenzene, nitrobenzene, nitromethane, acetone, methyl ethyl ketone, tetrahydrofuran, dioxane and water. The solvent shall not be limited thereto.

When cyanogen chloride is used, the reaction temperature is preferably between −30° C. and +13° C. (boiling point). When cyanogen bromide is used, it is preferably between −30° C. and +65° C.

The thermosetting PPE oligomer compound of the present invention can be cured alone. Otherwise, it can be cured as a resin composition containing the thermosetting PPE oligomer compound, a different cyanate compound, an epoxy compound, other polymerizable compounds or a catalyst.

As for the curing method, the different cyanate compound, the other polymerizable compounds, the epoxy resin, a curing agent, the catalyst, an extender to be added as required, etc., used in the present invention 6, there may be employed those which have been described in the present invention 1.

Further, a composition using these is utilized for uses, e.g., molding, lamination, an adhesive and a composite material such as a copper-clad laminate. When the cyanate compound is used alone or in combination, typical examples of uses are prepreg in which the resin or the resin composition is semi-cured and a laminate obtained by curing the above prepreg.

In the present invention 6, there is provided a thermosetting resin in which, in —X— in the formula (17), $R_1$, $R_2$, $R_3$, $R_7$ and $R_8$ may be the same or different and are a halogen atom, an alkyl group having 6 or less carbon atoms or a phenyl group, $R_4$, $R_5$ and $R_6$ may be the same or different and are a hydrogen atom, a halogen atom, an alkyl group having 6 or less carbon atoms or a phenyl group and A is a linear or branched hydrocarbon having 20 or less carbon atoms, an aromatic group or an organic group having a cyclic hydrocarbon.

In the present invention 6, further, there is provided a thermosetting resin in which at least $R_1$, $R_2$, $R_7$ and $R_8$ in —X— in the formula (17) are essentially a methyl group, further at least one of $R_3$, $R_4$, $R_5$ and $R_6$ is substituted with a methyl group, and —(O—Y)— has an arrangement structure of the formula (4) or the formula (5) or a random arrangement structure of the formula (4) and the formula (5).

The present invention 6 further provides a resin composition for laminates which contains a polyphenylene ether oligomer cyanate compound having a number average molecular weight of 700 to 3,000 and having cyanate groups at both terminals represented by the above formula (17) as an ingredient.

Further, the present invention 6 provides a resin composition for laminates containing the polyphenylene ether oligomer cyanate compound of the formula (17), a different cyanate ester resin and an epoxy resin as ingredients.

The present invention 6 further provides prepreg obtained by using the above resin composition for laminates.

The present invention 6 further provides a printed wiring board obtained by using the above prepreg.

The number average molecular weight of the obtained polyphenylene ether oligomer compound (to be referred to as "bifunctional OPE-2CN" hereinafter) is preferably limited in the range of from 700 to 3,000. When the above number average molecular weight exceeds 3,000, the melt viscosity of the resin composition increases. When it is smaller than 700, mechanical strength or heat resistance is decreased. The above bifunctional OPE-2CN has a low melt viscosity so that its flowability is high. It is excellent in compatibility with a different resin. Further, since it has cyanate groups at both terminals, the resin composition has good adhesive properties. As a result thereof, when the resin composition is exposed to a high temperature at soldering or the like after moisture absorption, the occurrence of swellings can be prevented. Further, since a polyphenylene ether resin is a material having low dielectric characteristics, there can be provided a laminate having low dielectric characteristics.

In the resin composition for laminates, provided by the present invention, the content of the bifunctional OPE-2CN is preferably in the range of from 1 to 60% by weight, more preferably 5 to 50% by weight, based on the total amount of the bifunctional OPE-2CN, the epoxy resin and the different cyanate resin. When the above content is lower than 1% by weight, sufficient flexibility is not obtained. When the above content is higher than 60% by weight, the melt viscosity increases so that voids occur at a laminate-molding, which decreases moldability.

Examples of the cyanate resin, which is an ingredient of the resin composition of the present invention 6, include 1,3- or 1,4-dicyanatobenzene, 1,3,5-tricyanatobenzene, 1,3-, 1,4-, 1,6-, 1,8-, 2,6- or 2,7-dicyanatonaphthalene, 1,3,6-tricyanatonaphthalene, 4,4'-dicyanatobiphenyl, bis(4-cyanatophenyl)methane, 2,2-bis(4-cyanatophenyl)propane, 2,2-bis(3,5-dibromo-4-cyanatophenyl)propane, bis(4-cyanatophenyl)ether, bis(4-cyanatophenyl)thioether, bis(4-cyanatophenyl)sulfone, tris(4-cyanatophenyl)phosphite, tris(4-cyanatophenyl)phosphate, 4,4'-dicyanato-3,3',5,5'-tetramethylbiphenyl, 4,4'-dicyanato-2,2',3,3',5,5'-hexamethylbiphenyl, and cyanates obtained by a reaction of novolak with cyanogen halide.

Examples of the epoxy resin, which is an ingredient of the resin composition of the present invention 6, include bisphenol A type epoxy, bisphenol F type epoxy, bisphenol Z type epoxy, biphenol.epoxy, tetramethylbiphenol.epoxy, hexamethylbiphenol.epoxy, xylene novolak.epoxy, biphenyl novolak.epoxy, dicyclopentadiene novolak.epoxy, phenol novolak.epoxy, cresol novolak.epoxy, and flame-retardant epoxy resins obtained by brominating these epoxy resins. Further, there may be used a composition containing one epoxy resin or two or more epoxy resins selected from the above epoxy resins as required and a reaction product of these epoxy resins. Further, a bifunctional polyphenylene ether oligomer epoxy compound disclosed in Japanese Patent Application No. 2001-353194 may be used in combination.

The resin composition for laminates, provided by the present invention 6, may be used in combination with various resins according to a purpose and use. Specific examples of the resins include oxetane resins; (meth)acrylic acid esters; polyallyl compounds such as diallyl benzene and diallyl terephthalate; vinyl compounds such as N-vinyl-2-pyrolidone and divinyl benzene; polymerizable double-bond-containing monomers such as unsaturated polyester; polyfunctional maleimides; polyimides; rubbers such as polybutadiene, thermoplastic resins such as polyethylene, polystyrene and PPE; and engineering plastics such as ABS resin and polycarbonate. The above resins shall not be limited to these resins.

Further, the resin composition may contain various additives such as a known inorganic or organic filler, a dye, a pigment, a thickener, a lubricant, an antifoamer, a coupling agent, a photosensitizer, an ultraviolet absorber and a flame retardant, as required.

Although the composition of the present invention 6 undergoes curing itself under heat, a heat-curing catalyst can be incorporated in the composition for increasing the curing rate and improving workability and economic efficiency. There may be used a heat-curing catalyst generally known as a heat-curing catalyst for a resin to be used in combination.

A copper-clad laminate using the resin composition for laminates, provided by the present invention 6, is particularly suitably used for a printed wiring board which is required to have low dielectric characteristics. The copper-clad laminate of the present invention 6 is produced by a generally known method. That is, it is a method in which a base material is impregnated with a resin varnish which is a solution of a thermosetting resin composition in an organic solvent, the base material is heat-treated to obtain prepreg, and then the prepreg and a copper foil are laminated and molded under heat to obtain a copper-clad laminate. However, the production method of the copper-clad laminate shall not be limited to this method.

The organic solvent to be used includes acetone, methyl ethyl ketone, ethylene glycol monomethyl ether acetate, propylene glycol dimethyl ether, toluene, xylene, tetrahydrofuran and N,N-dimethylformamide. The solvent is not specially limited and various organic solvents may be used. These solvents may be used alone or in combination.

The base material to be impregnated with the resin varnish includes all base materials used for a thermosetting resin laminate. Example thereof includes inorganic base materials such as a glass cloth and a glass unwoven fabric; and organic base materials such as a polyamide unwoven fabric and a liquid crystalline polyester unwoven fabric. For utilizing the low dielectric characteristics of the present invention, it is more effective to use a base material having excellent dielectric characteristics such as D glass cloth or NE glass cloth.

The heat-treatment of the prepreg is properly selected depending upon the kinds and the amounts of a solvent used, a resin constitution, a catalyst added and other additives, while it is generally carried out at a temperature of 100 to 250° C. for 3 to 30 minutes. The method of laminating and heating the prepreg and the copper foil varies depending upon the kind of the prepreg and the form of the copper foil. Generally, these materials are preferably thermally press-molded in vacuum at a temperature of 170 to 230° C. under a pressure of 10 to 30 kg/cm$^2$ for 40 to 120 minutes.

Effect of the Invention

It is confirmed that the thermosetting PPE oligomer compound of the present invention 1 has the excellent properties (low dielectric characteristics, toughness) of PPE, is high in the compatibility with a different resin and is to be incorporated into a network in a resin constitution. Therefore, for example, a varnish for laminates can be easily prepared and a laminate material excellent in molding processability can be produced. Further, a cured product obtained from the oligomer compound alone or a mixture of the oligomer compound and a different resin accomplishes low dielectric characteristics and becomes an electric or electronic material having the excellent properties of a PPE polymer. It is confirmed that the compound of the present invention having a phenylene ether structure is excellent in dielectric characteristics and heat resistance over a particular epoxy used for sealing a semiconductor, and it is found that the compound of the present invention is very useful.

An electronic part using the sealing epoxy resin composition of the present invention 2 is free from the occurrence of cracks, when exposed to a high temperature at a solder reflow or the like, and a sealing layer having a low dielectric constant is obtained. Accordingly, there can be provided a semiconductor device having high reliability and an excellent transmission speed in a chip circuit.

The resin composition for laminates, provided by the present invention 3, is a well-balanced resin composition which has excellent electric characteristics of high heat resistance, low dielectric constant and low dielectric loss tangent and is excellent in moldability. The above performances are further improved by combining the resin composition of the present invention with a cyanate ester resin. A laminate or multilayer printed wiring board using the above resin composition is excellent in molding at the time of multilayer formation and has high reliability. Further, high-speed processing of a high frequency signal and a low-loss circuit design become possible.

The acrylate compound of the present invention 4 has a high glass transition temperature and has a low dielectric constant and a low dielectric loss tangent and is therefore very useful as a high-functional high-molecular material. The acrylate compound of the present invention 4 can be widely used as a thermally and electrically excellent material in various uses such as various coatings, UV coating compositions, adhesives, resists and buildup wiring board materials.

The epoxy(meth)acrylate compound of the present invention 5 has a high glass transition temperature and has a low dielectric constant and a low dielectric loss tangent and is therefore very useful as a high-functional high-molecular material. The epoxy(meth)acrylate compound of the present invention 5 can be widely used as a thermally and electrically excellent material in various uses such as various coatings, UV coating compositions, adhesives, resists and laminates.

It is confirmed that the thermosetting PPE oligomer compound of the present invention 6 has the excellent properties (low dielectric characteristics, toughness) of PPE, is high in the compatibility with a different resin and is to be incorporated into a network in a resin constitution. Therefore, for example, a varnish for laminates can be easily prepared and a laminate material excellent in molding processability can be produced. Further, a cured product obtained from the oligomer compound alone or a mixture of the oligomer compound and a different resin accomplishes low dielectric characteristics and becomes an electric or electronic material having the excellent properties of a PPE polymer. It is found that the use of a compound obtained by adding a phenylene ether structure formed of 2,6-dimethylphenol or 2,3,6-trimethylphenol to a bivalent phenol having a cyclic hydrocarbon or an aromatic group, used in the present invention, as raw materials for a thermosetting PPE oligomer compound, is more effective at increasing dielectric characteristics than the use of a compound obtained by adding a phenylene structure formed of 2,6-dimethylphenol to a bis A type or bis F type phenol. Further, a laminate or multilayer printed wiring board using the above resin composition of the present invention 6 is excellent in molding at the time of multilayer formation and has high reliability. Further, high-speed processing of a high frequency signal and a low-loss circuit design become possible.

EXAMPLES

The present invention will be explained concretely with reference to Examples, while the present invention shall not be specially limited to these Examples. In Examples, "part" stands for "part by weight". A number average molecular weight and a weight average molecular weight were measured according to the gel permeation chromatography (GPC) method. Dielectric constant and dielectric loss tangent were obtained by a cavity resonant oscillation method.

Example 1

Production Process of Bifunctional PPE Oligomer Compound

A longitudinally long reactor having a volume of 2 liters and equipped with a stirrer, a thermometer, an air-introducing tube and baffleplates was charged with 2.7 g (0.012 mol) of $CuBr_2$, 70.7 g (0.55 mol) of di-n-butylamine and 600 g of toluene. The components were stirred at a reaction temperature of 40° C. A mixed solution (bivalent phenol of the formula (7):monovalent phenol of the formula (8) in a molar ratio=1:2) obtained by dissolving 59.6 g (0.21 mol) of a bivalent phenol 4,4'-(1-methylethylidene)bis(2,6-dimethylphenol) and 50.4 g (0.41 mol) of 2,6-dimethylphenol in 600 g of methanol was dropwise added to the reactor over 120 minutes while carrying out bubbling with 2 L/min of air. After the completion of the addition, stirring was carried out for 30 minutes while continuing the bubbling with 2 L/min of air. A disodium dihydrogen ethylenediamine tetraacetate aqueous solution was added to the stirred mixture to terminate the reaction. Then, washing was carried out with 1N hydrochloric acid aqueous solution and then washing was carried out with pure water. The thus-obtained solution was concentrated by an evaporator, to remove the methanol. Then, toluene was added to obtain 70% toluene solution. Part of the above toluene solution was further concentrated and then dried under reduced pressure, to obtain a powder. The powder had a number average molecular weight of 690, a weight average molecular weight of 970 and a hydroxyl group equivalent of 360.

Production Process of Epoxy Compound

A reactor equipped with a stirrer, a thermometer and a dropping funnel was heated up to 100° C. and charged with 57.1 g (hydroxyl group 0.11 mol) of the above toluene solution and 308.4 g of epichlorohydrin. Then, a solution obtained by dissolving 9.1 g (0.13 mol) of sodium ethoxide in 32.0 g of ethanol was dropwise added from the dropping funnel over 60 minutes. After the completion of the addition, stirring was carried out for 5 hours. Then, washing was carried out with pure water, and further a filtration was carried out, to remove a generated salt and impurities. Excess epichlorohydrin was distilled off from the obtained solution, and drying under reduced pressure was carried out, to obtain 44.0 g of an epoxy compound. According to the IR analysis of the obtained epoxy compound, the absorption peak (3,600 cm−1) of a phenolic hydroxyl group disappeared, and according to the NMR analysis, a peak derived from glycidyl ether appeared so that it was confirmed that all functional groups were changed.

3 parts of 1-benzyl-2-methylimidazole was added to 100 parts of the thus-obtained epoxy compound. The mixture was molten, degassed and molded at 150° C. and then cured at 180° C. for 10 hours, to obtain a cured product. The cured product had a glass transition temperature of 193° C. according to the measurement of dynamic viscoelasticity (DMA). Further, its dielectric constant at 1 GHz was 2.82 and its dielectric loss tangent was 0.0177.

Example 2

Production Process of Bifunctional PPE Oligmer Compound

A longitudinally long reactor having a volume of 2 litters and equipped with a stirrer, a thermometer, an air-introducing tube and baffleplates was charged with 2.7 g (0.012 mol) of CuBr2, 70.7 g (0.55 mol) of di-n-butylamine and 600 g of toluene. The coponents were stirred at a reaction temperature of 40° C. A mixed solution (bivalent phenol of the forumla (7):monovalent phenols of the formula (8) in a molar ratio=1:2) obtained by dissolving 68.0 g (0.21 mol) of a bivalent phenol 4,4'-cyclohexylidenebis[2,6-dimethylphenol], 25.6 g (0.21 mol) of 2,6-dimethylphenol and 28.6 g (0.21 mol) of 2,3,6-trimethyiphenol in 600 g of methyl ethyl ketone was dropwise added to the reactor over 120 minutes while carrying out bubbling with 2 L/min of air. After the completion of the addition, stirring was carried out for 30 minutes while continuing the bubbling with 2 L/min of air. A disodium dihydrogen ethylenediamine tetraacetate aqueous solution was added to the stirred mixture to terminate the reaction. Then, washing was carried out with 1N hydrochloric acid aqueous solution and then washing was carried out with pure water. The thus-obtained solution was concentrated by an evaporator, to remove the methyl ethyl ketone. Then, toluene was added to obtain 70% toluene solution. Part of the above toluene solution was further concentrated and then dried under reduced pressure, to obtain a powder. The powder had a number average molecular weight of 610, a weight average molecular weight of 870 and a hydroxyl group equivalent of 320.

Production Process of Epoxy Compound

A reactor equipped with a stirrer, a thermometer and a dropping funnel was heated up to 100° C. and charged with 57.1 g (hydroxyl group 0.13 mol) of the above toluene solution and 347.0 g of epichlorohydrin. Then, a solution obtained by dissolving 10.2 g (0.15 mol) of sodium ethoxide in 35.8 g of ethanol was dropwise added from the dropping funnel over 60 minutes. After the completion of the addition, stirring was carried out for 5 hours. Then, washing was carried out with pure water, and further a filtration was carried out, to remove a generated salt and impurities. Excess epichlorohydrin was distilled off from the obtained solution, and drying under reduced pressure was carried out, to obtain 45.2 g of an epoxy compound. According to the IR analysis of the obtained epoxy compound, the absorption peak (3,600 cm−1) of a phenolic hydroxyl group disappeared, and according to the NMR analysis, a peak derived from glycidyl ether appeared so that it was confirmed that all functional groups were changed.

3 parts of 1-benzyl-2-methylimidazole was added to 100 parts of the thus-obtained epoxy compound. The mixture was molten, degassed and molded at 150° C. and then cured at 180° C. for 10 hours, to obtain a cured product. The cured product had a glass transition temperature of 192° C. according to the measurement of dynamic viscoelasticity (DMA). Further, its dielectric constant at 1 GHz was 2.80 and its dielectric loss tangent was 0.0175.

Example 3

Production Process of Bifunctional PPE Oligomer Compound

A longitudinally long reactor having a volume of 2 liters and equipped with a stirrer, a thermometer, an air-introducing tube and baffleplates was charged with 1.3 g (0.013 mol) of CuCl, 79.5 g (0.62 mol) of di-n-butylamine and 400 g of methyl ethyl ketone. The components were stirred at a reaction temperature of 40° C. A mixed solution (bivalent phenol of the formula (7):monovalent phenol of the formula (8) in a molar ratio=1:4) obtained by dissolving 42.6 g (0.15 mol) of a bivalent phenol 4,4'-methylenebis(2,3,6-trimethylphenol), 56.7 g (0.46 mol) of 2,6-dimethylphenol and 21.1 g (0.16 mol) of 2,3,6-trimethylphenol in 400 g of methyl ethyl ketone and 400 g of tetrahydrofluran was dropwise added to the reactor over 120 minutes while carrying out bubbling with 2 L/min of air. After the completion of the addition, stirring was carried out for 60 minutes while continuing the bubbling with 2 L/min of air. A disodium dihydrogen ethylenediamine tetraacetate aqueous solution was added to the stirred mixture to terminate the reaction. Then, washing was carried out with 1N hydrochloric acid aqueous solution and then washing was carried out with pure water. The thus-obtained solution was concentrated by an evaporator and then dried under reduced pressure, to obtain 113.2 g of an oligomer compound. The oligomer compound-had a number average molecular weight of 1,050, a weight average molecular weight of 1,490 and a hydroxyl group equivalent of 550.

Production Process of Epoxy Compound

A reactor equipped with a stirrer, a thermometer and a dropping funnel was heated up to 100° C. and charged with 40.0 g (hydroxyl group 0.07 mol) of the above oligomer compound and 336.5 g of epichlorohydrin. Then, a solution obtained by dissolving 5.9 g (0.09 mol) of sodium ethoxide in 20.8 g of ethanol was dropwise added from the dropping funnel over 60 minutes. After the completion of the addition, stirring was carried out for 5 hours. Then, washing was carried out with pure water, and further a filtration was carried out, to remove a generated salt and impurities. Excess epichlorohydrin was distilled off from the obtained solution, and drying under reduced pressure was carried out, to obtain 42.8 g of an epoxy compound. According to the IR analysis of the obtained epoxy compound, the absorption peak (3,600 cm−1) of a phenolic hydroxyl group disappeared, and according to the NMR analysis, a peak derived from glycidyl ether appeared so that it was confirmed that all functional groups were changed.

3 parts of 1-benzyl-2-methylimidazole was added to 100 parts of the thus-obtained epoxy compound. The mixture was molten, degassed and molded at 150° C. and then cured at 180° C. for 10 hours, to obtain a cured product. The cured product had a glass transition temperature of 198° C. according to the measurement of dynamic viscoelasticity (DMA). Further, its dielectric constant at 1 GHz was 2.79 and its dielectric loss tangent was 0.0173.

Example 4

Production Process of Bifunctional PPE Oligomer Compound

A longitudinally long reactor having a volume of 2 liters and equipped with a stirrer, a thermometer, an air-introducing tube and baffleplates was charged with 1.1 g (0.11 mol) of CuCl, 66.3 g (0.51 mol) of di-n-butylamine and 400 g of toluene. The components were stirred at a reaction temperature of 40° C. A mixed solution (bivalent phenol of the formula (7):monovalent phenol of the formula (8) in a molar ratio=1:8) obtained by dissolving 33.1 g (0.077 mol) of a bivalent phenol 4,4'-[1,4-phenylenebis( 1-methylethylidene)]bis(2,3,6-trimethylphenol) and 75.6 g (0.62 mol) of 2,6-dimethylphenol in 400 g of methyl ethyl ketone and 400 g of tetrahydrofuran was dropwise added to the reactor over 120 minutes while carrying out bubbling with 2 L/min of air. After the completion of the addition, stirring was carried out for 30 minutes while continuing the bubbling with 2 L/min of air. A disodium dihydrogen ethylenediamine tetraacetate aqueous solution was added to the stirred mixture to terminate the reaction. Then, washing was carried out with 1N hydrochloric acid aqueous solution and then washing was carried out with pure water. The thus-obtained solution was concentrated by an evaporator and then dried under reduced pressure, to obtain 102.2 g of an oligomer compound. The oligomer compound had a number average molecular weight of 1,820, a weight average molecular weight of 2,510 and a hydroxyl group equivalent of 970.

Production Process of Epoxy Compound

A reactor equipped with a stirrer, a thermometer and a dropping funnel was heated up to 100° C. and charged with 40 g (hydroxyl group 0.04 mol) of the above oligomer compound and 267.1 g of epichlorohydrin. Then, a solution obtained by dissolving 3.4 g (0.05 mol) of sodium ethoxide in 11.8 g of ethanol was dropwise added from the dropping funnel over 60 minutes. After the completion of the addition, stirring was carried out for 5 hours. Then, washing was carried out with pure water, and further a filtration was carried out, to remove a generated salt and impurities. Excess epichlorohydrin was distilled off from the obtained solution, and drying under reduced pressure was carried out, to obtain 41.1 g of an epoxy compound. According to the IR analysis of the obtained epoxy compound, the absorption peak (3,600 cm−1) of a phenolic hydroxyl group disappeared, and according to the NMR analysis, a peak derived from glycidyl ether appeared so that it was confirmed that all functional groups were changed.

3 parts of 1-benzyl-2-methylimidazole was added to 100 parts of the thus-obtained epoxy compound. The mixture was molten, degassed and molded at 150° C. and then cured at 18° C. for 10 hours, to obtain a cured product. The cured product had a glass transition temperature of 197° C. according to the measurement of dynamic viscoelasticity (DMA). Further, its dielectric constant at 1 GHz was 2.81 and its dielectric loss tangent was 0.0168.

Example 5

Production Process of Bifunctional PPE Oligomer Compound

A longitudinally long reactor having a volume of 2 liters and equipped with a stirrer, a thermometer, an air-introducing tube and baffleplates was charged with 2.7 g (0.0 12 mol) of CuBr2, 70.7 g (0.55 mol) of di-n-butylamine and 600 g of toluene. The components were stirred at a reaction temperature of 40° C. A mixed solution (bivalent phenol of the formula (7):monovalent phenol of the formula (8) in a molar ratio=1:2) obtained by dissolving 53.8 g (0.21 mol) of a bivalent phenol 4,4'-methylenebis(2,6-dimethylphenol) and 50.4 g (0.41 mol) of 2,6-dimethylphenol in 600 g of methanol was dropwise added to the reactor over 120 minutes while carrying out bubbling with 2 L/min of air. After the completion of the addition, stirring was carried out for 30 minutes while continuing the bubbling with 2 L/min of air. A disodium dihydrogen ethylenediamine tetraacetate aqueous solution was added to the stirred mixture to terminate the reaction. Then, washing was carried out with 1N hydrochloric acid aqueous solution and then washing was carried out with pure water. The thus-obtained solution was concentrated by an evaporator and then dried under reduced pressure, to obtain 97.9 g of an oligomer compound. The oligomer compound had a number average molecular weight of 620, a weight average molecular weight of 860 and a hydroxyl group equivalent of 320.

Production Process of Allyl Compound

A solution obtained by dissolving 50.0 g (hydroxyl group 0.16 mol) of the above oligomer compound and 37.8 g (0.31 mol) of allyl bromide in 150 g of methylene chloride, and 120 ml of 1N sodium hydroxide aqueous solution were placed in a reactor equipped with a stirrer and a thermometer at room temperature. Further, 5.6 g (0.02 mol) of benzyltri-n-butylammonium bromide as a phase transfer catalyst was added to the reactor. The mixture was stirred for 5 hours. Then, washing was carried out with 0.1N hydrochloric acid aqueous solution, then washing was carried out with pure water, and further a filtration was carried out, to remove a generated salt and impurities. The methylene chloride was distilled off from the obtained solution, and drying under reduced pressure was carried out, to obtain 54.15 g of an allyl compound. According to the IR analysis of the obtained allyl compound, the absorption peak (3,600 cm−1) of a phenolic hydroxyl group disappeared, and according to the NMR analysis, a peak derived from an allyl group appeared so that it was confirmed that all functional groups were changed.

The allyl compound was molten, degassed and molded at 150° C. and then cured at 230° C. for 3 hours, to obtain a cured product. The cured product had a glass transition temperature of 208° C. according to the measurement of dynamic viscoelasticity (DMA). Further, its dielectric constant at 1 GHz was 2.76 and its dielectric loss tangent was 0.0046.

Comparative Example 1

3 parts of 1-benzyl-2-methylimidazole was added to 100 parts of 3,3',5,5'-tetramethyl-[1,1'-biphenyl]-4,4'-glycidyl ether which was a biphenyl type epoxy resin for a semiconductor-sealing material. The mixture was molten, degassed and molded at 150° C. and then cured at 180° C. for 10 hours, to obtain a cured product. The cured product had a glass transition temperature of 133° C. according to the measurement of dynamic viscoelasticity (DMA). Further, its dielectric constant at 1 GHz was 3.06 and its dielectric loss tangent was 0.030.

Comparative Example 2

3 parts of 1-benzyl-2-methylimidazole was added to 100 parts of dicyclopentadiene type epoxy for a semiconductor-sealing material. The mixture was molten, degassed and molded at 150° C. and then cured at 180° C. for 10 hours, to obtain a cured product. The cured product had a glass transition temperature of 182° C. according to the measurement of dynamic viscoelasticity (DMA). Further, its dielectric constant at 1 GHz was 2.90 and its dielectric loss tangent was 0.020.

Table 1 shows the above results.

TABLE 1

|  | Ex. 1 | Ex. 2 | Ex. 3 | Ex. 4 | Ex. 5 | CEx. 1 | CEx. 2 |
| --- | --- | --- | --- | --- | --- | --- | --- |
| dielectric constant (1 GHz) | 2.82 | 2.80 | 2.79 | 2.75 | 2.76 | 3.06 | 2.90 |
| dielectric loss tangent (1 GHz) | 0.0177 | 0.0175 | 0.0173 | 0.0140 | 0.0046 | 0.0303 | 0.0204 |
| Tg (DMA)/° C. | 193 | 192 | 198 | 197 | 208 | 133 | 182 |

Ex. = Example,
CEx. = Comparative Example

Referential Example 1

Production Process of Bifunctional OPE-2Ep (1)

(Production Process of Bifunctional OPE)

A longitudinally long reactor having a volume of 2 liters and equipped with a stirrer, a thermometer, an air-introducing tube and baffleplates was charged with 1.3 g (0.013 mol) of CuCl, 79.5 g (0.62 mol) of di-n-butylamine and 600 g of methyl ethyl ketone. The components were stirred at a reaction temperature of 40° C. A mixed solution (bivalent phenol:monovalent phenols in a molar ratio=1:4) obtained by dissolving 42.6 g (0.15 mol) of 4,4'-(1-methylethylidene)bis(2,6-dimethylphenol), 56.7 g (0.46 mol) of 2,6-dimethylphenol and 21.1 g (0.16 mol) of 2,3,6-trimethylphenol in 600 g of methyl ethyl ketone was dropwise added to the reactor over 120 minutes while carrying out bubbling with 2 L/min of air. After the completion of the addition, stirring was carried out for 30 minutes while continuing the bubbling with 2 L/min of air. A disodium dihydrogen ethylenediamine tetraacetate aqueous solution was added to the stirred mixture to terminate the reaction. Then, washing was carried out with 1N hydrochloric acid aqueous solution and then washing was carried out with pure water. The thus-obtained solution was concentrated by an evaporator and then dried under reduced pressure, to obtain 112.3 g of a bifunctional OPE. The bifunctional OPE was measured according to the gel permeation chromatography (GPC) method. As a result thereof, the bifunctional OPE had a number average molecular weight of 1,080. Further, it had a hydroxyl group equivalent of 550.

(Production Process of Bifunctional OPE-2Ep)

A reactor equipped with a stirrer, a thermometer and a dropping funnel was heated up to 100° C. and charged with 40.0 g (hydroxyl group: 0.073 mol) of the above bifunctional OPE and 201.9 g of epichlorohydrin. Then, a solution obtained by dissolving 5.9 g (0.087 mol) of sodium ethoxide in 20.8 g of ethanol was dropwise added from the dropping funnel over 60 minutes. After the completion of the addition, stirring was carried out for 5 hours. Then, washing was carried out with pure water, and further a filtration was carried out, to remove a generated salt and impurities. Excess epichlorohydrin was distilled off from the obtained solution, and drying under reduced pressure was carried out, to obtain 42.4 g of a bifunctional OPE-2Ep (number average molecular weight: 1,230, to be referred to as "bifunctional OPE-2Ep [A]" hereinafter). According to the IR analysis of the obtained bifunctional OPE-2Ep [A], the absorption peak (3,600 cm−1) of a phenolic hydroxyl group disappeared and, according to the NMR analysis, a peak derived from glycidyl ether appeared so that it was confirmed that all functional groups were changed.

Referential Example 2

Production Process of Bifunctional OPE-2Ep (2)

(Production Process of Bifunctional OPE)

A longitudinally long reactor having a volume of 2 liters and equipped with a stiffer, a thermometer, an air-introducing tube and baffleplates was charged with 2.7 g (0.012 mol) of CuBr2, 66.3 g (0.51 mol) of di-n-butylamine and 500 g of toluene. The components were stirred at a reaction temperature of 40° C. A mixed solution (bivalent phenol: monovalent phenol in a molar ratio=1:8) obtained by dissolving 21.9 g (0.077 mol) of 4,4'-(1-methylethylidene)bis(2,6-dimethylphenol) and 75.6 g (0.62 mol) of 2,6-dimethylphenol in 600 g of methanol was dropwise added to the reactor over 120 minutes while carrying out bubbling with 2 L/min of air. After the completion of the addition, stirring was carried out for 30 minutes while continuing the bubbling with 2 L/min of air. A disodium dihydrogen ethylenediamine tetraacetate aqueous solution was added to the stirred mixture to terminate the reaction. Then, washing was carried out with 1N hydrochloric acid aqueous solution and then washing was carried out with pure water. The thus-obtained solution was concentrated by an evaporator to obtain a 70% toluene solution of a bifunctional OPE. Part of the above toluene solution was further concentrated and then dried under reduced pressure, to obtain a powder. According to the same measurement as that in the Referential Example 1, the powder had a number average molecular weight of 1,670. Further, it had a hydroxyl group equivalent of 830.

(Production Process of Bifunctional OPE-2Ep)

41.0 g of a bifunctional OPE-2Ep (number average molecular weight: 1,820, to be referred to as "bifunctional OPE-2Ep [B]" hereinafter) was obtained in the same manner as in Referential Example 1 except that 57.1 g (hydroxyl group: 0.048 mol) of the above-obtained bifunctional OPE toluene solution, 223.0 g of epichlorohydrin, 13.8 g of ethanol and 3.9 g (0.058 mol) of sodium ethoxide were used. According to the same method as that in Referential Example 1, it was confirmed that all functional groups were changed.

Referential Example 3

Production Process of Bifunctional OPE-2Ep (3)

(Production Process of Bifunctional OPE)

A 70% toluene solution of a bifunctional OPE was obtained in the same manner as in Referential Example 2 except that there was used a mixed solution (bivalent phenol: monovalent phenol in a molar ratio=1:15) obtained by dissolving 12.5 g (0.044 mol) of 4,4'-(1-methylethylidene)bis(2,6-dimethylphenol) and 79.9 g (0.66 mol) of 2,6-dimethylphenol in 600 g of methanol. Part of the solution was further concentrated and then dried under reduced pressure to obtain a powder. The powder had a number average molecular weight of 3,350 and a hydroxyl group equivalent of 1,670. The number average molecular weight was measured in the same manner as in Referential Example 1.

(Process for the Production of Bifunctional OPE-2Ep)

49.6 g of a bifunctional OPE-2Ep (number average molecular weight: 3,520, to be referred to as "bifunctional OPE-2Ep [C]" hereinafter) was obtained in the same manner as in Referential Example 1 except that 71.4 g (hydroxyl group: 0.030 mol) of the above-obtained bifunctional OPE toluene solution, 193.9 g of epichlorohydrin, 8.6 g of ethanol and 2.4 g (0.036 mol) of sodium ethoxide were used. According to the same method as that in Referential Example 1, it was confirmed that all functional groups were changed.

Referential Example 4

Production Process of an Epoxy-modified Polyphenylene Ether Resin 47.7 g of an epoxy-modified polyphenylene ether resin (to be referred to as "epoxy-modified PPE resin" hereinafter, number average molecular weight: 16,000) was obtained in the same manner as in Referential Example 1 except that 50 g of a commercially available polyphenylene ether resin (supplied by Mitsubishi Gas Chemical Co., Inc., number average molecular weight: 16,000, hydroxyl group: 0.003 mol), 200 g of toluene, 2.9 g of epichlorohydrin, 2.2 g of ethanol and 0.6 g (0.009 mol) of sodium ethoxide were used. According to the same method as that in Referential Example 1, it was confirmed that 95% of functional groups were changed.

Example 6

There were used 32.40 parts (7.02% by weight) of YX4000H (supplied by Japan Epoxy Resins Co., Ltd, epoxy equivalent 195) as a biphenyl type epoxy resin, 10.80 parts (2.34% by weight) of 195XL (supplied by Sumitomo Chemical Co., Ltd., epoxy equivalent 195) as a cresol novolak type epoxy resin, 3.78 parts (0.82% by weight) of EBS400T (supplied by Sumitomo Chemical Co., Ltd., epoxy equivalent 400) as a flame-retardant bisphenol type epoxy resin, 11.50 parts (2.49% by weight) of bifunctional OPE-2Ep [B], 15.93 parts (3.45% by weight) of KAYA-HARD NHN (supplied by Nippon Kayaku Co., Ltd., hydroxyl group equivalent 140) as a naphthalene type phenol resin composition, 15.93 parts (3.45% by weight) of MILEX 225-3L (supplied by Mitsui Chemicals, Inc., hydroxyl equivalent 173) as a P-xylylene-phenol compolymer, a powder obtained by treating 360.50 parts (78.08% by weight) of a fused silica powder with 2.13 parts (0.46% by weight) of γ-glycidoxypropyltrimethoxysilane, 0.95 part (0.21% by weight) of triphenylphosphine, 1.36 parts (0.30% by weight) of natural carnauba, 0.99 parts (0.21% by weight) of carbon black and 5.40 parts (1.17% by weight) of antimony trioxide. First, the bifunctional OPE-2Ep [B] and the epoxy resins were dissolved in the toluene, to obtain a homogenous toluene solution having a concentration of 30% by weight. The toluene was removed from the above toluene solution, to obtain a mixture of the epoxy resins and the bifunctional OPE-2Ep. The above materials were added to the mixture and the resultant mixture was kneaded with a heating roller at 85° C. for approximately 5 minutes. Then, the kneaded mixture was pulverized so as to have a diameter of approximately 5 mm, whereby a sealing epoxy resin composition was obtained.

Examples 7 to 9 and Comparative Examples 3 to 5

Sealing epoxy resin compositions were obtained in the same manner as in Example 6 except that materials were mixed in amount ratios shown in Table 2. The obtained sealing epoxy resin compositions of Examples 6 to 9 and Comparative Examples 3 to 5 were subjected to a test of heat resistance against soldering, and these resin compositions were evaluated for dielectric constant. Further, the resin compositions were measured for melt viscosity, cured products thereof were measured for bending strength, and the resin compositions were measured for moldability when used for sealing.

The above moldability test and the test of heat resistance against soldering were carried out under the following conditions. A semiconductor chip having 7.6 mm×7.6 mm×0.4 mm (thickness) was mounted on an alloy lead frame having a die pad size of 8.2 mm×8.2 mm with a silver paste, and molding was carried out by using a 60-pin flat package molding die having an outside dimension of 19 mm×15 mm×1.8 mm (thickness) to prepare a test specimen. The obtained test specimen was checked for existence or nonexistence of voids in a sealing layer with an ultrasonic exploratory device. When no voids existed, moldability was good (expressed by ○). When voids existed, moldability was poor (expressed by X). Further, five test specimens were prepared in the above manner. Each of the test specimens was allowed to absorb moisture at 85° C. at 85% RH for 72 hours, then it was immersed in a solder having a temperature of 260° C. for 10 seconds. The procedures of absorption and immersion were carried out two times. After the soldering, the sealing layer was checked for existence or nonexistence of cracks with an ultrasonic exploratory device and the sealing layer having cracks was considered to be defective.

The above dielectric constant was measured by using the above specimen on the basis of the measurement method of a molded article according to JIS-K-6911.

The above bending strength of cured product was measured as follows. One of the sealing epoxy resin compositions was cured to prepare a test specimen having a size of 10 mm×4 mm×100 mm, the test specimen was measured for three-point bending strength at room temperature and at 240° C. under conditions of distance between supports=64 mm and a crosshead speed=2 mm/min.

The above melt viscosity of the resin composition was measured at 175° C. with an elevated type flow tester.

Table 3 shows the above results. It is confirmed that, when bifunctional OPE-2Eps having a number average molecular weight of 700 to 3,000 are used, moldability is good, no voids occur, dieletric constant is low, bending strength at high temperatures is excellent and melt viscosity is low.

TABLE 2

(Unit: % by weight)

| | | Ex. 6 | Ex. 7 | Ex. 8 | Ex. 9 | CEx. 3 | CEx. 4 | CEx. 5 |
|---|---|---|---|---|---|---|---|---|
| Epoxy resin | YX4000H | 7.02 | 6.06 | 9.36 | 7.02 | 7.02 | 7.02 | 8.87 |
| | 195XL | 2.34 | | | 2.34 | 2.34 | 2.34 | 2.98 |
| | EBS400T | 0.82 | 0.82 | 0.82 | 0.82 | 0.82 | 0.82 | 0.82 |
| Bifunctional OPE-2Ep [A] | | | | | 2.49 | | | |
| Bifunctional OPE-2Ep [B] | | 2.49 | 5.79 | 2.49 | | | | |
| Bifunctional OPE-2Ep [C] | | | | | | | 2.49 | |
| Epoxy-modified PPE | | | | | | | | 2.49 |
| KAYAHARD NHN | | 3.45 | 3.45 | 3.45 | 3.45 | 3.45 | 3.45 | 3.45 |
| MILEX 225-3L | | 3.45 | 3.45 | 3.45 | 3.45 | 3.45 | 3.45 | 3.45 |
| Fused silica powder | | 78.08 | 78.08 | 78.08 | 78.08 | 78.08 | 78.08 | 78.08 |
| Coupling agent | | 0.46 | 0.46 | 0.46 | 0.46 | 0.46 | 0.46 | 0.46 |
| Triphenyl phosphine | | 0.21 | 0.21 | 0.21 | 0.21 | 0.21 | 0.21 | 0.21 |
| Natural carnauba | | 0.30 | 0.30 | 0.30 | 0.30 | 0.30 | 0.30 | 0.30 |
| Carbon black | | 0.21 | 0.21 | 0.21 | 0.21 | 0.21 | 0.21 | 0.21 |
| antimony trioxide | | 1.17 | 1.17 | 1.17 | 1.17 | 1.17 | 1.17 | 1.17 |

Ex. = Example,
CEx. = Comparative Example

TABLE 3

| | Ex. 6 | Ex. 7 | Ex. 8 | Ex. 9 | CEx. 3 | CEx. 4 | CEx. 5 |
|---|---|---|---|---|---|---|---|
| Number of the occurrence of cracks after soldering Number of defectives/Number of specimens tested | 0/5 | 0/5 | 0/5 | 0/5 | 2/5 | 5/5 | 5/5 |
| dielectric constant | 4.7 | 4.2 | 4.7 | 4.7 | 4.7 | 4.4 | 5.1 |
| Moldability | ○ | ○ | ○ | ○ | ○ | X | ○ |
| Bending strength (MPa) Room temperature | 154 | 159 | 155 | 154 | 145 | 148 | 144 |
| 240° C. | 12.5 | 13.5 | 12.4 | 11.5 | 7.5 | 8.8 | 5.9 |
| Melt viscosity (Pa · s) | 29 | 33 | 22 | 24 | 37 | 94 | 20 |

Ex. = Example,
CEx. = Comparative Example

Example 10

70 parts of the same bifunctional OPE-2Ep as that obtained in Referential Example 1, 20 parts of tetrabromobisphenol A epoxy (supplied by Dainippon Ink And Chemicals, Incorporated, trade name: EPICLON-153), 10 parts of 4,4'-diaminodiphenylmethane and 0.07 part of 2-methylimidazole were dissolved in methyl ethyl ketone, to prepare a varnish having a resin content of 60% by weight.

A glass cloth (NE glass product: trade name WEX983, supplied by Nitto Boseki Co., Ltd.) was impregnated with the above varnish, and then it was treated with a hot-air dryer, to obtain B-stage prepreg. Eight sheets of the prepreg and a copper foil (thickness: 18 µm, supplied by Mitsui Mining & smelting Co., Ltd., trade name: 3EC-3) were laminated and these materials were hot-pressed at 200° C. in vacuum for 2 hours to obtain a 0.8 mm-thick copper-clad laminate. Table 5 shows the physical properties of the copper-clad laminate.

Example 11 and Comparative Example 6-8

Copper-clad laminates were obtained in the same manner as in Example 10 except that thermosetting resins were mixed in amount ratios shown in Table 4. In Comparative Example 7, toluene was used as a solvent, since an ingredient was insoluble in methyl ethyl ketone.

TABLE 4

| | Ex. 10 | Ex. 11 | CEx. 6 | CEx. 7 | CEx. 8 |
|---|---|---|---|---|---|
| Bifunctional OPE-2Ep | 70 | 50 | — | — | — |
| General-purpose PPE polymer | — | — | — | 30 | — |
| Bisphenol A type cyanate prepolymer | — | 30 | — | 30 | 30 |
| 4,4'dimethyl diphenylmethane | 10 | — | 18 | — | — |
| Tetrabromobisphenol A epoxy | 20 | 20 | 20 | 20 | 20 |
| Bisphenol A epoxy | — | — | 10 | 20 | — |
| Phenol novolak type epoxy | — | — | 52 | — | 50 |
| iron acetylacetonate | — | 0.04 | — | 0.04 | 0.04 |
| 2-methylimidazole | 0.07 | — | 0.07 | — | — |

Ex. = Example,
CEx. = Comparative Example

General-purpose PPE polymer: supplied by Mitsubishi Gas Chemical Co., Inc., number average molecular weight: 24,000.

Bisphenol A type cyanate prepolymer: prepolymer of 2,2-bis(4-cyanatophenyl)propane.

Tetrabromobisphenol A epoxy: EPICLON-153, supplied by Dainippon Ink And Chemicals, Incorporated.

Bisphenol A epoxy: DER-331L, supplied by Dow Chemical Japan Ltd.

Phenol novolak type epoxy: EPPN-201, supplied by Nippon Kayaku Co., Ltd.

TABLE 5

| | Ex. 10 | Ex. 11 | CEx. 6 | CEx. 7 | CEx. 8 |
|---|---|---|---|---|---|
| Grass transition temperature (DMA method) | 184° C. | 213° C. | 156° C. | 202° C. | 190° C. |
| Dielectric constant (1 GHz) | 3.5 | 3.5 | 4.2 | 3.5 | 4.0 |
| Dielectric loss tangent (1 GHz) | 0.0087 | 0.0052 | 0.021 | 0.0046 | 0.014 |
| Copper-foil peeling strength (kN/m) | 1.4 | 1.2 | 1.4 | 1.2 | 0.9 |
| Moldability | ○ | ○ | ○ | X | ○ |
| Heat resistance against soldering after moisture absorption (number of swelling/number of tested specimens) | | | | | |
| 1 hour treatment | 0/3 | 0/3 | 0/3 | 2/3 | 0/3 |
| 2 hours treatment | 0/3 | 0/3 | 0/3 | 3/3 | 0/3 |
| 3 hours treatment | 0/3 | 0/3 | 2/3 | 3/3 | 1/3 |

Ex. = Example,
CEx. = Comparative Example

In Examples and Comparative Examples, measurements were carried out by the following devices and methods.

Grass transition temperature (Tg): Obtained by a loss tangent (tan δ) peak of a dynamic viscoelasticity measurement.

Dielectric constant and dielectric loss tangent: Measured according to a cavity resonant oscillation method.

Copper foil peeling strength: Peeling strength of a copper foil having a width of 10 mm in a 90-degree direction was measured according to JIS C6481.

Heat resistance against soldering after moisture absorption: A sample was prepared by removing the entire copper foil, the sample was treated for absorption under PCT conditions at 121° C. at 0.2 MPa for 1 to 3 hours and then the sample was immersed in a solder bath at 260° C. for 30 seconds. The sample was visually observed for the occurrence of a delamination (swelling).

Moldability: Determined depending upon whether or not an internal layer pattern of a 70 µm-thick copper foil could be embedded without voids.

Example 12

(Synthesis of Bifunctional PPE Oligomer Compound)

A longitudinally long reactor having a volume of 2 liters and equipped with a stirrer, a thermometer, an air-introducing tube and baffleplates was charged with 1.3 g (0.012 mol) of CuCl, 70.7 g (0.55 mol) of di-n-butylamine and 400 g of methyl ethyl ketone. The components were stirred at a reaction temperature of 40° C. A solution obtained by dissolving 45.4 g (0.16 mol) of a bivalent phenol 4,4'-(1-methylethylidene)bis(2,6-dimehtylphenol) and 58.6 g (0.48 mol) of 2,6-dimehtylphenol in 800 g of methyl ethyl ketone was dropwise added to the reactor over 120 minutes while carrying out bubbling with 2 L/min of air. After the completion of the addition, stirring was carried out for 60 minutes while continuing the bubbling with 2 L/min of air. A disodium dihydrogen ethylenediamine tetraacetate aqueous solution was added to the reaction mixture to terminate the reaction. Then, washing was carried out with 1N hydrochloric acid aqueous solution and then washing was carried out with pure water. The thus-obtained solution was concentrated by an evaporator and then dried under reduced pressure, to obtain 98.8 g of an oligomer compound. The oligomer compound had a number average molecular weight of 845, a weight average molecular weight of 1,106 and a hydroxyl group equivalent of 451.

(Introduction of Z-site)

A reactor equipped with a stirrer, a thermometer and a reflux tube was charged with 50 g (hydroxyl group 0.11 mol) of the above oligomer compound, 15.3 g of potassium carbonate and 400 ml of acetone and the mixture was refluxed under nitrogen for 3 hours. Then, 22.1 g of 6-bromo-1-hexanol was dropwise added to the mixture over 1 hour. After the completion of the addition, the resultant mixture was further refluxed for 30 hours. After neutralization with hydrochloric acid, a large amount of pure water was added to the mixture to obtain a precipitate, and toluene was added to perform extraction. The obtained solution was concentrated by evaporator, and the concentrated solution was dropwise added to methanol to obtain a precipitate again. A solid was recovered by filtration. Then, drying under reduced pressure was carried out to obtain 55.2 g of a resin. The resin had a number average molecular weight of 1,049 a weight average molecular weight of 1,398 and a hydroxyl group equivalent of 554.

(Synthesis of an Acrylate Compound)

A reactor equipped with a stirrer, a thermometer and a reflux tube was charged with 30 g of the above resin, 4.7 g of an acrylic acid, 30 g of toluene, 0.12 g of p-toluenesulfonic acid and 0.03 g of hydroquinone. The mixture was allowed to react under heat with refluxing. A generation water was quantified and collected with a water quantitative receiver. At the time when 0.9 g of the generation water was collected, the reaction mixture was cooled. The reaction temperature was 110 to 120° C. The reaction mixture was neutralized with 20% NaOH aqueous solution and then washed with 20% NaCl aqueous solution. The solvent was evaporated under a reduced pressure, to obtain 29.6 g of an acrylate compound. The acrylate compound had a number average molecular weight of 1,201 and a weight average molecular weight of 1,611. 10 g of the above resin was molten, degassed and molded at 150° C. and then cured at 200° C. for 6 hours, to obtain a cured product.

6 g of the above acrylate compound was dissolved in 4 g of carbitol acetate, and 0.6 g of Darocur 1173 (supplied by Ciba Specialty Chemicals, photopolymerization initiator) was added to the solution to obtain a resin composition. The resin composition was applied to a copper-clad laminate surface by a screen printing machine, and then dried with an air dryer at 80° C. for 60 minutes, to obtain a coating. A pattern film was placed on the coating, and the coating was exposed at 1,500 mJ with a UV irradiation device (supplied by EYE GRAPHICS Co., Ltd.: UB0151, light source: metal halide lamp). After the exposure, development was carried out with methyl ethyl ketone. In this case, only non-exposed portions were dissolved in the methyl ethyl ketone, to obtain a development pattern of a resin-cured product. A pencil mar strength (JIS K5400) of the resin-cured product was B.

Example 13

(Synthesis of Bifunctional PPE Oligomer Compound)

102.6 g of an oligomer compound was obtained in the same manner as in Example 12 except that, in the synthesis of bifunctional PPE oligomer compound in Example 12, the dropwise addition solution was replaced with a solution obtained by dissolving 51.8 g (0.16 mol) of a bivalent phenol 4,4'-cyclohexylidenebis(2,6-dimethylphenol) and 58.6 g (0.48 mol) of 2,6-dimethylphenol in 800 g of methyl ethyl ketone. The oligomer compound had a number average molecular weight of 877, a weight average molecular weight of 1,183 and a hydroxyl group equivalent of 477.

(Introduction of Z-site)

An airtight reactor was charged with 50 g of the above oligomer compound, and 20 g of toluene and 1 g of potassium hydroxide as a catalyst were added to the reactor. The inside atmosphere of the reactor was substituted with a nitrogen gas. Then, the mixture was heated with stirring, and at the time when the inside temperature reached 70° C. 5.1 g of ethylene oxide was press-injected to the mixture. The resultant mixture was further heated up to 100° C. and an addition reaction was carried out at 100° C. for 4 hours. Further, the reaction mixture was aged for 1 hour. A reaction product was neutralized with hydrochloric acid and then washed with pure water. The solvent was evaporated under a reduced pressure, to obtain 49.2 g of a resin having Z-sites introduced therein. The above resin having Z-sites introduced therein had a number average molecular weight of 984, a weight average molecular weight of 1,297 and a hydroxyl group equivalent of 522.

(Synthesis of an Acrylate Compound)

A reactor equipped with a stirrer, a thermometer and a reflux tube was charged with 30 g of the above resin having z-sites introduced therein, 5.0 g of an acrylic acid, 30 g of toluene, 0.13 g of p-toluenesulfonic acid and 0.03 g of hydroquinone. The mixture was allowed to react under heat with refluxing. A generation water was quantified and collected with a water quantitative receiver. At the time when 1.0 g of the generation water was collected, the reaction mixture was cooled. The reaction temperature was 110 to 120° C. The reaction mixture was neutralized with 20% NaOH aqueous solution and then washed with 20% NaCl aqueous solution. The solvent was evaporated under a reduced pressure, to obtain 29.8 g of an acrylate compound. The acrylate compound had a number average molecular weight of 1,087 and a weight average molecular weight of 1,421. 10 g of the above acrylate compound was molten, degassed and molded at 150° C. and then cured at 200° C. for 6 hours, to obtain a cured product.

6 g of the above acrylate compound was dissolved in 4 g of carbitol acetate, and 0.6 g of Darocur 1173 (supplied by Ciba Specialty Chemicals, photopolymerization initiator) was added to the solution to obtain a resin composition. The resin composition was applied to a copper-clad laminate surface by a screen printing machine, and then dried with an air dryer at 80° C. for 60 minutes, to obtain a coating. A pattern film was placed on the coating, and the coating was exposed at 1,500 mJ with a UV irradiation device (supplied by EYE GRAPHICS Co., Ltd.: UB0151, light source: metal halide lamp). After the exposure, development was carried out with methyl ethyl ketone. In this case, only non-exposed portions were dissolved in the methyl ethyl ketone, to obtain a development pattern of a resin-cured product. A pencil mar strength (JIS K5400) of the resin-cured product was B.

Example 14

(Synthesis of Bifunctional PPE Oligomer Compound)

97.4 g of an oligomer compound was obtained in the same manner as in Example 12 except that, in the synthesis of bifunctional PPE oligomer compound in Example 12, the dropwise addition solution was replaced with a solution obtained by dissolving 45.4 g (0.16 mol) of a bivalent phenol 4,4'-methylidenebis(2,3,6-trimethylphenol) and 58.6 g (0.48 mol) of 2,6-dimethylphenol in 800 g of methyl ethyl ketone. The oligomer compound had a number average molecular weight of 852, a weight average molecular weight of 1,133 and a hydroxyl group equivalent of 460.

(Introduction of Z-site)

An airtight reactor was charged with 50 g of the above oligomer compound, and 20 g of toluene and 1 g of potassium hydroxide as a catalyst were added to the reactor. The inside atmosphere of the reactor was substituted with a nitrogen gas. Then, the mixture was heated with stirring, and at the time when the inside temperature reached 70° C. 5.3 g of ethylene oxide was press-injected to the mixture. The resultant mixture was further heated up to 100° C. and an addition reaction was carried out at 100° C. for 4 hours. Further, the reaction mixture was aged for 1 hour. A reaction product was neutralized with hydrochloric acid and then washed with pure water. The solvent was evaporated under a reduced pressure, to obtain 49.3 g of an oligomer compound having Z-sites introduced therein. The above oligomer compound had a number average molecular weight of 951, a weight average molecular weight of 1,241 and a hydroxyl group equivalent of 506.

(Synthesis of an Acrylate Compound)

A reactor equipped with a stirrer, a thermometer and a reflux tube was charged with 30 g of the above oligomer compound, 5.2 g of an acrylic acid, 30 g of toluene, 0.13 g of p-toluenesulfonic acid and 0.03 g of hydroquinone. The mixture was allowed to react under heat with refluxing. A generation water was quantified and collected with a water quantitative receiver. At the time when 1.1 g of the generation water was collected, the reaction mixture was cooled. The reaction temperature was 110 to 120° C. The reaction mixture was neutralized with 20% NaOH aqueous solution and then washed with 20% NaCl aqueous solution. The solvent was evaporated under a reduced pressure, to obtain 29.9 g of an acrylate compound. The acrylate compound had a number average molecular weight of 1,078 and a weight average molecular weight of 1,409. 10 g of the above acrylate compound was molten, degassed and molded at 150° C. and then cured at 200° C. for 6 hours, to obtain a cured product.

6 g of the above acrylate compound was dissolved in 4 g of carbitol acetate, and 0.6 g of Darocur 1173 (supplied by Ciba Specialty Chemicals, photopolymerization initiator) was added to the solution to obtain a resin composition. The resin composition was applied to a copper-clad laminate surface by a screen printing machine, and then dried with an air dryer at 80° C. for 60 minutes, to obtain a coating. A pattern film was placed on the coating, and the coating was exposed at 1,500 mJ with a UV irradiation device (supplied by EYE GRAPHICS Co., Ltd.: UB0151, light source: metal halide lamp). After the exposure, development was carried out with methyl ethyl ketone. In this case, only non-exposed portions were dissolved in the methyl ethyl ketone, to obtain a development pattern of a resin-cured product. A pencil mar strength (JIS K5400) of the resin-cured product was B.

Example 15

(Synthesis of Bifunctional PPE Oligomer Compound)

114.6 g of an oligomer compound was obtained in the same manner as in Example 12 except that, in the synthesis of bifunctional PPE oligomer compound in Example 12, the dropwise addition solution was replaced with a solution obtained by dissolving 68.8 g (0.16 mol) of a bivalent phenol 4,4'-[1,4-phenylenebis(1-methylethylidene)]bis(2,3,6-trimethylphenol) and 58.6 g (0.48 mol) of 2,6-dimethylphenol in 800 g of methyl ethyl ketone. The oligomer compound had a number average molecular weight of 934, a weight average molecular weight of 1,223 and a hydroxyl group equivalent of 496.

(Introduction of Z-site)

An airtight reactor was charged with 50 g of the above oligomer compound, and 25 g of toluene and 1 g of potassium hydroxide as a catalyst were added to the reactor. The inside atmosphere of the reactor was substituted with a nitrogen gas. Then, the mixture was heated with stirring, and at the time when the inside temperature reached 70° C. 6.4 g of propylene oxide was press-injected to the mixture. The resultant mixture was further heated up to 100° C. and an addition reaction was carried out at 100° C. for 4 hours. Further, the reaction mixture was aged for 1 hour. A reaction product was neutralized with hydrochloric acid and then washed with pure water. The solvent was evaporated under a reduced pressure, to obtain 50.3 g of an oligomer compound having Z-sites introduced therein. The above resin having Z-sites introduced therein had a number average molecular weight of 1,068, a weight average molecular weight of 1,391 and a hydroxyl group equivalent of 553.

(Synthesis of an Acrylate Compound)

A reactor equipped with a stirrer, a thermometer and a reflux tube was charged with 30 g of the above oligomer compound having z-sites introduced therein, 4.7 g of an acrylic acid, 30 g of toluene, 0.13 g of p-toluenesulfonic acid and 0.03 g of hydroquinone. The mixture was allowed to react under heat with refluxing. A generation water was quantified and collected with a water quantitative receiver. At the time when 1.0 g of the generation water was collected, the reaction mixture was cooled. The reaction temperature was 110 to 120° C. The reaction mixture was neutralized with 20% NaOH aqueous solution and then washed with 20% NaCl aqueous solution three times. The solvent was evaporated under a reduced pressure, to obtain 29.6 g of an acrylate compound. The acrylate compound had a number average molecular weight of 1,210 and a weight average molecular weight of 1,588. 10 g of the above acrylate compound was molten, degassed and molded at 150° C. and then cured at 200° C. for 6 hours, to obtain a cured product.

6 g of the above acrylate compound was dissolved in 4 g of carbitol acetate, and 0.6 g of Darocur 1173 (supplied by Ciba Specialty Chemicals, photopolymerization initiator) was added to the solution to obtain a resin composition. The resin composition was applied to a copper-clad laminate surface by a screen printing machine, and then dried with an air dryer at 80° C. for 60 minutes, to obtain a coating. A pattern film was placed on the coating, and the coating was exposed at 1,500 mJ with a UV irradiation device (supplied by EYE GRAPHICS Co., Ltd.: UB0151, light source: metal halide lamp). After the exposure, development was carried out with methyl ethyl ketone. In this case, only non-exposed portions were dissolved in the methyl ethyl ketone, to obtain a development pattern of a resin-cured product. A pencil mar strength (JIS K5400) of the resin-cured product was B.

Example 16

(Synthesis of Bifunctional PPE Oligomer Compound)

94.6 g of an oligomer compound was obtained in the same manner as in Example 12 except that, in the synthesis of bifunctional PPE oligomer compound in Example 12, the dropwise addition solution was replaced with a solution obtained by dissolving 41.0 g (0.16 mol) of a bivalent phenol 4,4'-methylenebis(2,6-dimethylphenol) and 58.6 g (0.48 mol) of 2,6-dimethylphenol in 800 g of methyl ethyl ketone. The oligomer compound had a number average molecular weight of 801, a weight average molecular weight of 1,081 and a hydroxyl group equivalent of 455.

(Introduction of Z-site)

An airtight reactor was charged with 50 g of the above oligomer compound, and 25 g of toluene and 1 g of potassium hydroxide as a catalyst were added to the reactor. The inside atmosphere of the reactor was substituted with a nitrogen gas. Then, the mixture was heated with stirring, and at the time when the inside temperature reached 70° C. 7.0 g of propylene oxide was press-injected to the mixture. The resultant mixture was further heated up to 100° C. and an addition reaction was carried out at 100° C. for 4 hours. Further, the reaction mixture was aged for 1 hour. A reaction product was neutralized with hydrochloric acid and then washed with pure water. The solvent was evaporated under a reduced pressure, to obtain 50.7 g of an oligomer compound having Z-sites introduced therein. The above resin having Z-sites introduced therein had a number average molecular weight of 935, a weight average molecular weight of 1,232 and a hydroxyl group equivalent of 510.

(Synthesis of an Acrylate Compound)

A reactor equipped with a stirrer, a thermometer and a reflux tube was charged with 30 g of the above oligomer compound having z-sites introduced therein, 5.1 g of an acrylic acid, 30 g of toluene, 0.13 g of p-toluenesulfonic acid and 0.03 g of hydroquinone. The mixture was allowed to react under heat with refluxing. A generation water was quantified and collected with a water quantitative receiver. At the time when 1.1 g of the generation water was collected, the reaction mixture was cooled. The reaction temperature was 110 to 120° C. The reaction mixture was neutralized with 20% NaOH aqueous solution and then washed with 20% NaCl aqueous solution. The solvent was evaporated under a reduced pressure, to obtain 29.8 g of an acrylate compound. The acrylate compound had a number average molecular weight of 1,048 and a weight average molecular weight of 1,408. 10 g of the above acrylate compound was molten, degassed and molded at 150° C. and then cured at 200° C. for 6 hours, to obtain a cured product.

6 g of the above acrylate compound was dissolved in 4 g of carbitol acetate, and 0.6 g of Darocur 1173 (supplied by Ciba Specialty Chemicals, photopolymerization initiator) was added to the solution to obtain a resin composition. The resin composition was applied to a copper-clad laminate surface by a screen printing machine, and then dried with an air dryer at 80° C. for 60 minutes, to obtain a coating. A pattern film was placed on the coating, and the coating was exposed at 1,500 mJ with a UV irradiation device (supplied by EYE GRAPHICS Co., Ltd.: UB0151, light source: metal halide lamp). After the exposure, development was carried out with methyl ethyl ketone. In this case, only non-exposed portions were dissolved in the methyl ethyl ketone, to obtain a development pattern of a resin-cured product. A pencil mar strength (JIS K5400) of the resin-cured product was B.

Comparative Example 9

10 g of bisphenol A ethylene oxide adduct diacrylate (LIGHT-ACRYLATE BP-4EA, suppllied by KYOEISHA CHEMICAL Co., LTD.) was degassed and molded at 100° C. and then cured at 200° C. for 6 hours, to obtain a cured product.

The cured products obtained in Examples 12-16 and Comparative Example 9 were evaluated for properties by the following methods.

Grass transition temperature (Tg): Obtained by a dynamic viscoelasticity measurement (DMA). Measurements were carried out at an oscillation frequency of 10 Hz.

Dielectric constant and dielectric loss tangent: Measured according to a cavity resonant oscillation method.

Table 6 shows the evaluation results of the physical properties.

TABLE 6

| | Ex. 12 Cured product | Ex. 13 Cured product | Ex. 14 Cured product | Ex. 15 Cured product | Ex. 16 Cured product | CEx. 9 Cured product |
|---|---|---|---|---|---|---|
| Tg (° C.) | 172 | 175 | 174 | 176 | 178 | 105 |
| dielectric constant (1 GHz) | 2.80 | 2.81 | 2.77 | 2.81 | 2.77 | 3.21 |
| dielectric loss tangent (1 GHz) | 0.0122 | 0.0117 | 0.0113 | 0.0125 | 0.0123 | 0.0301 |

Ex. = Example,
CEX = Comparative Example

Example 17

Synthesis of Bifunctional PPE Oligomer Compound

A longitudinally long reactor having a volume of 2 liters and equipped with a stirrer, a thermometer, an air-introducing tube and baffleplates was charged with 1.3 g (0.012 mol) of CuCl, 70.7 g (0.55 mol) of di-n-butylamine and 400 g of methyl ethyl ketone. The components were stirred at a reaction temperature of 40° C., and a solution obtained by dissolving 45.4 g (0.16 mol) of a bivalent phenol 4,4'-(1-methylethylidene)bis(2,6-dimethylphenol) and 58.6 g (0.48 mol) of 2,6-dimehtylphenol in 800 g of methyl ethyl ketone was dropwise added to the reactor over 120 minutes while carrying out bubbling with 2 L/min of air. After the completion of the addition, stirring was carried out for 60 minutes while continuing the bubbling with 2 L/min of air. A disodium dihydrogen ethylenediamine tetraacetate aqueous solution was added to the reaction solution to terminate the reaction. Then, washing was carried out with 1N hydrochloric acid aqueous solution and then washing was carried out with pure water. The thus-obtained solution was concentrated by an evaporator and then dried under reduced pressure, to obtain 98.8 g of an oligomer compound. The oligomer compound had a number average molecular weight of 845, a weight average molecular weight of 1,106 and a hydroxyl group equivalent of 451.

(Synthesis of Epoxy Compound)

A reactor equipped with a stirrer, a thermometer and a dropping funnel was heated up to 100° C. and charged with 49.6 g (hydroxyl group 0.11 mol) of the above oligomer compound and 292 g of epichlorohydrin. Then, a solution obtained by dissolving 8.6 g (0.13 mol) of sodium ethoxide in 30 g of ethanol was dropwise added from the dropping funnel over 60 minutes. After the completion of the addition, stirring was carried out for 5 hours. Then, washing was carried out with pure water, and further a filtration was carried out, to remove a generated salt and impurities. Excess epichlorohydrin was distilled off from the obtained solution, and drying under reduced pressure was carried out, to obtain 53.6 g of an epoxy compound. According to the IR analysis of the obtained epoxy compound, the absorption peak (3,600 cm−1) of a phenolic hydroxyl group disappeared, and according to the NMR analysis, a peak derived from glycidyl ether appeared so that it was confirmed that all functional groups were changed. The epoxy compound had a number average molecular weight of 998, a weight average molecular weight of 1,277 and an epoxy equivalent of 565.

(Synthesis of Epoxy Acrylate Compound)

A reactor equipped with a stirrer, a thermometer and a reflux tube was charged with 26 g of the above epoxy compound, 3.3 g of an acrylic acid, 20 g of carbitol acetate, 0.13 g of triphenylphosphine and 13 mg of hydroquinone methyl ether. The mixture was heated up to 120° C., and it was allowed to react with stirring. During the reaction, an acid value was measured, and the reaction was continued until the acid value became 2 mgKOH/g. The stirring time at 120° C. was 5 hours. The reaction solution was diluted with 40 g of methyl ethyl ketone. The diluted reaction solution was dropwise added to methanol to obtain a precipitate again. A solid was recovered by a filtration, and then drying under reduced pressure was carried out to obtain 26.4 g of an epoxy acrylate compound. The epoxy acrylate compound had a number average molecular weight of 1,388 and a weight average molecular weight of 1,679.

(Synthesis of Acid-modified Epoxy Acrylate Compound)

A reactor equipped with a stirrer, a thermometer and a reflux tube was charged with 11.3 g of the above epoxy acrylate compound, 7.4 g of carbitol acetate and 2.5 g of tetrahydrophthalic acid anhydride. The mixture was heated up to 80° C., and it was allowed to react with stirring. After 8 hours, according to IR measurement, a peak derived from the acid anhydride disappeared, and therefore the reaction was terminated to obtain an acid-modified epoxy acrylate compound. The acid value of the acid-modified epoxy acrylate compound was 71 mgKOH/g. The acid-modified epoxy acrylate compound had a number average molecular weight of 1,697 and a weight average molecular weight of 2,036.

10 g of the epoxy acrylate compound was molten, degassed and molded at 150° C. and then cured at 200° C. for 6 hours to obtain a cured product.

6 g of the epoxy acrylate compound was dissolved in 4 g of carbitol acetate, and 0.6 g of Darocur 1173 (supplied by Ciba Specialty Chemicals, photopolymerization initiator) was added to the solution to obtain a resin composition. The resin composition was applied to a copper-clad laminate surface with a screen printing machine and then dried with an air dryer at 80° C. for 30 minutes, to obtain a coating. A pattern film was placed on the coating, and the coating was exposed at 2,000 mJ with a UV irradiation device (supplied by EYE GRAPHICS Co., Ltd.: UB0151, light source: metal halide lamp). After the exposure, development was carried out with methyl ethyl ketone. In this case, only non-exposed portions were dissolved in the methyl ethyl ketone, to obtain a development pattern of a resin-cured product. A pencil mar strength (JIS K5400) of the resin-cured product was HB.

1 g of Darocur 1173 (supplied by Ciba Specialty Chemicals, photopolymerization initiator) was added to 10 g of the acid-modified epoxy acrylate compound to obtain a resin composition. The resin composition was applied to a copper-clad laminate surface with a screen printing machine and then dried with an air dryer at 80° C. for 30 minutes, to obtain a coating. A pattern film was placed on the coating, and the coating was exposed at 2,000 mJ with a UV irradiation device (supplied by EYE GRAPHICS Co., Ltd.: UB0151, light source: metal halide lamp). After the exposure, development was carried out with 1% sodium hydroxide aqueous solution. In this case, only non-exposed portions were dissolved in the sodium hydroxide aqueous solution, to obtain a development pattern of a resin-cured product. A pencil mar strength (JIS K5400) of the resin-cured product was HB.

Example 18

(Synthesis of Bifunctional PPE Oligomer Compound)

102.6 g of an oligomer compound was obtained in the same manner as in the synthesis of bifunctional PPE oligomer compound in Example 17, except that 45.4 g (0.16 mol) of the bivalent phenol 4,4'-(1-methylethylidene)bis(2,6-dimethylphenol) was replaced with 51.8 g (0.16 mol) of a bivalent phenol 4,4'-cyclohexylidenebis(2,6-dimehtylphenol). The oligomer compound had a number average molecular weight of 877, a weight average molecular weight of 1,183 and a hydroxyl group equivalent of 477.

(Synthesis of Epoxy Compound)

54.1 g of an epoxy compound was obtained in the same manner as in Example 17, except that 49.6 g (hydroxyl group 0.11 mol) of the oligomer compound used in the synthesis of epoxy compound in Example 17 was replaced with 52.5 g (hydroxyl group 0.11 mol) of the oligomer compound obtained above. According to the IR analysis of the obtained epoxy compound, the absorption peak (3,600 cm−1) of a phenolic hydroxyl group disappeared and, according to the NMR analysis, a peak derived from glycidyl ether appeared so that it was confirmed that all functional groups were changed. The epoxy compound had a number average molecular weight of 1,029, a weight average molecular weight of 1,301 and an epoxy equivalent of 576.

(Synthesis of Epoxy Acrylate Compound)

26.5 g of an epoxy acrylate compound was obtained in the same manner as in Example 17, except that 26 g of the epoxy compound used in the synthesis of epoxy acrylate compound in Example 17 was replaced with 26.5 g of the epoxy compound obtained above. The epoxy acrylate compound had a number average molecular weight of 1,411 and a weight average molecular weight of 1,721.

(Synthesis of Acid-modified Epoxy Acrylate Compound)

An acid-modified epoxy acrylate compound was obtained in the same manner as in Example 17, except that 11.3 g of the epoxy acrylate compound and 7.4 g of carbitol acetate used in the synthesis of acid-modified epoxy acrylate compound in Example 17 were replaced with 11.5 g of the epoxy acrylate compound obtained above and 7.5 g of carbitol acetate respectively. The acid value of the acid-modified epoxy acrylate compound was 69 mgKOH/g. The acid-modified epoxy acrylate compound had a number average molecular weight of 1,733 and a weight average molecular weight of 2,094.

10 g of the epoxy acrylate compound was molten, degassed and molded at 150° C. and then cured at 200° C. for 6 hours to obtain a cured product.

6 g of the epoxy acrylate compound was dissolved in 4 g of carbitol acetate, and 0.6 g of Darocur 1173 (supplied by Ciba Specialty Chemicals, photopolymerization initiator) was added to the solution to obtain a resin composition. The resin composition was applied to a copper-clad laminate surface with a screen printing machine and then dried with an air dryer at 80° C. for 30 minutes, to obtain a coating. A pattern film was placed on the coating, and the coating was exposed at 2,000 mJ with a UV irradiation device (supplied by EYE GRAPHICS Co., Ltd.: UB0151, light source: metal halide lamp). After the exposure, development was carried out with methyl ethyl ketone. In this case, only non-exposed portions were dissolved in the methyl ethyl ketone, to obtain a development pattern of a resin-cured product. A pencil mar strength (JIS K5400) of the resin-cured product was HB.

1 g of Darocur 1173 (supplied by Ciba Specialty Chemicals, photopolymerization initiator) was added to 10 g of the acid-modified epoxy acrylate compound to obtain a resin composition. The resin composition was applied to a copper-clad laminate surface with a screen printing machine and then dried with an air dryer at 80° C. for 30 minutes, to obtain a coating. A pattern film was placed on the coating, and the coating was exposed at 2,000 mJ with a UV irradiation device (supplied by EYE GRAPHICS Co., Ltd.: UB0151, light source: metal halide lamp). After the exposure, development was carried out with 1% sodium hydroxide aqueous solution. In this case, only non-exposed portions were dissolved in the sodium hydroxide aqueous solution, to obtain a development pattern of a resin-cured product. A pencil mar strength (JIS K5400) of the resin-cured product was HB.

Example 19

Synthesis of Bifunctional PPE Oligomer Compound

A longitudinally long reactor having a volume of 2 liters and equipped with a stirrer, a thermometer, an air-introducing tube and baffleplates was charged with 1.3 g (0.012 mol) of CuCl, 70.7 g (0.55 mol) of di-n-butylamine and 400 g of methyl ethyl ketone. The components were stirred at a reaction temperature of 40° C., and a solution obtained by dissolving 45.4 g (0.16 mol) of a bivalent phenol 4,4'-methylidenebis(2,3,6-trimethylphenol) and 58.6 g (0.48 mol) of 2,6-dimehtylphenol in 800 g of methyl ethyl ketone was dropwise added to the reactor over 120 minutes while carrying out bubbling with 2 L/min of air. After the completion of the addition, stirring was carried out for 60 minutes while continuing the bubbling with 2 L/min of air. A disodium dihydrogen ethylenediamine tetraacetate aqueous solution was added to the reaction solution to terminate the reaction. Then, washing was carried out with 1N hydrochloric acid aqueous solution and then washing was carried out with pure water. The thus-obtained solution was concentrated by an evaporator and then dried under reduced pressure, to obtain 97.4 g of an oligomer compound. The oligomer compound had a number average molecular weight of 852, a weight average molecular weight of 1,133 and a hydroxyl group equivalent of 460.

(Synthesis of Epoxy Compound)

A reactor equipped with a stirrer, a thermometer and a dropping funnel was heated up to 100° C. and charged with 50.6 g (hydroxyl group 0.11 mol) of the above oligomer compound and 292 g of epichlorohydrin. Then, a solution obtained by dissolving 8.6 g (0.13 mol) of sodium ethoxide in 30 g of ethanol was dropwise added from the dropping funnel over 60 minutes. After the completion of the addition, stirring was carried out for 5 hours. Then, washing was carried out with pure water, and further a filtration was carried out, to remove a generated salt and impurities. Excess epichlorohydrin was distilled off from the obtained solution, and drying under reduced pressure was carried out, to obtain 53.8 g of an epoxy compound. According to the IR analysis of the obtained epoxy compound, the absorption peak (3,600 cm−1) of a phenolic hydroxyl group disappeared, and according to the NMR analysis, a peak derived from glycidyl ether appeared so that it was confirmed that all functional groups were changed. The epoxy compound had a number average molecular weight of 1,005, a weight average molecular weight of 1,275 and an epoxy equivalent of 566.

(Synthesis of Epoxy Acrylate Compound)

A reactor equipped with a stirrer, a thermometer and a reflux tube was charged with 26 g of the above epoxy compound, 3.3 g of an acrylic acid, 20 g of carbitol acetate, 0.13 g of triphenylphosphine and 13 mg of hydroquinone methyl ether. The mixture was heated up to 120° C., and it was allowed to react with stirring. During the reaction, an acid value was measured, and the reaction was continued until the acid value became 2 mgKOH/g. The stirring time at 120° C. was 5 hours. The reaction solution was diluted with 40 g of methyl ethyl ketone. The diluted reaction solution was dropwise added to methanol to obtain a precipitate again. A solid was recovered by a filtration, and then drying under reduced pressure was carried out to obtain 26.7 g of an epoxy acrylate compound. The epoxy acrylate compound had a number average molecular weight of 1,395 and a weight average molecular weight of 1,687.

(Synthesis of Acid-modified Epoxy Acrylate Compound)

A reactor equipped with a stirrer, a thermometer and a reflux tube was charged with 11.4 g of the above epoxy acrylate compound, 7.5 g of carbitol acetate and 2.5 g of tetrahydrophthalic acid anhydride. The mixture was heated up to 80° C., and it was allowed to react with stirring. After 8 hours, according to IR measurement, a peak derived from the acid anhydride disappeared, and therefore the reaction was terminated to obtain an acid-modified epoxy acrylate compound. The acid value of the acid-modified epoxy acrylate compound was 68 mgKOH/g. The acid-modified epoxy acrylate compound had a number average molecular weight of 1,704 and a weight average molecular weight of 2,044.

10 g of the epoxy acrylate compound was molten, degassed and molded at 150° C. and then cured at 200° C. for 6 hours to obtain a cured product.

6 g of the epoxy acrylate compound was dissolved in 4 g of carbitol acetate, and 0.6 g of Darocur 1173 (supplied by Ciba Specialty Chemicals, photopolymerization initiator) was added to the solution to obtain a resin composition. The resin composition was applied to a copper-clad laminate surface with a screen printing machine and then dried with an air dryer at 80° C. for 30 minutes, to obtain a coating. A pattern film was placed on the coating, and the coating was exposed at 2,000 mJ with a UV irradiation device (supplied by EYE GRAPHICS Co., Ltd.: UB0151, light source: metal halide lamp). After the exposure, development was carried out with methyl ethyl ketone. In this case, only non-exposed portions were dissolved in the methyl ethyl ketone, to obtain a development pattern of a resin-cured product. A pencil mar strength (JIS K5400) of the resin-cured product was HB.

1 g of Darocur 1173 (supplied by Ciba Specialty Chemicals, photopolymerization initiator) was added to 10 g of the acid-modified epoxy acrylate compound to obtain a resin composition. The resin composition was applied to a copper-clad laminate surface with a screen printing machine and then dried with an air dryer at 80° C. for 30 minutes, to obtain a coating. A pattern film was placed on the coating, and the coating was exposed at 2,000 mJ with a UV irradiation device (supplied by EYE GRAPHICS Co., Ltd.: UB0151, light source: metal halide lamp). After the exposure, development was carried out with 1% sodium hydroxide aqueous solution. In this case, only non-exposed portions were dissolved in the sodium hydroxide aqueous solution, to obtain a development pattern of a resin-cured product. A pencil mar strength (JIS K5400) of the resin-cured product was HB.

Example 20

(Synthesis of Bifunctional PPE Oligomer Compound)

A longitudinally long reactor having a volume of 2 liters and equipped with a stirrer, a thermometer, an air-introducing tube and baffleplates was charged with 1.3 g (0.012 mol) of CuCl, 70.7 g (0.55 mol) of di-n-butylamine and 400 g of methyl ethyl ketone. The components were stirred at a reaction temperature of 40° C., and a solution obtained by dissolving 68.8 g (0.16 mol) of a bivalent phenol 4,4'-[1,4-phenylenebis(1-methylethylidene)]bis(2,3,6-trimethylphenol) and 58.6 g (0.48 mol) of 2,6-dimehtylphenol in 800 g of methyl ethyl ketone was dropwise added to the reactor over 120 minutes while carrying out bubbling with 2 L/min of air. After the completion of the addition, stirring was carried out for 60 minutes while continuing the bubbling with 2 L/min of air. A disodium dihydrogen ethylenediamine tetraacetate aqueous solution was added to the reaction solution to terminate the reaction. Then, washing was carried out with 1N hydrochloric acid aqueous solution and, then washing was carried out with pure water. The thus-obtained solution was concentrated by an evaporator and then dried under reduced pressure, to obtain 114.6 g of an oligomer compound. The oligomer compound had a number average molecular weight of 934, a weight average molecular weight of 1,223 and a hydroxyl group equivalent of 496.

(Synthesis of Epoxy Compound)

A reactor equipped with a stirrer, a thermometer and a dropping funnel was heated up to 100° C. and charged with 54.6 g (hydroxyl group 0.11 mol) of the above oligomer compound and 292 g of epichlorohydrin. Then, a solution obtained by dissolving 8.6 g (0.13 mol) of sodium ethoxide in 30 g of ethanol was dropwise added from the dropping funnel over 60 minutes. After the completion of the addition, stirring was carried out for 5 hours. Then, washing was carried out with pure water, and further a filtration was carried out, to remove a generated salt and impurities. Excess epichlorohydrin was distilled off from the obtained solution, and drying under reduced pressure was carried out, to obtain 56.9 g of an epoxy compound. According to the IR analysis of the obtained epoxy compound, the absorption peak (3,600 cm−1) of a phenolic hydroxyl group disappeared, and according to the NMR analysis, a peak derived from glycidyl ether appeared so that it was confirmed that all functional groups were changed. The epoxy compound had a number average molecular weight of 1,092, a weight average molecular weight of 1,408 and an epoxy equivalent of 612.

(Synthesis of Epoxy Acrylate Compound)

A reactor equipped with a stirrer, a thermometer and a reflux tube was charged with 28.1 g of the above epoxy compound, 3.3 g of an acrylic acid, 20 g of carbitol acetate, 0.13 g of triphenylphosphine and 13 mg of hydroquinone methyl ether. The mixture was heated up to 120° C., and it was allowed to react with stirring. During the reaction, an acid value was measured, and the reaction was continued until the acid value became 2 mgKOH/g. The stirring time at 120° C. was 5 hours. The reaction solution was diluted with 40 g of methyl ethyl ketone. The diluted reaction solution was dropwise added to methanol to obtain a precipitate again. A solid was recovered by a filtration and then drying under reduced pressure was carried out to obtain 28.3 g of an epoxy acrylate compound. The epoxy acrylate compound had a number average molecular weight of 1,497 and a weight average molecular weight of 1,841.

(Synthesis of Acid-modified Epoxy Acrylate Compound)

A reactor equipped with a stirrer, a thermometer and a reflux tube was charged with 12.1 g of the above epoxy acrylate compound, 7.9 g of carbitol acetate and 2.5 g of tetrahydrophthalic acid anhydride. The mixture was heated up to 80° C., and it was allowed to react with stirring. After 8 hours, according to IR measurement, a peak derived from the acid anhydride disappeared, and therefore the reaction was terminated to obtain an acid-modified epoxy acrylate compound. The acid value of the acid-modified epoxy acrylate compound was 65 mgKOH/g. The acid-modified epoxy acrylate compound had a number average molecular weight of 1,810 and a weight average molecular weight of 2,225.

10 g of the epoxy acrylate compound was molten, degassed and molded at 150° C. and then cured at 200° C. for 6 hours to obtain a cured product.

6 g of the epoxy acrylate compound was dissolved in 4 g of carbitol acetate, and 0.6 g of Darocur 1173 (supplied by Ciba Specialty Chemicals, photopolymerization initiator) was added to the solution to obtain a resin composition. The resin composition was applied to a copper-clad laminate surface with a screen printing machine and then dried with an air dryer at 80° C. for 30 minutes, to obtain a coating. A pattern film was placed on the coating, and the coating was exposed at 2,000 mJ with a UV irradiation device (supplied by EYE GRAPHICS Co., Ltd.: UB0151, light source: metal halide lamp). After the exposure, development was carried out with methyl ethyl ketone. In this case, only non-exposed portions were dissolved in the methyl ethyl ketone, to obtain a development pattern of a resin-cured product. A pencil mar strength (JIS K5400) of the resin-cured product was HB.

1 g of Darocur 1173 (supplied by Ciba Specialty Chemicals, photopolymerization initiator) was added to 10 g of the acid-modified epoxy acrylate compound to obtain a resin composition. The resin composition was applied to a copper-clad laminate surface with a screen printing machine and then dried with an air dryer at 80° C. for 30 minutes, to obtain a coating. A pattern film was placed on the coating, and the coating was exposed at 2,000 mJ with a UV irradiation device (supplied by EYE GRAPHICS Co., Ltd.: UB0151, light source: metal halide lamp). After the exposure, development was carried out with 1% sodium hydroxide aqueous solution. In this case, only non-exposed portions were dissolved in the sodium hydroxide aqueous solution, to obtain a development pattern of a resin-cured product. A pencil mar strength (JIS K5400) of the resin-cured product was HB.

Example 21

(Synthesis of Bifunctional PPE Oligomer Compound)

A longitudinally long reactor having a volume of 2 liters and equipped with a stirrer, a thermometer, an air-introducing tube and baffleplates was charged with 1.3 g (0.012 mol) of CuCl, 70.7 g (0.55 mol) of di-n-butylamine and 400 g of methyl ethyl ketone. The components were stirred at a reaction temperature of 40° C., and a solution obtained by dissolving 41.0 g (0.16 mol) of a bivalent phenol 4,4'-methylenebis(2,6-dimethylphenol) and 58.6 g (0.48 mol) of 2,6-dimehtylphenol in 800 g of methyl ethyl ketone was dropwise added to the reactor over 120 minutes while carrying out bubbling with 2 L/min of air. After the completion of the addition, stirring was carried out for 60 minutes while continuing the bubbling with 2 L/min of air. A disodium dihydrogen ethylenediamine tetraacetate aqueous solution was added to the reaction solution to terminate the reaction. Then, washing was carried out with 1N hydrochloric acid aqueous solution and then washing was carried out with pure water. The thus-obtained solution was concentrated by an evaporator and then dried under reduced pressure, to obtain 94.6 g of an oligomer compound. The oligomer compound had a number average molecular weight of 801, a weight average molecular weight of 1,081 and a hydroxyl group equivalent of 455.

(Synthesis of Epoxy Compound)

A reactor equipped with a stirrer, a thermometer and a dropping funnel was heated up to 100° C. and charged with 50.1 g (hydroxyl group 0.11 mol) of the above oligomer compound and 292 g of epichlorohydrin. Then, a solution obtained by dissolving 8.6 g (0.13 mol) of sodium ethoxide in 30 g of ethanol was dropwise added from the dropping funnel over 60 minutes. After the completion of the addition, stirring was carried out for 5 hours. Then, washing was carried out with pure water, and further a filtration was carried out, to remove a generated salt and impurities. Excess epichlorohydrin was distilled off from the obtained solution, and drying under reduced pressure was carried out, to obtain 50.2 g of an epoxy compound. According to the IR analysis of the obtained epoxy compound, the absorption peak (3,600 cm–1) of a phenolic hydroxyl group disappeared, and according to the NMR analysis, a peak derived from glycidyl ether appeared so that it was confirmed that all functional groups were changed. The epoxy compound had a number average molecular weight of 956, a weight average molecular weight of 1,204 and an epoxy equivalent of 545.

(Synthesis of Epoxy Acrylate Compound)

A reactor equipped with a stirrer, a thermometer and a reflux tube was charged with 25.1 g of the above epoxy compound, 3.3 g of an acrylic acid, 20 g of carbitol acetate, 0.13 g of triphenylphosphine and 13 mg of hydroquinone methyl ether. The mixture was heated up to 120° C., and it was allowed to react with stirring. During the reaction, an acid value was measured, and the reaction was continued until the acid value became 2 mgKOH/g. The stirring time at 120° C. was 5 hours. The reaction solution was diluted with 40 g of methyl ethyl ketone. The diluted reaction solution was dropwise added to methanol to obtain a precipitate again. A solid was recovered by a filtration, and then drying under reduced pressure was carried out to obtain 25.4 g of an epoxy acrylate compound. The epoxy acrylate compound had a number average molecular weight of 1,359 and a weight average molecular weight of 1,657.

(Synthesis of Acid-modified Epoxy Acrylate Compound)

A reactor equipped with a stirrer, a thermometer and a reflux tube was charged with 11.0 g of the above epoxy acrylate compound, 7.3 g of carbitol acetate and 2.5 g of tetrahydrophthalic acid anhydride. The mixture was heated up to 80° C., and it was allowed to react with stirring. After 8 hours, according to IR measurement, a peak derived from the acid anhydride disappeared, and therefore the reaction was terminated to obtain an acid-modified epoxy acrylate compound. The acid value of the acid-modified epoxy acrylate compound was 71 mgKOH/g. The acid-modified epoxy acrylate compound had a number average molecular weight of 1, 681 and a weight average molecular weight of 2,101.

10 g of the epoxy acrylate compound was molten, degassed and molded at 150° C. and then cured at 200° C. for 6 hours to obtain a cured product.

6 g of the epoxy acrylate compound was dissolved in 4 g of carbitol acetate, and 0.6 g of Darocur 1173 (supplied by Ciba Specialty Chemicals, photopolymerization initiator) was added to the solution to obtain a resin composition. The resin composition was applied to a copper-clad laminate surface with a screen printing machine and then dried with an air dryer at 80° C. for 30 minutes, to obtain a coating. A pattern film was placed on the coating, and the coating was exposed at 2,000 mJ with a UV irradiation device (supplied by EYE GRAPHICS Co., Ltd.: UB0151, light source: metal halide lamp). After the exposure, development was carried out with methyl ethyl ketone. In this case, only non-exposed portions were dissolved in the methyl ethyl ketone, to obtain a development pattern of a resin-cured product. A pencil mar strength (JIS K5400) of the resin-cured product was HB.

1 g of Darocur 1173 (supplied by Ciba Specialty Chemicals, photopolymerization initiator) was added to 10 g of the acid-modified epoxy acrylate compound to obtain a resin composition. The resin composition was applied to a copper-clad laminate surface with a screen printing machine and then dried with an air dryer at 80° C. for 30 minutes, to obtain a coating. A pattern film was placed on the coating, and the coating was exposed at 2,000 mJ with a UV irradiation device (supplied by EYE GRAPHICS Co., Ltd.: UB0151, light source: metal halide lamp). After the exposure, development was carried out with 1% sodium hydroxide aqueous solution. In this case, only non-exposed portions were dissolved in the sodium hydroxide aqueous solution, to obtain a development pattern of a resin-cured product. A pencil mar strength (JIS K5400) of the resin-cured product was HB.

Comparative Example 10

38 g of tetramethylbisphenoldiglycidyl ether (YX4000: supplied by Japan Epoxy Resins Co., Ltd: epoxy equivalent 190) and 14.4 g of acrylic acid were dissolved at 60° C. Then, 0.19 g of triphenylphosphine and 19 mg of hydroquinone methyl ether were added to the mixture. The resultant mixture was heated up to 100° C., and the mixture was stirred for 10 hours. During the reaction, an acid value was measured. After the acid value became 2 mgKOH/g, the mixture was cooled down to 60° C. to obtain a resin. The resin was a viscous liquid at 60° C.

Comparative Example 11

10 g of the same resin as that obtained in Comparative Example 10 was molten, degassed and molded at 120° C. and then cured at 200° C. for 6 hours to obtain a cured product.

Comparative Example 12

10 g of bisphenol A type epoxy acrylate (SP1509, supplied by SHOWA HIGHPOLYMER CO., LTD) was degassed and molded at 120° C. and then cured at 200° C. for 6 hours to obtain a cured product.

Comparative Example 13

10 g of novolak type epoxy acrylate (SP4010, supplied by SHOWA HIGHPOLYMER CO., LTD) was degassed and molded at 120° C. and then cured at 200° C. for 6 hours to obtain a cured product.

The cured products obtained in Examples 17-21 and Comparative Example 11-13 were evaluated for properties by the following methods.

Glass transition temperature (Tg): Obtained by dynamic viscoelasticity measurement (DMA). Measurements were carried out at an oscillation frequency of 10 Hz.

Dielectric constant and dielectric loss tangent: Obtained according to a cavity resonant oscillation method.

Table 7 shows the evaluation results of the above properties.

tetraacetate aqueous solution was added to the reaction solution to terminate the reaction. Then, washing was carried out with 1N hydrochloric acid aqueous solution and then washing was carried out with pure water. The thus-obtained solution was concentrated by an evaporator and then dried under reduced pressure, to obtain 120.2 g of an oligomer compound. The oligomer compound had a number average molecular weight of 1,100, a weight average molecular weight of 1,530 and a hydroxyl group equivalent of 545.

(Production Process of Cyanate Compound)

A reactor equipped with a stirrer, a thermometer and a dropping funnel was cooled down to −10° C. 200 ml of a methylene chloride solution containing cyanogen chloride (0.144 mol) was placed in the reactor. Then, a solution obtained by dissolving 52.8 g (hydroxyl group 0.096 mol) of the above oligomer compound and 14.6 g (0.144 mol) of triethylamine in 250 g of methyl ethyl ketone, was dropwise added from the dropping funnel over 60 minutes so as to maintain the temperature of the reaction solution at 10° C. or less. After the completion of the addition, stirring was carried out for 60 minutes. Then, washing was carried out with 0.1N hydrochloric acid aqueous solution, then washing was carried out with pure water, and further a filtration was carried out, to remove a generated salt and impurities. The methylene chloride and the methyl ethyl ketone were evaporated from the obtained solution and drying under reduced pressure was carried out, to obtain 53.3 g of a cyanate compound. According to the IR analysis of the obtained cyanate compound, the absorption peak (3,600 cm−1) of a phenolic hydroxyl group disappeared and the absorption

TABLE 7

|  | Ex. 17 Cured product | Ex. 18 Cured product | Ex. 19 Cured product | Ex. 20 Cured product | Ex. 21 Cured product | CEx. 11 Cured product | CEx. 12 Cured product | CEx. 13 Cured product |
|---|---|---|---|---|---|---|---|---|
| Tg (° C.) | 182 | 185 | 185 | 188 | 191 | 165 | 140 | 142 |
| dielectric constant (1 GHz) | 2.81 | 2.83 | 2.79 | 2.82 | 2.77 | 3.12 | 3.31 | 3.10 |
| dielectric loss tangent (1 GHz) | 0.025 | 0.022 | 0.021 | 0.021 | 0.023 | 0.036 | 0.052 | 0.032 |

Ex. = Example,
CEX = Comparative Example

Example 22

(Production Process of Bifunctional PPE Oligomer Compound)

A longitudinally long reactor having a volume of 2 liters and equipped with a stirrer, a thermometer, an air-introducing tube and baffleplates was charged with 1.3 g (0.013 mol) of CuCl, 79.5 g (0.62 mol) of di-n-butylamine and 400 g of toluene. The components were stirred at a reaction temperature of 40° C. A mixed solution (bivalent phenol of the formula (7):monovalent phenol of the formula (8) in a molar ratio=1:4) obtained by dissolving 48.6 g (0.15 mol) of a bivalent phenol 4,4'-cyclohexylidenebis(2,6-dimehtylphenol) and 73.3 g (0.60 mol) of 2,6-dimehtylphenol in 400 g of methyl ethyl ketone was dropwise added to the reactor over 120 minutes while carrying out bubbling with 2 L/min of air. After the completion of the addition, stirring was carried out for 60 minutes while continuing the bubbling with 2 L/min of air. A disodium dihydrogen ethylenediamine peak (2,250 cm−1) derived from a cyanate group appeared so that it was confirmed that all functional groups were changed.

0.1 part of tin octylate was added to 100 parts of the thus-obtained cyanate compound. The mixture was molten, degassed and molded at 160° C. and then cured at 230° C. for 3 hours, to obtain a cured product. The cured product had a glass transition temperature of 237° C. according to the measurement of dynamic viscoelasticity (DMA). Further, its dielectric constant at 1 GHz was 2.70 and its dielectric loss tangent was 0.0068.

Example 23

(Production Process of Bifunctional PPE Oligomer Compound)

122.5 g of an oligomer compound was obtained in the same manner as in Example 22, except that the mixed solution used in the synthesis of bifunctional PPE oligomer compound in Example 22 was replaced with a mixed solution (bivalent phenol of the formula (7):monovalent phenols of the formula (8) in a molar ratio=1:4) obtained by dissolving 48.6 g (0.15 mol) of a bivalent phenol 4,4'-cyclohexylidenebis(2,6-dimehtylphenol), 55.0 g (0.45 mol) of 2,6-dimehtylphenol and 20.4 g (0.15 mol) of 2,3,6-trimethylphenol in 400 g of methyl ethyl ketone and 400 g of tetrahydrofuran. The oligomer compound had a number average molecular weight of 1,080, a weight average molecular weight of 1,520 and a hydroxyl group equivalent of 545.

(Production Process of Cyanate Compound)

53.5 g of a cyanate compound was obtained in the same manner as in Example 22, except that the oligomer-compound-dissolved solution used in the production process of cyanate compound in Example 22 was replaced with a solution obtained by dissolving 52.3 g (hydroxyl group 0.096 mol) of the above oligomer compound and 14.6 g (0.144 mol) of triethylamine in 250 g of methyl ethyl ketone. According to the IR analysis of the obtained cyanate compound, the absorption peak (3,600 cm−1) of a phenolic hydroxyl group disappeared and the absorption peak (2,250 cm−1) derived from a cyanate group appeared so that it was confirmed that all functional groups were changed.

0.1 part of tin octylate was added to 100 parts of the thus-obtained cyanate compound. The mixture was molten, degassed and molded at 160° C. and then cured at 230° C. for 3 hours, to obtain a cured product. The cured product had a glass transition temperature of 243° C. according to the measurement of dynamic viscoelasticity (DMA). Further, its dielectric constant at 1 GHz was 2.69 and its dielectric loss tangent was 0.0055.

Example 24

(Production Process of Bifunctional PPE Oligomer Compound)

118.2 g of an oligomer compound was obtained in the same manner as in Example 22, except that the mixed solution used in the synthesis of bifunctional PPE oligomer compound in Example 22 was replaced with a mixed solution (bivalent phenol of the formula (7):monovalent phenols of the formula (8) in a molar ratio=1:4) obtained by dissolving 46.5 g (0.15 mol) of a bivalent phenol 4,4'-cyclopentylidenebis(2,6-dimehtylphenol) and 73.3 g (0.60 mol) of 2,6-dimehtylphenol in 400 g of methyl ethyl ketone and 400 g of tetrahydrofuran. The oligomer compound had a number average molecular weight of 1,070, a weight average molecular weight of 1,500 and a hydroxyl group equivalent of 540.

(Production Process of Cyanate Compound)

52.2 g of a cyanate compound was obtained in the same manner as in Example 22, except that the oligomer-compound-dissolved solution used in the production process of cyanate compound in Example 22 was replaced with a solution obtained by dissolving 51.8 g (hydroxyl group 0.096 mol) of the above oligomer compound and 14.6 g (0.144 mol) of triethylamine in 250 g of methyl ethyl ketone. According to the IR analysis of the obtained cyanate compound, the absorption peak (3,600 cm−1) of a phenolic hydroxyl group disappeared and the absorption peak (2,250 cm−1) derived from a cyanate group appeared so that it was confirmed that all functional groups were changed.

0.1 part of tin octylate was added to 100 parts of the thus-obtained cyanate compound. The mixture was molten, degassed and molded at 160° C. and then cured at 230° C. for 3 hours, to obtain a cured product. The cured product had a glass transition temperature of 236° C. according to the measurement of dynamic viscoelasticity (DMA). Further, its dielectric constant at 1 GHz was 2.73 and its dielectric loss tangent was 0.0062.

Example 25

(Production Process of Bifunctional PPE Oligomer Compound)

135.3 g of an oligomer compound was obtained in the same manner as in the production process of bifunctional PPE oligomer compound in Example 22, except that 2.7 g (0.012 mol) of $CuBr_2$, 70.7 g (0.55 mol) of di-n-butylamine and 600 g of methyl ethyl ketone were placed in the same reactor as that used in Example 22 and stirred at a reaction temperature of 40° C. and that a mixed solution (bivalent phenol of the formula (7):monovalent phenol of the formula (8) in a molar ratio=1:2) obtained by dissolving 85.3 g (0.21 mol) of a bivalent phenol 4,4'-(9H-fluorene-9-ylidene)bis(2,6-dimehtylphenol) and 51.3 g (0.41 mol) of 2,6-dimehtylphenol in 600 g of methyl ethyl ketone and 400 g of tetrahydrofuran was bubbled with 2 L/min of air. The oligomer compound had a number average molecular weight of 650, a weight average molecular weight of 810 and a hydroxyl group equivalent of 320.

(Production Process of Cyanate Compound)

31.2 g of a cyanate compound was obtained in the same manner as in Example 22, except that the oligomer-compound-dissolved solution used in the production process of cyanate compound in Example 22 was replaced with a solution obtained by dissolving 30.7 g (hydroxyl group 0.096 mol) of the above oligomer compound and 14.6 g (0.144 mol) of triethylamine in 250 g of methyl ethyl ketone. According to the IR analysis of the obtained cyanate compound, the absorption peak (3,600 cm−1) of a phenolic hydroxyl group disappeared and the absorption peak (2,250 cm−1) derived from a cyanate group appeared so that it was confirmed that all functional groups were changed.

0.1 part of tin octylate was added to 100 parts of the thus-obtained cyanate compound. The mixture was molten, degassed and molded at 160° C. and then cured at 230° C. for 3 hours, to obtain a cured product. The cured product had a glass transition temperature of 273° C. according to the measurement of dynamic viscoelasticity (DMA). Further, its dielectric constant at 1 GHz was 2.74 and its dielectric loss tangent was 0.0068.

Comparative Example 14

(Production Process of Bifunctional PPE Oligomer Compound)

113.1 g of an oligomer compound was obtained in the same manner as in Example 22, except that the mixed solution used in the synthesis of bifunctional PPE oligomer compound in Example 22 was replaced with a mixed solution (bivalent phenol of the formula (7):monovalent phenol of the formula (8) in a molar ratio=1:4) obtained by dissolving 42.6 g (0.15 mol) of a bivalent phenol 4,4'-(1-methylethylidene)bis(2,6-dimehtylphenol) and 73.3 g (0.60 mol) of 2,6-dimehtylphenol in 400 g of methyl ethyl ketone. The oligomer compound had a number average molecular weight of 1,030, a weight average molecular weight of 1,460 and a hydroxyl group equivalent of 540.

(Production Process of Cyanate Compound)

53.2 g of a cyanate compound was obtained in the same manner as in Example 22, except that the oligomer-compound-dissolved solution used in the production process of cyanate compound in Example 22 was replaced with a solution obtained by dissolving 51.8 g (hydroxyl group 0.096 mol) of the above oligomer compound and 14.6 g (0.144 mol) of triethylamine in 250 g of methyl ethyl ketone. According to the IR analysis of the obtained cyanate compound, the absorption peak (3,600 cm−1) of a phenolic hydroxyl group disappeared and the absorption peak (2,250 cm−1) derived from a cyanate group appeared so that it was confirmed that all functional groups were changed.

0.1 part of tin octylate was added to 100 parts of the thus-obtained cyanate compound. The mixture was molten, degassed and molded at 160° C. and then cured at 230° C. for 3 hours, to obtain a cured product. The cured product had a glass transition temperature of 228° C. according to the measurement of dynamic viscoelasticity (DMA). Further, its dielectric constant at 1 GHz was 2.83 and its dielectric loss tangent was 0.0079.

Table 8 shows the above results.

TABLE 8

|  | Ex. 22 | Ex. 23 | Ex. 24 | Ex. 25 | CEx. 14 |
|---|---|---|---|---|---|
| dielectric constant (1 GHz) | 2.7 | 2.69 | 2.73 | 2.74 | 2.83 |
| dielectric loss tangent (1 GHz) | 0.0068 | 0.0055 | 0.0062 | 0.0068 | 0.0079 |
| Tg (DMA)/ (° C.) | 237 | 243 | 236 | 273 | 228 |

Ex. = Example,
CEX = Comparative Example

Example 26

(Production Process of Bifunctional PPE Oligomer Compound)

113.2 g of an oligomer compound was obtained in the same manner as in Example 22, except that the mixed solution used in the synthesis of bifunctional PPE oligomer compound in Example 22 was replaced with a mixed solution (bivalent phenol of the formula (7):monovalent phenol of the formula (8) in a molar ratio=1:4) obtained by dissolving 42.6 g (0.15 mol) of a bivalent phenol 4,4'-methylenebis[2,3,6-trimehtylphenol] and 73.3 g (0.60 mol) of 2,6-dimehtylphenol in 400 g of methyl ethyl ketone and 400 g of tetrahydrofuran. The oligomer compound had a number average molecular weight of 1,050, a weight average molecular weight of 1,490 and a hydroxyl group equivalent of 550.

(Production Process of Cyanate Compound)

53.0 g of a cyanate compound was obtained in the same manner as in Example 22, except that the dissolved solution used in Example 22 was replaced with a solution obtained by dissolving 52.8 g (hydroxyl group 0.096 mol) of the above oligomer compound and 14.6 g (0.144 mol) of triethylamine in 250 g of methyl ethyl ketone. According to the IR analysis of the obtained cyanate compound, the absorption peak (3,600 cm−1) of a phenolic hydroxyl group disappeared and the absorption peak (2,250 cm−1) derived from a cyanate group appeared so that it was confirmed that all functional groups were changed.

0.1 part of tin octylate was added to 100 parts of the thus-obtained cyanate compound. The mixture was molten, degassed and molded at 160° C. and then cured at 230° C. for 3 hours, to obtain a cured product. The cured product had a glass transition temperature of 235° C. according to the measurement of dynamic viscoelasticity (DMA). Further, its dielectric constant at 1 GHz was 2.72 and its dielectric loss tangent was 0.0063.

Example 27

(Production Process of Bifunctional PPE Oligomer Compound)

116.5 g of an oligomer compound was obtained in the same manner as in Example 22, except that the mixed solution used in the synthesis of bifunctional PPE oligomer compound in Example 22 was replaced with a mixed solution (bivalent phenol of the formula (7):monovalent phenols of the formula (8) in a molar ratio=1:4) obtained by dissolving 42.6 g (0.15 mol) of a bivalent phenol 4,4'-methylenebis[2,3,6-trimehtylphenol], 55.0 g (0.45 mol) of 2,6-dimehtylphenol and 20.4 g (0.15 mol) of 2,3,6-trimethylphenol in 400 g of methyl ethyl ketone and 400 g of tetrahydrofuran. The oligomer compound had a number average molecular weight of 1,020, a weight average molecular weight of 1,450 and a hydroxyl group equivalent of 540.

(Production Process of Cyanate Compound)

53.3 g of a cyanate compound was obtained in the same manner as in Example 22, except that the dissolved solution used in the production process of cyanate compound in Example 22 was replaced with a solution obtained by dissolving 51.8 g (hydroxyl group 0.096 mol) of the above oligomer compound and 14.6 g (0.144 mol) of triethylamine in 250 g of methyl ethyl ketone. According to the IR analysis of the obtained cyanate compound, the absorption peak (3,600 cm−1) of a phenolic hydroxyl group disappeared and the absorption peak (2,250 cm−1) derived from a cyanate group appeared so that it was confirmed that all functional groups were changed.

0.1 part of tin octylate was added to 100 parts of the thus-obtained cyanate compound. The mixture was molten, degassed and molded at 160° C. and then cured at 230° C. for 3 hours, to obtain a cured product. The cured product had a glass transition temperature of 245° C. according to the measurement of dynamic viscoelasticity (DMA). Further, its dielectric constant at 1 GHz was 2.70 and its dielectric loss tangent was 0.0055.

Example 28

(Production Process of Bifunctional PPE Oligomer Compound)

128.2 g of an oligomer compound was obtained in the same manner as in Example 22, except that the mixed solution used in the synthesis of bifunctional PPE oligomer compound in Example 22 was replaced with a mixed solution (bivalent phenol of the formula (7):monovalent phenol of the formula (8) in a molar ratio=1:4) obtained by dissolving 56.1 g (0.15 mol) of a bivalent phenol 4,4'-(1,4-phenylenebismethylene)bis(2,3,6-trimethylphenol) and 73.3 g (0.60 mol) of 2,6-dimehtylphenol in 400 g of methyl ethyl ketone. The oligomer compound had a number average molecular weight of 1,120, a weight average molecular weight of 1,580 and a hydroxyl group equivalent of 560.

(Production Process of Cyanate Compound)

54.2 g of a cyanate compound was obtained in the same manner as in Example 22, except that the dissolved solution used in the production process of cyanate compound in Example 22 was replaced with a solution obtained by dissolving 53.8 g (hydroxyl group 0.096 mol) of the above oligomer compound and 14.6 g (0.144 mol) of triethylamine in 250 g of methyl ethyl ketone. According to the IR analysis of the obtained cyanate compound, the absorption peak (3,600 cm−1) of a phenolic hydroxyl group disappeared and the absorption peak (2,250 cm−1) derived from a cyanate group appeared so that it was confirmed that all functional groups were changed.

0.1 part of tin octylate was added to 100 parts of the thus-obtained cyanate compound. The mixture was molten, degassed and molded at 160° C. and then cured at 230° C. for 3 hours, to obtain a cured product. The cured product had a glass transition temperature of 241° C. according to the measurement of dynamic viscoelasticity (DMA). Further, its dielectric constant at 1 GHz was 2.72 and its dielectric loss tangent was 0.0065.

Example 29

(Production Process of Bifunctional PPE Oligomer Compound)

114.8 g of an oligomer compound was obtained in the same manner as in Example 22, except that the mixed solution used in the synthesis of bifunctional PPE oligomer compound in Example 22 was replaced with a mixed solution (bivalent phenol of the formula (7):monovalent phenol of the formula (8) in a molar ratio=1:8) obtained by dissolving 33.1 g (0.077 mol) of a bivalent phenol 4,4-[1,4-phenylenebis(1-methylethylidene)]bis(2,3,6-trimethylphenol) and 75.6 g (0.62 mol) of 2,6-dimethylphenol and 20.4 g (0.15 mol) of 2,3,6-trimethylphenol in 600 g of methanol. The oligomer compound had a number average molecular weight of 1,600, a weight average molecular weight of 2,280 and a hydroxyl group equivalent of 780.

(Production Process of Cyanate Compound)

75.3 g of a cyanate compound was obtained in the same manner as in Example 22, except that the dissolved solution used in the production process of cyanate compound in Example 22 was replaced with a solution obtained by dissolving 74.9 g (hydroxyl group 0.096 mol) of the above oligomer compound and 14.6 g (0.144 mol) of triethylamine in 250 g of methyl ethyl ketone. According to the IR analysis of the obtained cyanate compound, the absorption peak (3,600 cm−1) of a phenolic hydroxyl group disappeared and the absorption peak (2,250 cm−1) derived from a cyanate group appeared so that it was confirmed that all functional groups were changed.

0.1 part of tin octylate was added to 100 parts of the thus-obtained cyanate compound. The mixture was molten, degassed and molded at 160° C. and then cured at 230° C. for 3 hours, to obtain a cured product. The cured product had a glass transition temperature of 234° C. according to the measurement of dynamic viscoelasticity (DMA). Further, its dielectric constant at 1 GHz was 2.74 and its dielectric loss tangent was 0.0055.

Comparative Example 15

(Production Process of Bifunctional PPE Oligomer Compound)

113.1 g of an oligomer compound was obtained in the same manner as in Example 22, except that the mixed solution used in the synthesis of bifunctional PPE oligomer compound in Example 22 was replaced with a mixed solution (bivalent phenol of the formula (7):monovalent phenol of the formula (8) in a molar ratio=1:4) obtained by dissolving 42.6 g (0.15 mol) of a bivalent phenol 4,4'-(1-methylethylidene)bis(2,6-dimehtylphenol) and 73.3 g (0.60 mol) of 2,6-dimethylphenol in 400 g of methyl ethyl ketone. The oligomer compound had a number average molecular weight of 1,030, a weight average molecular weight of 1,460 and a hydroxyl group equivalent of 540.

(Production Process of Cyanate Compound)

53.2 g of a cyanate compound was obtained in the same manner as in Example 22, except that the dissolved solution used in the production process of cyanate compound in Example 22 was replaced with a solution obtained by dissolving 51.8 g (hydroxyl group 0.096 mol) of the above oligomer compound and 14.6 g (0.144 mol) of triethylamine in 250 g of methyl ethyl ketone. According to the IR analysis of the obtained cyanate compound, the absorption peak (3,600 cm−1) of a phenolic hydroxyl group disappeared and the absorption peak (2,250 cm−1) derived from a cyanate group appeared so that it was confirmed that all functional groups were changed.

0.1 part of tin octylate was added to 100 parts of the thus-obtained cyanate compound. The mixture was molten, degassed and molded at 160° C. and then cured at 230° C. for 3 hours, to obtain a cured product. The cured product had a glass transition temperature of 228° C. according to the measurement of dynamic viscoelasticity (DMA). Further, its dielectric constant at 1 GHz was 2.83 and its dielectric loss tangent was 0.0079.

Table 9 shows the above results.

TABLE 9

| | Ex. 26 | Ex. 27 | Ex. 28 | Ex. 29 | CEx. 15 |
|---|---|---|---|---|---|
| dielectric constant (1 GHz) | 2.72 | 2.7 | 2.72 | 2.74 | 2.83 |
| dielectric loss tangent (1 GHz) | 0.0063 | 0.0055 | 0.0065 | 0.0055 | 0.0079 |
| Tg (DMA)/ (° C.) | 235 | 245 | 241 | 234 | 228 |

Ex. = Example,
CEX = Comparative Example

Example 30

Production Process of Cyanate Compound (Production Process of Bifunctional PPE Oligomer Compound)

113.2 g of an oligomer compound was obtained in the same manner as in Example 22, except that the mixed solution used in the synthesis of bifunctional PPE oligomer compound in Example 22 was replaced with a mixed solution (bivalent phenol of the formula (7):monovalent phenol of the formula (8) in a molar ratio=1:4) obtained by dissolving 42.6 g (0.15 mol) of a bivalent phenol 4,4'- methylenebis[2,3,6-trimehtylphenol] and 73.3 g (0.60 mol) of 2,6-dimehtylphenol in 400 g of methyl ethyl ketone and 400 g of tetrahydrofuran. The oligomer compound had a number average molecular weight of 1,050, a weight average molecular weight of 1,490 and a hydroxyl group equivalent of 550.

(Production Process of Cyanate Compound)

53.0 g of a cyanate compound was obtained in the same manner as in Example 22, except that the dissolved solution used in the production process of cyanate compound in Example 22 was replaced with a solution of 52.8 g (hydroxyl group 0.096 mol) of the above oligomer compound in 250 g of methyl ethyl ketone. According to the IR analysis of the obtained cyanate compound, the absorption peak (3,600 cm−1) of a phenolic hydroxyl group disappeared and the absorption peak (2,250 cm−1) derived from a cyanate group appeared so that it was confirmed that all functional groups were changed.

30 parts of the above bifunctional cyanate compound, 30 parts of bisphenol A type cyanate prepolymer, 20 parts of tetrabromobisphenol A epoxy (supplied by Dainippon Ink And Chemicals, Incorporated, trade name: EPICLON-153), 20 parts of bisphenol A epoxy (supplied by Dow Chemical Japan Ltd. Trade name: DER-331L) and 0.04 part of iron acetylacetonate were dissolved in methyl ethyl ketone, to prepare a varnish having a resin content of 60%. A glass cloth (NE glass product: trade name WEX983, supplied by Nitto Boseki Co., Ltd.) was impregnated with the above varnish, and then it was treated with a hot-air dryer, to obtain B-stage prepreg. Eight sheets of the prepreg and a copper foil (thickness: 18 μm, supplied by Mitsui Mining & smelting Co., Ltd., trade name: 3EC-3) were laminated and these materials were hot-pressed at 200° C. in vacuum for 2 hours to obtain a 0.8 mm-thick copper-clad laminate. Table 11 shows the physical properties of the copper-clad laminate.

Comparative Example 16, 17

Copper-clad laminates were obtained in the same manner as in Example 30 except that thermosetting resins were mixed in amount ratios shown in Table 10. In Comparative Example 16, toluene was used as a solvent, since an ingredient was insoluble in methyl ethyl ketone.

TABLE 10

|  | Ex. 30 | CEx. 16 | CEx. 17 |
|---|---|---|---|
| Bifunctional OPE-2CN | 30 | — | — |
| General-purpose PPE polymer | — | 30 | — |
| Bisphenol A type cyanate prepolymer | 30 | 30 | 30 |
| 4,4'dimethyl diphenylmethane | — | — | — |
| Tetrabromobisphenol A epoxy | 20 | 20 | 20 |
| Bisphenol A epoxy | 20 | 20 | 10 |
| Phenol novolak type epoxy | — | — | 40 |
| iron acetylacetonate | 0.04 | 0.04 | 0.04 |

Ex. = Example,
CEx. = Comparative Example

General-purpose PPE polymer: supplied by Mitsubishi Gas Chemical Co., Inc., number average molecular weight: 24,000.

Bisphenol A type cyanate prepolymer: prepolymer of 2,2-bis(4-cyanatophenyl)propane.

Tetrabromobisphenol A epoxy: EPICLON-153, supplied by Dainippon Ink And Chemicals, Incorporated.

Bisphenol A epoxy: DER-331L, supplied by Dow Chemical Japan Ltd.

Phenol novolak type epoxy: EPPN-201, supplied by Nippon Kayaku Co., Ltd.

TABLE 11

|  | Ex. 30 | CEx. 16 | CEx. 17 |
|---|---|---|---|
| Grass transition temperature (DMA method) | 206° C. | 202° C. | 190° C. |
| Dielectric constant (1 GHz) | 3.5 | 3.5 | 4.0 |
| Dielectric loss tangent (1 GHz) | 0.0049 | 0.0046 | 0.014 |
| Copper-foil peeling strength (kN/m) | 1.2 | 1.2 | 0.9 |
| Moldability | ○ | X | ○ |
| Heat resistance against soldering after moisture absorption (number of swelling/number of tested specimens) | | | |
| 1 hour treatment | 0/3 | 2/3 | 0/3 |
| 2 hours treatment | 0/3 | 3/3 | 0/3 |
| 3 hours treatment | 0/3 | 3/3 | 1/3 |
| Bending strength (MPa) | 479 | 368 | 498 |
| Bending modulus (MPa) | 17,600 | 17,200 | 19,200 |
| Deflection in bending (%) | 2.9 | 2.4 | 2.8 |

Ex. = Example,
CEx. = Comparative Example

In Examples and Comparative Examples, measurements were carried out by the following devices and methods.

Grass transition temperature (Tg): Obtained by a loss tangent (tan δ) peak of a dynamic viscoelasticity measurement.

Dielectric constant and dielectric loss tangent: Measured according to a cavity resonant oscillation method.

Copper foil peeling strength: Peeling strength of a copper foil having a width of 10 mm in a 90-degree direction was measured according to JIS C6481.

Moldability: Determined depending upon whether or not an internal layer pattern of a 70 μm-thick copper foil could be embedded without voids.

Heat resistance against soldering after moisture absorption: A sample was prepared by removing the entire copper foil, the sample was treated for absorption under PCT conditions at 121° C. at 0.2 MPa for 1 to 3 hours and then the sample was immersed in a solder bath at 260° C. for 30 seconds. The sample was visually observed for the occurrence of a delamination (swelling).

Mechanical properties: Head speed: 1.0 mm/min, distance between supports: 20 mm, measured at room temperature.

What is claimed is:

1. A sealing epoxy resin composition containing as ingredients an epoxy resin, a curing agent, an inorganic filler and a polyphenylene ether oligomer compound having a number average molecular weight of 700 to 3,000 and having an epoxy group at each terminal, represented by the formula (9),

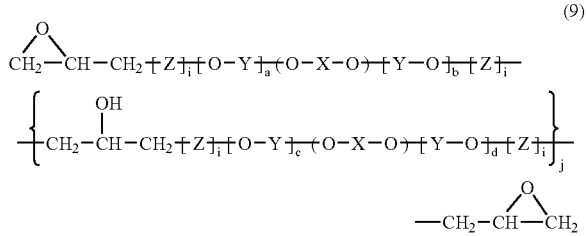

wherein —(O—X—O)— is represented by the formula (2):

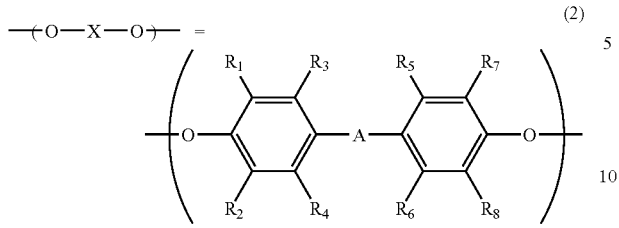

in which $R_1$, $R_2$, $R_7$ and $R_8$ are the same or different and are a halogen atom, an alkyl group having 6 or less carbon atoms or a phenyl group, $R_3$, $R_4$, $R_5$ and $R_6$ are the same or different and are a hydrogen atom, a halogen atom, an alkyl group having 6 or less carbon atoms or a phenyl group and A is a linear, branched or cyclic hydrocarbon having 20 or less carbon atoms or an aromatic group, —(Y—O)— is represented by the formula (3):

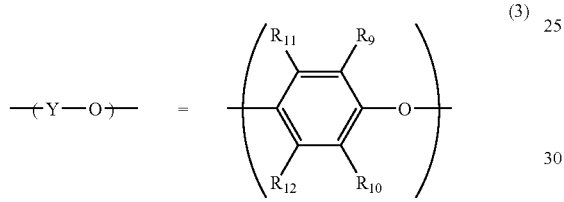

in which $R_9$ and $R_{10}$ are the same or different and are a halogen atom, an alkyl group having 6 or less carbon atoms or a phenyl group and $R_{11}$ and $R_{12}$ are the same or different and are a hydrogen atom, a halogen atom, an alkyl group having 6 or less carbon atoms or a phenyl group, —(Y—O)— is an arrangement of one kind of structure defined by the formula (3) or a random arrangement of two or more kinds of structures defined by the formula (3), Z is an organic group which has one or more carbon atoms and optionally contains an oxygen atom, each of a and b is 0 or an integer of 1 to 20, provided that at least either a or b is not 0, each of c and d is 0 or an integer of 1 to 20, provided that at least either c or d is not 0, and j is 0 or an integer of 1 to 5 and each of i is independently 0 or an integer of 1.

2. A sealing epoxy resin composition according to claim 1, wherein, in the polyphenylene ether oligomer compound having an epoxy group at each terminal, at least $R_1$, $R_2$, $R_7$ and $R_8$ in the formula (2) representing —(O—X—O)— are a methyl group, and —(Y—O)— has an arrangement structure of the formula (4) or the formula (5) or a random arrangement structure of the formula (4) and the formula (5):

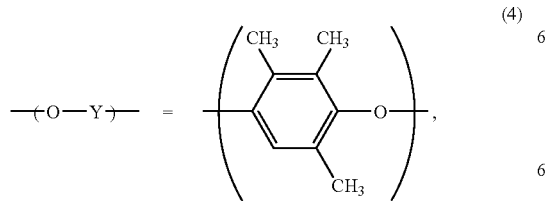

-continued

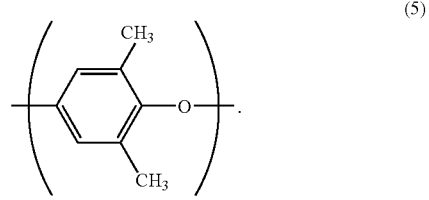

3. A sealing epoxy resin composition according to claim 1, wherein the content of the polyphenylene ether oligomer compound having an epoxy group at each terminal is 1 to 60% by weight based on the total amount of the epoxy resin, the curing agent and the polyphenylene ether oligomer compound having an epoxy group at each terminal.

4. A sealing epoxy resin composition according to claim 1, wherein the content of the inorganic filler is 15 to 95% by weight based on the total amount of the epoxy resin, the curing agent, the inorganic filler and the polyphenylene ether oligomer compound having an epoxy group at each terminal.

5. An epoxy resin composition for laminates, containing a polyphenylene ether oligomer epoxy compound having a number average molecular weight of 700 to 3,000 and having an epoxy group at each terminal, represented by the formula (9):

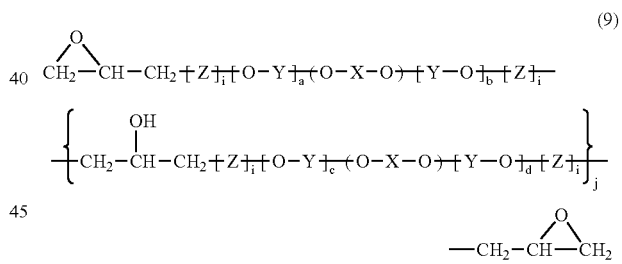

wherein —(O—X—O)— is represented by the formula (2):

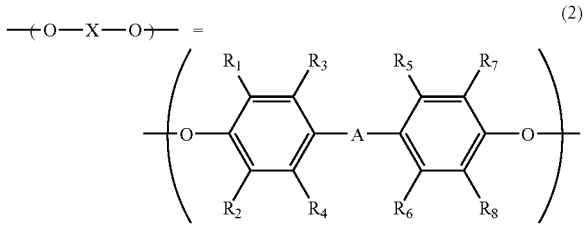

in which $R_1$, $R_2$, $R_7$ and $R_8$ are the same or different and are a halogen atom, an alkyl group having 6 or less carbon atoms or a phenyl group, $R_3$, R, $R_5$ and $R_6$ are the same or different and are a hydrogen atom, a halogen atom, an alkyl group having 6 or less carbon atoms or a phenyl group and A is a linear, branched or cyclic hydrocarbon having 20 or less carbon atoms or an aromatic group, —(Y—O)— is represented by the formula (3):

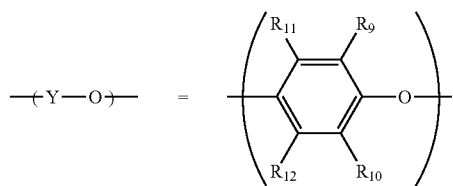

and a curing agent as ingredients.

6. An epoxy resin composition for laminates according to claim 5, which further contains a cyanate ester resin.

7. An epoxy resin composition for laminates according to claim 5,
wherein in the polyphenylene ether oligomer epoxy compound having an epoxy group at each terminal represented by the formula (9), at least $R_1$, $R_2$, $R_7$ and $R_8$ in the formula (2) representing —(O—X—O)— are a methyl group and —(Y—O)— has an arrangement structure of the formula (4) or the formula (5) or a random arrangement structure of the formula (4) and the formula (5):

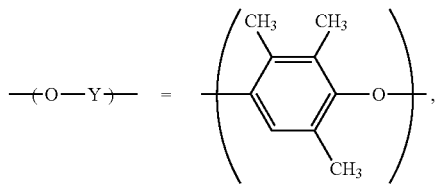

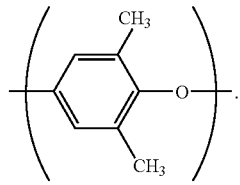

8. Prepreg obtained from the epoxy resin composition recited in claim 5.

9. A laminate obtained from the epoxy resin composition recited in claim 5.

10. A printed wiring board obtained from the epoxy resin composition recited in claim 5.

* * * * *

UNITED STATES PATENT AND TRADEMARK OFFICE
Certificate

Patent No. 7,276,563 B2                                                                             Patented: October 2, 2007

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Kenji Ishii, Tokyo (JP); Yasumasa Norisue, Tokyo (JP); Kiyonari Hiramatsu, Tokyo (JP); Makoto Miyamoto, Tokyo (JP); and Katsutoshi Yamazaki, Tokyo (JP).

Signed and Sealed this Seventeenth day of August 2010.

*JAMES J. SEIDLECK*
*Supervisory Patent Examiner*
*Art Unit 1796*
*Technology Center 1700*